United States Patent
Aihara et al.

(10) Patent No.: US 8,659,004 B2
(45) Date of Patent: Feb. 25, 2014

(54) LIGHT EMITTING DIODE, LIGHT EMITTING DIODE LAMP, AND ILLUMINATING APPARATUS

(75) Inventors: Noriyuki Aihara, Chichibu (JP); Noriyoshi Seo, Hiki-gun (JP); Noritaka Muraki, Chichibu (JP); Ryouichi Takeuchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/496,083

(22) PCT Filed: Sep. 15, 2010

(86) PCT No.: PCT/JP2010/065924
§ 371 (c)(1),
(2), (4) Date: Mar. 14, 2012

(87) PCT Pub. No.: WO2011/034080
PCT Pub. Date: Mar. 24, 2011

(65) Prior Publication Data
US 2012/0168717 A1    Jul. 5, 2012

(30) Foreign Application Priority Data

Sep. 15, 2009  (JP) ................ 2009-213226
Jan. 28, 2010  (JP) ................ 2010-016877
Jan. 28, 2010  (JP) ................ 2010-016878
Aug. 10, 2010  (JP) ................ 2010-179472
Aug. 10, 2010  (JP) ................ 2010-179473
Aug. 10, 2010  (JP) ................ 2010-179474

(51) Int. Cl.
*H01L 31/00* (2006.01)

(52) U.S. Cl.
USPC ............ 257/13; 257/14; 257/15; 257/97; 257/E33.014; 372/45.01

(58) Field of Classification Search
None
See application file for complete search history.

(56) References Cited

U.S. PATENT DOCUMENTS

2001/0028061 A1* 10/2001 Hosoba et al. ............ 257/76
2004/0104395 A1*  6/2004 Hagimoto et al. ......... 257/79

(Continued)

FOREIGN PATENT DOCUMENTS

| JP | 6-13650 A | 1/1994 |
| JP | 6-268115 A | 9/1994 |

(Continued)

OTHER PUBLICATIONS

JP2006287120_Translation.*

(Continued)

*Primary Examiner* — Julio J Maldonado
*Assistant Examiner* — Molly Reida
(74) *Attorney, Agent, or Firm* — Sughrue Mion, PLLC

(57) ABSTRACT

Disclosed is a light-emitting diode, which has a red and infrared emitting wavelength, excellent monochromatism characteristics, and high output and high efficiency and excellent humidity resistance. The light-emitting diode is provided with: a light-emitting section, which includes an active layer having a quantum well structure and formed by laminating alternately a well layer which comprises a composition expressed by the composition formula of $(Al_{X1} Ga_{1-X1})$ As $(0 \leq X1 \leq 1)$ and a barrier layer which comprises a composition expressed by the composition formula of $(Al_{X2} Ga_{1-X2})$ As $(0 < 2 \leq 1)$, and a first clad layer and a second clad layer, between both of which the active layer is sandwiched, wherein the first clad layer and the second clad layer comprise a composition expressed by the composition formula of $(Al_{X3}Ga_{1-X})_{Y1} In_{1-Y1} P$ $(0 \leq X3 \leq 1, 0 < Y1 \leq 1)$; a current diffusion layer formed on the light-emitting section; and a functional substrate bonded to the current diffusion layer.

21 Claims, 7 Drawing Sheets

(56) References Cited

U.S. PATENT DOCUMENTS

| | | |
|---|---|---|
| 2006/0043392 A1 | 3/2006 | Kurahashi et al. |
| 2009/0206359 A1* | 8/2009 | Nabekura ..................... 257/103 |

FOREIGN PATENT DOCUMENTS

| | | |
|---|---|---|
| JP | 6-268250 A | 9/1994 |
| JP | 07-022713 A | 1/1995 |
| JP | 8-293622 A | 11/1996 |
| JP | 11-284111 A | 10/1999 |
| JP | 2001-274454 A | 10/2001 |
| JP | 2001-339100 A | 12/2001 |
| JP | 2004-207508 A | 7/2004 |
| JP | 2004-249589 A | 9/2004 |
| JP | 2005-101610 A | 4/2005 |
| JP | 2006-66518 A | 3/2006 |
| JP | 2006-287120 A | 10/2006 |
| JP | 2006287120 A * | 10/2006 |
| JP | 2007-019057 A | 1/2007 |
| JP | 2007-081010 A | 3/2007 |
| JP | 2007-173551 A | 7/2007 |
| JP | 2007-194536 A | 8/2007 |
| JP | 2008-004587 A | 1/2008 |
| WO | 7-30150 A | 1/1995 |
| WO | WO 2009/017155 A1 | 2/2009 |

OTHER PUBLICATIONS

Office Action ("Notice of Preliminary Rejection") with a mailing date of Feb. 25, 2013 for corresponding Korean Patent Application No. 10-2012-7008800.

International Search Report for PCT/JP2010/065924 dated Jan. 11, 2011.

Office Action ("Notice of Reasons for Rejection") with a mailing date of Sep. 17, 2013 for corresponding Japanese Application No. 2010-179472.

Office Action ("Notice of Reasons for Rejection") with a mailing date of Sep. 17, 2013 for corresponding Japanese Application No. 2010-179473.

Office Action ("Notice of Reasons for Rejection") with a mailing date of Sep. 17, 2013 for corresponding Japanese Application No. 2010-179474.

Office Action ("Notice of Preliminary Rejection") with a mailing date of Nov. 27, 2013 issued in corresponding Korean Patent Application No. 10-2012-7008800.

* cited by examiner

LIGHT EMITTING DIODE, LIGHT EMITTING DIODE LAMP, AND ILLUMINATING APPARATUS

TECHNICAL FIELD

The present invention relates to a light-emitting diode and a light-emitting diode lamp and in particular, to red and infrared light emitting diode of high output and light-emitting diode lamp therewith and an illuminating apparatus.

Priority is claimed on

Japanese Patent Application No. 2009-213226 filed on Sep. 15, 2009,

Japanese Patent Application No. 2010-16877 filed on Jan. 28, 2010,

Japanese Patent Application No. 2010-16878 filed on Jan. 28, 2010,

Japanese Patent Application No. 2010-179472 filed on Aug. 10, 2010

Japanese Patent Application No. 2010-179473 filed on Aug. 10, 2010 and

Japanese Patent Application No. 2010-179474 filed on Aug. 10, 2010, the contents of all of which are incorporated herein by reference.

BACKGROUND ART

Red and infrared light-emitting diodes (LEDs) are utilized widely, such as in communication, a light source for various sensors, nightlights etc.

For example, since light having a peak wavelength of 660-720 nm is a red light source that a person can recognize, it is widely used as a light source of an outdoor display; a safely-affiliated sensor which uses light at a wavelength range having a high output and therefore it is desirable that the light can be recognized by visual inspection; or a bar code reader and a light source of a medical application such as an oxymeter. In addition, since light having a peak wavelength of 760-850 nm is in the wavelength range that output is high, it is the most suitable wavelength range for a light source of various sensors or a surveillance camera, or infrared lighting for a video camera. Particularly, since the AlGaAs active layer in the wavelength range has a high-speed response, it is suitable to be used in optical communication or a high-performance photo coupler. On the other hand, it begins to be utilized as light sources in medical fields such as in a venous authentication system because of the characteristic of the wavelength.

In addition, plant growth using an artificial light source has been studied. In particular, attention is being paid to a cultivation method illuminating by a light-emitting diode which has excellent monochromaticity and in which energy saving, long lifetime, and a reduction in size are possible. With respect to photosynthesis, light having a wavelength of around 660 nm to 670 nm is the most preferable light source having high reaction efficiency. Moreover, the conventional studies have confirmed that the infrared light having a peak wavelength of 730 nm, as one of the wavelengths which are preferable for shape control of plant upbringing, is effective.

It is preferable that LEDs have a high output in order to improve performance of each equipment for the above uses.

For example, as a conventional infrared light-emitting diode, the light-emitting layer including AlGaAs obtained by using a liquid phase epitaxial growth method is put to practical use, and various investigations for realizing high output have been done. For example, an infrared light-emitting diode was produced by growing an epitaxial AlGaAs layer thickly on a GaAs substrate by using a liquid phase epitaxial growth method, wherein the layer is transparent at the emitting wavelength, and removing the GaAs substrate to use the AlGaAs layer as a substrate. Recently, the structure of the infrared light-emitting diode (a so-called transparent-substrate type) shows the highest output (For example, Patent Documents 1-5).

Patent Document 1: Japanese Unexamined Patent Application Publication No. 7-30150

Patent Document 2: Japanese Unexamined Patent Application Publication No. 2001-274454

Patent Document 3: Japanese Unexamined Patent Application Publication No. 6-268250

Patent Document 4: Japanese Unexamined Patent Application Publication No. 6-13650

Patent Document 5: Japanese Unexamined Patent Application Publication No. 8-293622

SUMMARY OF THE INVENTION

Development of an LED having further high light-emitting efficiency, as a light source of infrared illumination, is expected in view of a performance enhancement, energy saving, and cost. Moreover, since an operating environment is not only indoors but also outdoors or half outdoors, humidity resistance is one of the important reliability items. Recently, in order to realize practical use of LED illumination for plant upbringing, which is attracting attention, it is strongly expected that saving electric power, improving humidity resistance, and realizing high output. In the case of plant upbringing, humidity resistance is one of the important characteristics because that it is used under high humidity condition such as spraying or hydroponics.

In view of the circumstances, the object of the present invention is to provide the red and infrared light-emitting diode which has high efficiency and high output, and is superior to humidity resistance.

As a result of the inventor's repeated investigations to solve the problem, the inventor found that among conventional infrared light-emitting diodes which used an active layer of AlGaAs type, there was no type of compound semiconductor layer including an active layer that could be adhered (bonded) on a transparent substrate; however, when a multiplexing quantum well structure of AlGaAs type was adhered (bonded) on a transparent substrate, higher output than that of the conventional infrared light-emitting diode was obtained. Moreover, in red and infrared light-emitting diodes using a multiplexing quantum well structure of AlGaAs type, the inventor used a four-elements-system of AlGaInP, which has a large band gap and good crystallinity, as clad layers to sandwich the multiplexing quantum well structure. As a result, the light-emitting diode using AlGaInP shows higher output than that using AlGaAs. Further more, since it is possible to decrease the concentration of Al, corrosion is hard to occur, and thus humidity resistance is improved.

The inventor made further investigations based on this knowledge, and as a result, the present invention as shown in the following was accomplished.

The present invention provides the following embodiments.

(1) A light-emitting diode comprising: a light-emitting section, which comprises an active layer, having a quantum well structure and formed by laminating alternately a well layer which comprises a composition expressed by the composition formula of $(Al_{X1} Ga_{1-X1})As$ ($0 \leq X1 \leq 1$) and a barrier layer which comprises a composition expressed by the composition formula of $(Al_{X2} Ga_{1-X2})As$ ($0 < X2 \leq 1$), and a first clad layer and a second clad layer, between both of which the active layer is sandwiched, wherein the first clad layer and the second clad layer comprise a composition expressed by the composition formula of $(Al_{X3}\ Ga_{1-X3})_Y\ In_{1-Y1}\ P$ ($0 \le X3 \le 1$, $0 < Y1 \le 1$); a current diffusion layer formed on the light-emitting section; and a functional substrate bonded to the current diffusion layer.

(2) A light-emitting diode comprising: a light-emitting section, which comprises an active layer, having a quantum well structure and formed by laminating alternately a well layer which comprises a composition expressed by the composition formula of $(Al_{X1}\ Ga_{1-X1})As$ ($0 \le X1 \le 1$) and a barrier layer which comprises a composition expressed by the composition formula of $(Al_{X4}\ Ga_{1-X4})_{Y2}\ In_{1-Y2}\ P$ ($0 \le X4 \le 1$, $0 < Y2 \le 1$), and a first clad layer and a second clad layer, between both of which the active layer is sandwiched, wherein the first clad layer and the second clad layer comprise a composition expressed by the composition formula of $(Al_{X3}\ Ga_{1-X3})_{Y1}\ In_{1-Y1}$ ($0 \le X3 \le 1$, $0 < Y1 \le 1$); a current diffusion layer formed on the light-emitting section; and a functional substrate bonded to the current diffusion layer.

(3) The light-emitting diode according to (1) or (2), wherein the functional substrate is transparent at emitting wavelength.

(4) The light-emitting diode according to any one of (1) to (3), wherein the functional substrate comprises GaP, sapphire or SiC.

(5) A light-emitting diode comprising: a light-emitting section, which comprises an active layer, having a quantum well structure and formed by laminating alternately a well layer which comprises a composition expressed by the composition formula of $(Al_{X1}\ Ga_{1-X1})As$ ($0 \le X1 \le 1$) and a barrier layer which comprises a composition expressed by the composition formula of $(Al_{X2}\ Ga_{1-X2})As$ ($0 < X2 \le 1$), and a first clad layer and a second clad layer, between both of which the active layer is sandwiched, wherein the first clad layer and the second clad layer comprise a composition expressed by the composition formula of $(Al_{X3}\ Ga_{1-X3})_{Y1}\ In_{1-Y1}\ P$ ($0 \le X3 \le 1$, $0 < Y1 \le 1$); a current diffusion layer formed on the light-emitting section; and a functional substrate which comprises a reflection layer having a reflection index of 90% or more at the emitting wavelength, wherein the reflection layer is formed to face the light-emitting section and the functional substrate is bonded to the current diffusion layer.

(6) A light-emitting diode comprising: a light-emitting section, which comprises an active layer, having a quantum well structure and formed by laminating alternately a well layer which comprises a composition expressed by the composition formula of $(Al_{X1}\ Ga_{1-X1})As$ ($0 \le X1 \le 1$) and a barrier layer which comprises a composition expressed by the composition formula of $(Al_{X4}\ Ga_{1-X4})_{Y2}\ In_{1-Y2}\ P$ ($0 \le X4 \le 1$, $0 < Y2 \le 1$), and a first clad layer and a second clad layer, between both of which the active layer is sandwiched, wherein the first clad layer and the second clad layer comprise a composition expressed by the composition formula of $(Al_{X3}\ Ga_{1-X3})_{Y1}\ In_{1-Y1}$ ($0 \le X3 \le 1$, $0 < Y1 \le 1$); a current diffusion layer formed on the light-emitting section; and a functional substrate which comprises a reflection layer having a reflection index of 90% at the emitting wavelength, wherein the reflection layer is formed to face the light-emitting section and the functional substrate is bonded to the current diffusion layer.

(7) The light-emitting diode according to (5) or (6), wherein the functional substrate comprises a silicon or germanium layer.

(8) The light-emitting diode according to (5) or (6), wherein the functional substrate comprises a metal substrate.

(9) The light-emitting diode according to (8) wherein the metal substrate comprises plural metal layers.

(10) The light-emitting diode according to any one of (1) to (9), wherein the current diffusion layer comprises GaP.

(11) The light-emitting diode according to any one of (1) to (10), wherein a thickness of the current diffusion layer is in the range of 0.5 to 20 μm.

(12) The light-emitting diode according to any one of (1) to (11), wherein the side face of the functional substrate comprises a perpendicular plane which is close to the light-emitting section, the perpendicular plane is perpendicular to the main light-extraction surface, and an inclined plane which is far to the light-emitting section, the inclined plane is inclined inside to the main light-extraction surface.

(13) The light-emitting diode according to any one of (1) to (12), wherein the inclined plane comprises a rough surface.

(14) The light-emitting diode according to any one of (1) to (13), wherein a first electrode and a second electrode are installed in the side of the main light extraction surface of the light-emitting diode.

(15) The light-emitting diode according to (14), wherein the first electrode and the second electrode are ohmic electrodes.

(16) The light-emitting diode according to (14) or (15), wherein a third electrode is further installed in the back side of the main light extraction surface of the light-emitting diode.

(17) A light-emitting diode lamp comprising the light-emitting diode according to any one of (1) to (16).

(18) A light-emitting diode lamp comprising the light-emitting diode according to (16), wherein the first electrode or the second electrode is connected to the third electrode at an approximate electric potential.

(19) A illuminating apparatus comprising plural light-emitting diodes according to any one of (1) to (16).

In the present invention, the "functional substrate" is a substrate which is bonded to a compound semiconductor layer through the current diffusion layer and supports the compound semiconductor layer, wherein the compound semiconductor layer is obtained by forming the compound semiconductor layer on a growth substrate and then removing the growth substrate. When a predetermined layer is formed on the current diffusion layer and a support substrate is bonded to the compound semiconductor layer on the predetermined layer, the "functional substrate" is a substrate including the predetermined layer and the support substrate.

Since the light-emitting diode of the invention includes: a light-emitting section, which comprises an active layer, having a quantum well structure and formed by laminating alternately a well layer which comprises a composition expressed by the composition formula of $(Al_{X1}\ Ga_{1-X1})As$ ($0 \le X1 \le 1$) and a barrier layer which comprises a composition expressed by the composition formula of $(Al_{X2}\ Ga_{1-X2})As$ ($0 < X2 \le 1$), and a first clad layer and a second clad layer, between both of which the active layer is sandwiched, wherein the first clad layer and the second clad layer comprise a composition expressed by the composition formula of $(Al_{X3}\ Ga_{1-X3})_{Y1}\ In_{1-Y1}\ P$ ($0 \le X3 \le 1$, $0 < Y1 \le 1$); a current diffusion layer formed on the light-emitting section; and a functional substrate bonded to the current diffusion layer, the invention shows a high output in comparison with a conventional infrared light-emitting diode. Particularly, since the functional substrate is transparent at the emitting wavelength, high output and high efficiency are observed without absorbing the emitting light by the light-emitting section. In addition, since the active layer includes a multiplexing well structure formed by laminating alternately well layers including a composition expressed by formula $(Al_X Ga_{1-X})As$ ($0 \le X \le 1$) and barrier layers including a composition expressed by the composition formula of $(Al_{X2}\ Ga_{1-X2})As$ ($0 < X2 \le 1$), the diode has a superior monochromatism. In addition, since clad layers include the composition expressed by the composition formula of $(Al_{X3} Ga_{1-X3})_{Y1}In1_{-Y}1$ ($0 \leq X3 \leq 1$, $0 < Y1 \leq 1$), in which As, which is easy to make a defect, was not contained, high crystallinity and high output can be obtained. In addition, since clad layers include the composition expressed by the composition formula of $(Al_{X3} Ga_{1-X}3)_{Y1} In1_{-Y}1 (0 \leq X3 \leq 1, 0 < Y1 \leq 1)$, the concentration of Al was lower than the conventional three-element infrared light-emitting diode, and as a result, humidity resistant is improved. In addition, since the active layer includes the multilayer having the well layer including a composition formula $(Al_XGa_{1-X}) (0 \leq X \leq 1)$ and the barrier layer, it is preferable to be mass-produced by using a MOCVD method.

Since the light-emitting diode of the invention includes: a light-emitting section, which comprises an active layer, having a quantum well structure and formed by laminating alternately a well layer which comprises a composition expressed by the composition formula of $(Al_{X1} Ga_{1-X1})As$ ($0 \leq X1 \leq 1$) and a barrier layer which comprises a composition expressed by the composition formula of $(Al_{X4} Ga_{1-X}4)_Y2In_{1-Y2}$ P ($0 \leq X4 \leq 1$, $0 < Y2 \leq 1$), and a first clad layer and a second clad layer, between both of which the active layer is sandwiched, wherein the first clad layer and the second clad layer comprise a composition expressed by the composition formula of $(Al_{X3} Ga_{1-X3})_{Y1} In_{1-Y1}$ P ($0 \leq X3 \leq 1$, $0 < Y1 \leq 1$); a current diffusion layer formed on the light-emitting section; and a functional substrate bonded to the current diffusion layer, the invention not only shows the above-mentioned effects, but also shows high crystallinity and high output because that As, which is easy to make a defect, is not contained, because that the barrier layer has the composition formula of $(Al_{X4} Ga_{1-X4})_Y 2In_{1-Y2}$ P ($0 \leq X4 \leq 1$, $0 < Y2 \leq 1$).

Since the functional substrate is made from GaP, sapphire, SiC, silicon or germanium, the material of the functional substrate is hard to be corroded. As a result, humidity resistance is improved.

In addition, when both the functional substrate and the current diffusion layer are made from GaP, bonding becomes easier and the bonding strength becomes stronger.

Since the light-emitting diode lamps of the present invention have emitting red and infrared light wavelengths, excellent monochromatism, high output and high efficiency, as well as excellent moisture-resistant, for example, when the wavelength of 730 nm is used, the light-emitting diode lamp is preferable to be used as an illumination source of plant upbringing.

DETAIL DESCRIPTION OF THE INVENTION

Figure 1:
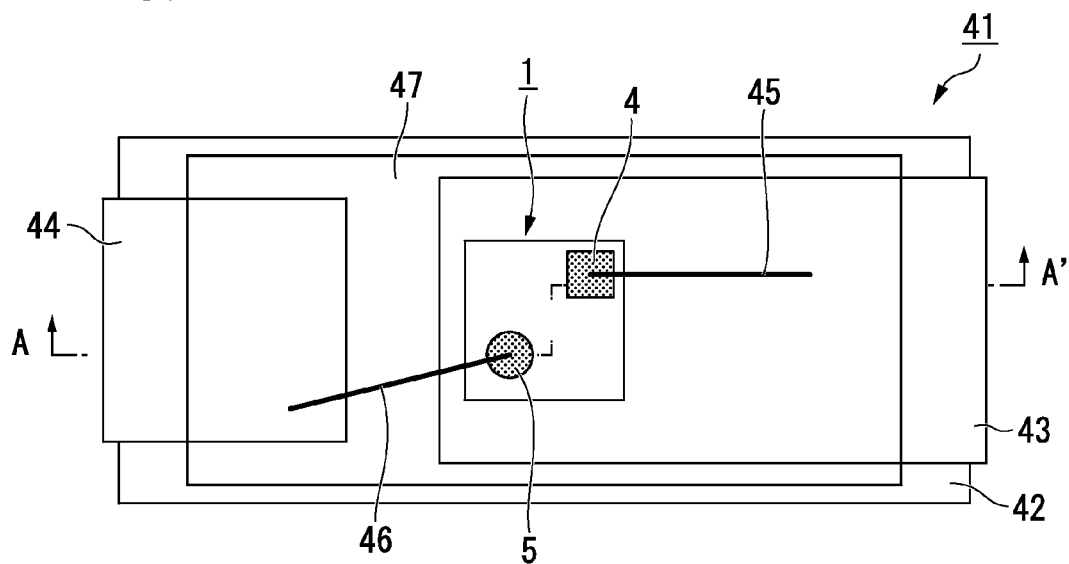
FIG. 1 is a plan view of a light-emitting diode lamp using a light-emitting diode related to an embodiment of the invention.

Hereinafter, a light-emitting diode related to an embodiment to which the invention is applied, as well as a light-emitting diode lamp using the light-emitting diode, will be described in detail by using the drawings. In addition, in the drawings used in the following description, there is a case where characteristic sections are enlarged and shown for convenience in order to facilitate the understanding of features, and the size ratio or the like of each constituent element is not necessarily the same as the actual condition.

Light-Emitting Diode Lamp

Figure 2:
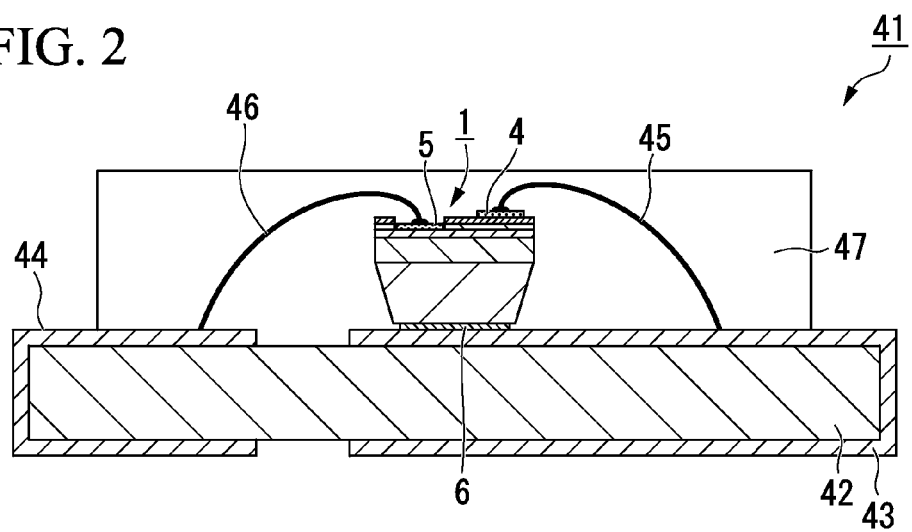
FIG. 2 is a cross-sectional schematic view taken along line A-A' in FIG. 1 of the light-emitting diode lamp using the light-emitting diode related to the embodiment of the invention.

FIGS. 1 and 2 are diagrams for describing a light-emitting diode lamp using a light-emitting diode related to an embodiment to which the invention is applied, wherein FIG. 1 is a plan view and FIG. 2 is a cross-sectional view along line A-A' shown in FIG. 1.

As shown in FIGS. 1 and 2, in a light-emitting diode lamp 41 using a light-emitting diode 1 of embodiments, one or more of the light-emitting diodes 1 are mounted on the surface of a mount substrate 42. More specifically, on the surface of the mount substrate 42, an n-electrode terminal 43 and a p-electrode terminal 44 are provided. Further, an n-type ohmic electrode 4 that is a first electrode of the light-emitting diode 1 and the n-electrode terminal 43 of the mount substrate 42 are connected to each other by using a gold wire 45 (wire bonding). On the other hand, a p-type ohmic electrode 5 that is a second electrode of the light-emitting diode 1 and the p-electrode terminal 44 of the mount substrate 42 are connected to each other by using a gold wire 46. Further, as shown in FIG. 2, on the surface on the opposite side to the surface on which the n-type and p-type ohmic electrodes 4 and 5 of the light-emitting diode 1 are provided, a third electrode 6 is provided, and the light-emitting diode 1 is connected onto the n-electrode terminal 43 by the third electrode 6, thereby being fixed to the mount substrate 42. Here, n type ohmic electrode 4 and the third electrode 6 are connected each other by n-electrode terminal 43 in the same electric potential or approximate electric potential. By using the third electrode, damage of the active layer can be prevent by introducing the current between the third electrode and p-electrode without excess current drifting in the active layer when excess reverse voltage is applied. Since a reflection structure is added between the third electrode and substrate interface side, high output is possible. In addition, a simple and easy assembly technique such as eutectic die bond is available to be used by adding eutectic metal or tin solder to the surface of the third electrode. The surface of the mount substrate 42, on which the light-emitting diode 1 is mounted, is sealed by a general sealing resin 47, such as silicon or epoxy resin.

Light-Emitting Diode (First Embodiment)

Figure 3:
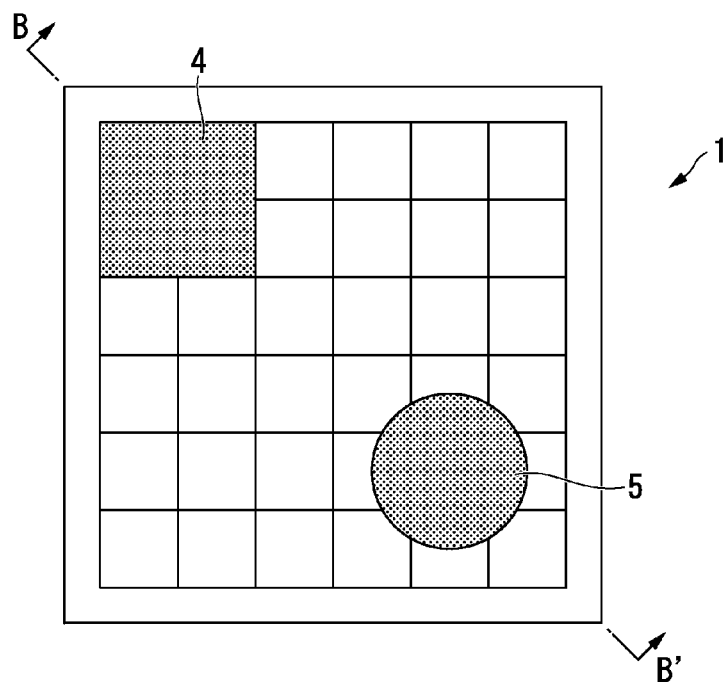
FIG. 3 is a plan view of the light-emitting diode related to the embodiment of the invention.
Figure 4:
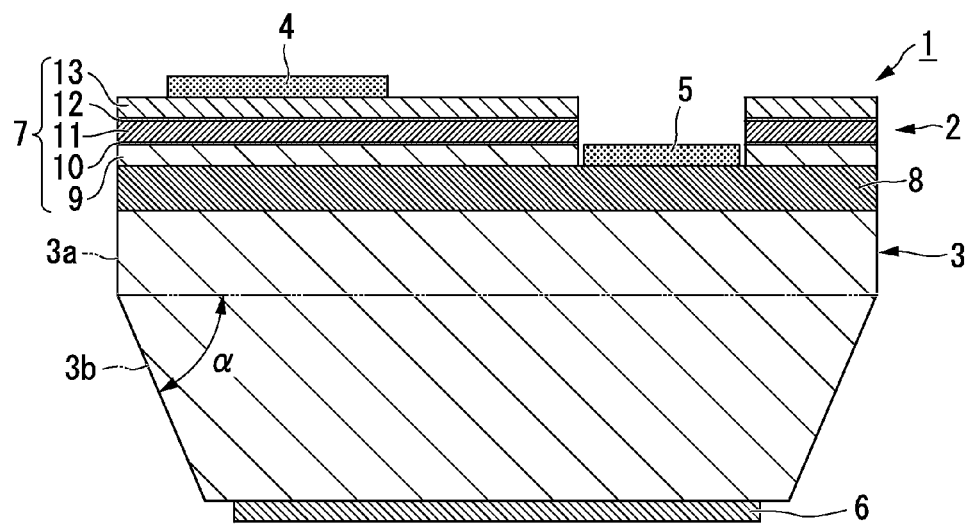
FIG. 4 is a cross-sectional schematic view taken along line B-B' in FIG. 3 of the light-emitting diode related to the embodiment of the invention.
Figure 5:
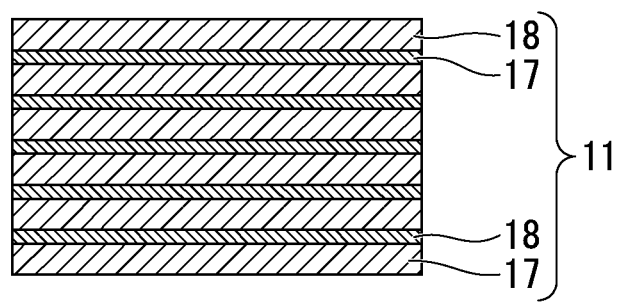
FIG. 5 is an enlarged cross-sectional view for describing the configuration of an electrode protection film of the light-emitting diode related to the embodiment of the invention.

FIGS. 3 and 4 are diagrams for describing the light-emitting diode related to the first embodiment to which the invention is applied, wherein FIG. 3 is a plan view and FIG. 4 is a cross-sectional view along line B-B' shown in FIG. 3. In addition, FIG. 5 is a cross-section of a multilayer.

The light-emitting diode of the first embodiment includes: a light-emitting section 7, which comprises an active layer 11, having a quantum well structure and formed by laminating alternately a well layer 17 which comprises a composition expressed by the composition formula of $(Al_{X1} Ga_{1-X1})As$ ($0 \leq X1 \leq 1$) and a barrier layer 18 which comprises a composition expressed by the composition formula of $(Al_{X2} Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section 7; and a functional substrate 3 bonded to the current diffusion layer 8.

The main light extraction surface in the present embodiment is the surface that is the opposite side of the bonding surface of the compound semiconductor layer with the functional substrate 3.

The compound semiconductor layer (also called an epitaxial growth layer) 2 has a structure in which a p, n-junction type light-emitting section 7, and a current diffusion layer 8 are sequentially stacked, as shown in FIG. 4. A known functional layer can be added to the structure of the compound semiconductor layer 2 on a timely basis. For example, it is possible to provide a known layer structure such as a contact layer for reducing contact resistance of the ohmic electrodes, a current diffusion layer to make general of light-emitting section scatter element driving current planarly, or a current blocking layer or current constriction layer for restricting an area through which an element driving current flows. In addition, it is preferable that the compound semiconductor layer 2 be a layer formed by epitaxial growth on a GaAs substrate.

The light-emitting section 7 has a configuration in which at least a p-type lower clad layer 9 (a first clad layer), lower guide layer 10, a light-emitting layer 11 (active layer), upper guide layer 12 and an n-type upper clad layer 13 (a second clad layer) are sequentially laminated on the current diffusion layer 8, as shown in FIG. 4. That is, in order to obtain high-intensity luminescence, it is preferable that the light-emitting section 7 be made to be a so-called double hetero (DH) structure which includes the lower clad layer 9, lower guide layer 10 and upper guide layer 12, and the upper clad layer 13 disposed to confront each other on the lower side and the upper side of the active layer 11 in order to "confine" a carrier leading to radiation recombination, and luminescence in the active layer 11.

It is preferable for the active layer 11 to include a well structure to control emitting light wavelength of the light-emitting diode (LED) as shown in FIG. 5. In other words, the active layer 11 includes a multi-layer structure (multilayer) having well layers 17 and barrier layers 18, and has barrier layers 18 at both ends of the multi-layer structure.

It is preferable that the layer thickness of the active layer 11 be in a range of 0.02 μm to 2 μm. Further, a conduction type of the active layer 11 is not particularly limited and any of an un-doped type, a p type, and an n type can be selected. In order to increase light-emitting efficiency, it is preferable to make the active layer 11 be the un-doped type having excellent crystallinity or have a carrier concentration of less than $3 \times 10^{17}$ cm$^{-3}$.

It is preferable for well layer 17 to have composition formula of $(Al_X Ga_{1-X})As$ ($0 \leq X \leq 0.36$). X1 can be adjusted to obtain the most preferable emitting light wavelength.

Table 1 shows correlation between Al composition X1 and emission peak wavelength, when the thickness of the well layer 17 is 17 nm. It is understood that emission peak wavelength becomes longer while Al composition X1 becomes lower. In addition, Al composition, corresponding to the peak wavelength which is not listed in Table 1, can be estimated

TABLE 1

| Peak Wavelength (nm) | Al composition (X) |
|---|---|
| 660 | 0.33 |
| 680 | 0.28 |
| 700 | 0.24 |
| 720 | 0.20 |
| 730 | 0.18 |
| 760 | 0.13 |
| 800 | 0.07 |
| 830 | 0.03 |
| 850 | 0.00 |

As the thickness of the well layer 17, a range of 3-30 nm is preferred. More preferably, it is in the range of 5-20 nm.

Table 2 shows a correlation between the thickness of the well layer 17 and emission peak wavelength of 720 nm-760 nm when Al composition of the well layer 17 X1=0.18. It is understood that emission peak wavelength becomes shorter while the well layer 17 becomes thinner because of quantum effect. When it is thick, emission peak wavelength is constant according to composition. In addition, the thickness of the layer corresponding to the emission peak wavelength, which is not listed in Table 2, can be estimated.

TABLE 2

| Peak Wavelength (nm) | Thickness (nm) |
|---|---|
| 720 | 8 |
| 725 | 10 |
| 730 | 17 |
| 750 | 22 |
| 755 | 25 |
| 760 | 30 |

For example, in order to obtain a predetermined emission peak wavelength in the range of 720 to 760 nm, according to the correlation of emission peak wavelength, and Al composition X1 and thickness of the well layer 17, Al composition X1 and thickness of the well layer 17 can be decided.

The barrier layer 18 has composition expressed by the composition formula of $(Al_{X2} Ga_{1-X2})As$ ($0 < X2 \leq 1$). Since it is preferable that barrier layer 18 has a composition having larger bang gap than that of the well layer 17, and from the viewpoint of crystallinity, it is preferable that Al concentration is low. Therefore, it is preferable that the range of X2 is 0.1-0.3. The most preferable composition X2 is decided by the composition of the well layer.

It is preferable for thickness of barrier layer 18 to be equal or thicker than thickness of the well layer 17. As a result, light-emitting efficiency of the well layer 17 can be improved.

In the multi-layer structure having well layers 17 and barrier layers 18, the pair number of alternately laminating a well layer 17 and barrier layer 18 is not limited particularly, but it is preferable to be 40 pairs or less and two pairs or more. In other words, it is preferable that the active layer 11 include 2-40 layers of the well layer 17. Since the active layer has a preferred light-emitting efficiency, it is preferable that there be 5 layers or more of the well layers 17. On the other hand, since carrier density in the well layer 17 and barrier layer 18 is low, when too many pairs are used, forward direction voltage ($V_F$) increases. Because of this, it is preferable to use 40 pairs or less and more preferable to use 20 pairs or less.

The lower guide layer 10 and the upper guide layer 12 are respectively provided on the lower surface and the upper surface of the light-emitting layer 11, as shown in FIG. 4. Specifically, the lower guide layer 10 is provided on the lower surface of the light-emitting layer 11 and the upper guide layer 12 is provided on the upper surface of the light-emitting layer 11.

Lower guide layer 10 and upper part guide layer 12 has composition expressed by the composition formula of $(Al_X Ga_{1-X})As$ ($0 \leq X \leq 1$). Since it is preferable that it has a composition having larger bang gap than that of barrier layer 18, it is preferable that Al concentration is low, the range of X is 0.2-0.4 preferably. From the viewpoint of crystallinity, the most preferable composition X is decided by the composition of the well layer.

Table 3 shows compositions X1 of barrier layer 18 and guide layer which have the most larger output at emission peak wavelength when the thickness of the well layer 17 is 17 nm. Since it is preferable that barrier layer and guide layer have a composition having larger bang gap than that of the well layer, and from the viewpoint of crystallinity, the most preferable composition is decided by the composition of the well layer.

TABLE 3

| Peak Wavelength (nm) | Well (X) | Barrier (X) | Guide (X) |
| --- | --- | --- | --- |
| 680 | 0.28 | 0.45 | 0.6 |
| 700 | 0.24 | 0.40 | 0.6 |
| 730 | 0.18 | 0.30 | 0.4 |
| 760 | 0.13 | 0.30 | 0.4 |
| 800 | 0.07 | 0.20 | 0.3 |
| 830 | 0.03 | 0.20 | 0.3 |
| 850 | 0.00 | 0.20 | 0.3 |

The lower guide layer 10 and upper guide layer 12 are installed to reduce transfer of defects between the lower clad layer 9 and light-emitting layer 11, and between the upper clad layer 13 and light-emitting layer 11, respectively. In other words, since V group constituent elements of the lower clad layer 9 and upper part clad layer 13 of the present invention are phosphor (P) whereas V group constituent elements of the lower guide layer 10, upper part guide layer 12 and light-emitting layer 11 are arsenic (As), it is easy to produce a defect in an interface surface. Transfer of a defect to the light-emitting layer 11 causes performance deterioration of the light-emitting diode. Therefore, the thickness of the lower guide layer 10 and layer of upper guide layer 12 is preferably 10 nm or more, and more preferably 20 nm-100 nm.

Conduction types of the lower guide layer 10 and upper part guide layer 12 are not limited particularly, and any one of undoped type, p type and n-type can be used. It is preferable to use the undoped type having excellent crystallinity or use a carrier density less than $3 \times 10^{17}$ cm$^{-3}$ to raise light-emitting efficiency.

The lower clad layer 9 and the upper clad layer 13 are respectively provided on the lower surface of the low guide 10 and the upper surface of the upper guide 12, respectively, as shown in FIG. 4.

As the material of the lower clad layer 9 and upper clad layer 13, a semiconductor material having a composition expressed by the composition formula of $(Al_{X3} Ga_{1-X3})_{Y1}$ $In_{1-Y1}P$ ($0 \leq X3 \leq 1$, $0 < Y1 \leq 1$), and having a larger band gap than barrier layer 18 is preferable, and a material having a larger band gap than the upper guide layer 12 and lower guide layer 10 is more preferable. As the material, the composition having the formula $(Al_{X3} Ga_{1-X3})_{Y1}$ $In_{1-Y1}$ P ($0 \leq X3 \leq 1$, $0 < Y1 \leq 1$) in which X3 is in the range of 0.3 to 0.7, or Y1 is in the range of 0.4 to 0.6.

The lower clad layer 9 and the upper clad layer 13 are constituted such that polarities are different from each other. Further, with respect to the carrier concentration and the thicknesses of the lower clad layer 9 and the upper clad layer 13, known preferred ranges can be used, and it is preferable to optimize conditions such that the light-emitting efficiency of the light-emitting layer 11 is increased. In addition, by control of the lower clad layer 9 and composition of the upper clad layer 13, it can reduce warping of the compound semiconductor layer 2.

Specifically, as the lower clad layer 9, it is preferable to use a semiconductor material made of, for example, Mg-doped p-type $(Al_{X3} Ga_{1-X3})_{Y1}$ $In_{1-Y1}$ P ($0.3 \leq X3 \leq 0.7$, $0.4 \leq Y1 \leq 0.6$). Further, with respect to the carrier concentration, a range of $2 \times 10^{17}$ to $2 \times 10^{18}$ cm$^{-3}$ is preferable, and with respect to the layer thickness, a range of 0.1 μm to 1 μm is preferable.

On the other hand, as the upper clad layer 13, it is preferable to use a semiconductor material made of, for example, Si-doped n-type $(Al_{X3} Ga_{1-X3})_{Y1}$ $In_{1-Y1}$ P ($0.3 \leq X3 \leq 0.7$, $0.4 \leq Y1 \leq 0.6$). Further, with respect to the carrier concentration, a range of $1 \times 10^{17}$ cm$^{-3}$ to $1 \times 10^{18}$ cm$^{-3}$ is preferable, and with respect to the layer thickness, a range of 0.1 μm to 1 μm is preferable. In addition, the polarities of the lower clad layer 9 and the upper clad layer 13 can be appropriately selected in consideration of an element structure of the compound semiconductor layer 2.

Further, a known layer structure such as a contact layer for reducing contact resistance of the ohmic electrodes, or a current blocking layer, current diffusion layer to make general of light-emitting section scatter element driving current planarly, or current constriction layer for restricting an area through which an element driving current flows, can be provided above the constitution layer of the light-emitting section 7.

Current diffusion layer 8 is installed at lower side of light-emitting section 7, as shown in FIG. 4. The current diffusion layer 8 is formed in order to relax the distortion that produced by active layer 11 when compound semiconductor layer 2 is formed epitaxially on GaAs substrate.

In addition, as the current diffusion layer 8, a transparent material at emitting wavelength of light-emitting section 7 (active layer 11) can be used, such as GaP. When GaP is used as the current diffusion layer 8, and functional substrate 3 also uses GaP substrate, it is easy to bond them and high bond strength can be obtained.

In addition, it is preferable that the thickness of current diffusion layer 8 is in the range of 0.5-20 μm. When less than 0.5 μm, current diffusion is insufficient. When more than 20 μm, the production cost increases since it is necessary to form crystal to such thickness.

The functional substrate 3 is bonded to the surface on the opposite side to the main light extraction surface of the compound semiconductor layer 2. That is, the functional substrate 3 is bonded to the current diffusion layer 8 constituting the compound semiconductor layer 2, as shown in FIG. 4. The functional substrate 3 is made of a material which has sufficient strength to mechanically support the light-emitting section 7 and is capable of transmitting light which is emitted from the light-emitting section 7 and which is optically transparent to the emitting wavelength from the active layer 11. In addition, the construction material that is chemically stable and that was superior in humidity resistance is preferable. For example, it is the construction material that does not contain the Al which is easy to corrode.

As the functional substrate 3, it is preferable that the substrate is superior in humidity resistance, and it is more preferable that the substrate is GaP or SiC having a good heat-conduction. In addition, it is preferable that the substrate is sapphire having a strong mechanical strength.

In addition, it is preferable that the functional substrate 3 be made to have a thickness of, for example, about 50 μm or more in order to support the light-emitting section 7 with a mechanically sufficient strength. Further, in order to facilitate mechanical working of the compound semiconductor layer 2 after the functional substrate 3 is bonded to the compound semiconductor layer 2, it is preferable to set the thickness of the functional substrate 3 not to exceed 300 μm. That is, it is most preferable that the functional substrate 3 be constituted by a GaP substrate having a thickness of not less than about 50 μm and not more than about 300 μm.

In addition, as shown in FIG. 4, the side face of the functional substrate 3 includes a perpendicular plane 3a which is close to the compound semiconductor 2, wherein the perpendicular plane is perpendicular to the main light-extraction surface; and an inclined plane 3b which is far to the compound semiconductor 2, wherein the inclined plane is inclined inside to the main light-extraction surface. As a result, the light emitted from the light-emitting layer 11 to the side of the functional substrate 3 can be extracted outside efficiently. In addition, among the light emitted from the light-emitting layer 11 to the side of the functional substrate 3, the light, which is reflected back in perpendicular plane 3a, can be extracted from the inclined plane 3b, and the light, which is reflected back in inclined plane 3b, can be extracted from the perpendicular plane 3a. As a result, extraction efficiency of light can be raised because of a synergistic effect of perpendicular plane 3a and inclined plane 3b.

In addition, in the present embodiment, it is preferable that angle α between the inclined plane 3b and the plane parallel to light-emitting surface is in the range of 55 to 80 degrees. In such range, the light reflected b ack by the functional substrate 3 can be extracted efficiently outside.

In addition, it is preferable that the thickness of (thickness direction) of perpendicular plane 3a is in a range of 30 to 100 μm. When the thickness of (thickness direction) of perpendicular plane 3a is in a range, the light reflected back by the functional substrate 3 can be returned to light-emitting surface efficiently, and further be extracted from the main light-extraction surface. As a result, the light-emitting efficiency of light-emitting diode 1 can be improved.

In addition, it is preferable for the inclined plane 3b of the functional substrate 3 to be rough-processed. Since the inclined plane 3b is rough-processed, the light extraction efficiency can be raised. In other words, a total reflection by the inclined plane 3b is restrained by making inclined plane 3b rough, and light extraction efficiency can be improved.

There may be a high resistive layer in the bonding interface between the compound semiconductor layer 2 and the functional substrate 3. In other words, a high resistive layer (not shown in drawings) may be installed between compound semiconductor layer 2 and functional substrate 3. When the high resistive layer has a higher resistance value than the functional substrate 3 and the high resistive layer is installed, it has function to reduce current of opposite direction from the current diffusion layer 8 of the compound semiconductor layer 2 to the functional substrate 3. In addition, the bonding structure shows a voltage resistance to the voltage of the opposite direction that is applied from the functional substrate 3 to the current diffusion layer 8 carelessly. However, the breakdown voltage is preferably set to a lower value than the voltage of opposite direction of light-emitting section 7 of p, n junction type.

The n-type ohmic electrode 4 and the p-type ohmic electrode 5 are low-resistance ohmic contact electrodes provided on the main light extraction surface of the light-emitting diode 1. Here, the n-type ohmic electrode 4 is provided above the upper clad layer 13 and, for example, AuGe, or an alloy composed of Ni allow/Au can be used. On the other hand, the p-type ohmic electrode 5 is provided on the exposed upper surface 8a of the current diffusion layer 8, as shown in FIG. 4, and an alloy composed of AuBe/Au or AuZn/Au can be used.

Here, in the light-emitting diode 1 of this embodiment, it is preferable to form the p-type ohmic electrode 5 as the second electrode on the current diffusion layer 8. By such a configuration, the effect of lowering the operating voltage can be obtained. Further, by forming the p-type ohmic electrode 5 on the current diffusion layer 8 made of p-type GaP, excellent ohmic contact can be obtained, so that it is possible to lower the operating voltage.

In addition, in this embodiment, it is preferable that the polarity of the first electrode is n type, and the polarity of the second electrode is p type. High brightness of light-emitting diode 1 can be achieved when such a constitution is used. On the other hand, when the first electrode is p type, current diffusion becomes worse, and brightness become lower. In contrast, current diffusion is improved when the first electrode is n type, and high brightness of light-emitting diode 1 can be achieved.

In the light-emitting diode 1 of this embodiment, it is preferable to dispose the n-type ohmic electrode 4 and the p-type ohmic electrode 5 so as to be at diagonal positions, as shown in FIG. 3. Further, it is most preferable to take a configuration in which the p-type ohmic electrode 5 is surrounded by the compound semiconductor layer 2. By such a configuration, the effect of lowering the operating voltage can be obtained. Further, the p-type ohmic electrode 5 is surrounded on all four sides by the n-type ohmic electrodes 4, whereby it becomes easy for an electric current to flow in all directions, and as a result, the operating voltage is lowered.

Further, in the light-emitting diode 1 of this embodiment, it is preferable to form the n-type ohmic electrode 4 into the form of a reticulation such as a honeycomb or a grating shape, as shown in FIG. 3. By such a configuration, the effect of reducing $V_F$ or the effect of improving reliability can be obtained. Further, by forming it into the form of a grid, it is possible to uniformly inject an electric current into the active layer 11, and as a result, the effect of improving reliability can be obtained. In addition, in the light-emitting diode 1 of this embodiment, it is preferable to constitute the n-type ohmic electrode 4 by a pad-shaped electrode (a pad electrode) and an electrode of a linear shape (a linear electrode) having a width of 10 μm or less. By such a configuration, higher brightness can be attained. Further, by narrowing the width of the linear electrode, it is possible to increase an opening area of the main light extraction surface, so that it is possible to achieve higher brightness.

Method of Manufacturing Light-Emitting Diode

Figure 6:
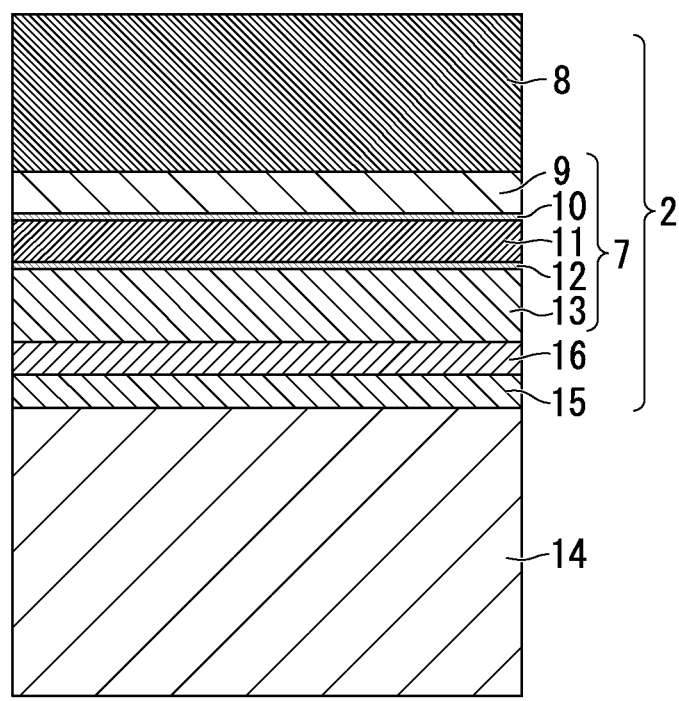
FIG. 6 is a cross-sectional schematic view of an epitaxial wafer which is used in the light-emitting diode related to the embodiment of the invention.
Figure 7:
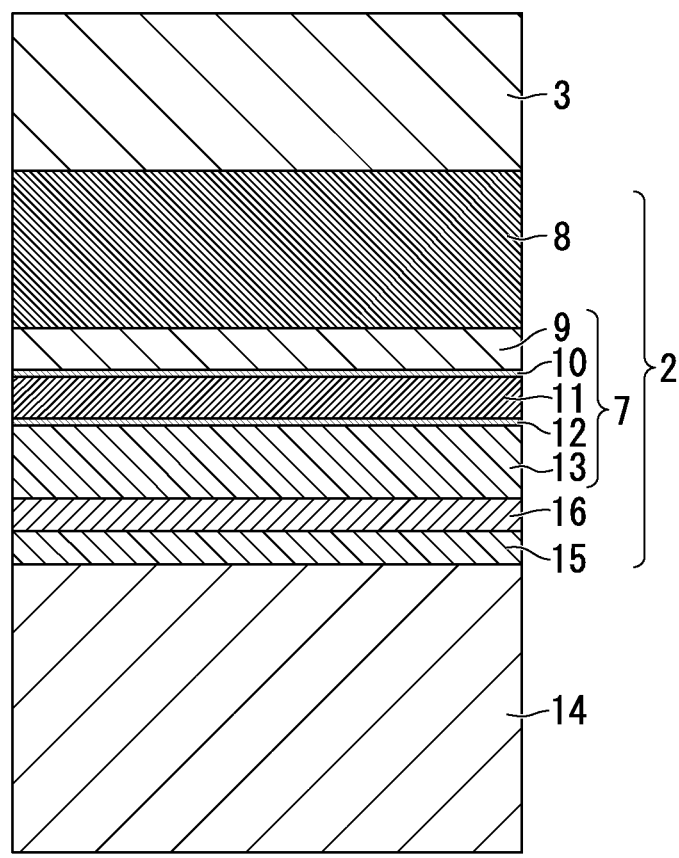
FIG. 7 is a cross-sectional schematic view of a bonded wafer which is used in the light-emitting diode related to the embodiment of the invention.

Next, a method of manufacturing the light-emitting diode 1 of this embodiment will be described. FIG. 6 is a cross-sectional view of an epitaxial wafer which is used in the light-emitting diode 1 of this embodiment. Further, FIG. 7 is a cross-sectional schematic view of a bonded wafer which is used in the light-emitting diode 1 of this embodiment.

Process of Forming Compound Semiconductor Layer

First, as shown in FIG. 6, the compound semiconductor layer 2 is made. The compound semiconductor layer 2 is made by sequentially laminating a buffer layer 15 made of GaAs, an etching stopper layer (not shown) provided in order to be used for selective etching, a contact layer 16 made of Si-doped n-type GaInP, the n-type upper clad layer 13, the upper guide layer 12, the active layer 11, the lower guide layer 10, the p-type lower clad layer 9, and the current diffusion layer 8 made of Mg-doped p-type GaP, on a GaAs substrate 14.

As the GaAs substrate 14, a commercially available single-crystal substrate manufactured by a known manufacturing method can be used. It is preferable that the epitaxially grown surface of the GaAs substrate 14 be smooth. With respect to the plane orientation of the surface of the GaAs substrate 14, a substrate in which epitaxial growth is easy and which is mass-produced and has a (100) plane and a plane deviated within ±20° from (100) is preferable in terms of stability of quality. Further, it is more preferable that a range of the plane orientation of the GaAs substrate 14 be 15°±5° deviated in a (0-1-1) direction from a (100) direction.

It is preferable that the dislocation density of the GaAs substrate 14 be low in order to improve the crystallinity of the compound semiconductor layer 2. Specifically, for example, 10000 pieces cm$^{-2}$ or less, preferably, 1000 pieces cm$^{-2}$ or less is preferable.

The GaAs substrate 14 may also be any of an n-type and a p-type. The carrier concentration of the GaAs substrate 14 can be appropriately selected in terms of a desired electric conductivity and an element structure. For example, in a case where the GaAs substrate 14 is a silicon-doped p-type, it is preferable that the carrier concentration be in a range of $1 \times 10^{17}$ cm$^{-3}$ to $5 \times 10^{18}$ cm$^{-3}$. In contrast, in a case where the GaAs substrate 14 is a zinc-doped p-type, it is preferable that the carrier concentration be in a range of $2 \times 10^{18}$ cm$^{-3}$ to $5 \times 10^{19}$ cm$^{-3}$.

Thickness of GaAs substrate 14 may be in an appropriate range according to size of substrate. It may be broken during a manufacturing process of compound semiconductor layer 2, if the thickness of GaAs substrate 14 is thinner than that in an appropriate range. On the other hand, material costs rise if thickness of GaAs substrate 14 is thicker that that in appropriate range. Therefore, when substrate size of GaAs substrate 14 is large, for example, in the case of the diameter of 75 mm, thickness of 250-500 µm is preferable to preclude crack in handling. In the case of a diameter of 50 mm, thickness of 200-400 µm is preferable, and thickness of 350-600 µm is preferable in the case of a diameter of 100 mm.

Since the thickness of substrate is increased depending on substrate size of GaAs substrate 14, warping of compound semiconductor layer 2 due to light-emitting section 7 can be reduced. As a result, distribution of temperature in epitaxial growth becomes homogeneous, and then in-plane wavelength distribution of active layer 11 can be lowered. In addition, the shape of the GaAs substrate 14 may be rectangle, without limitation to circle in particular.

The buffer layer 15 is provided in order to reduce lattice mismatch between the GaAs substrate 14 and the constitution layer of the light-emitting section 7. Therefore, if the quality of a substrate or an epitaxial growth condition is selected, the buffer layer 15 is not necessarily required. Further, it is preferable that a material of the buffer layer 15 be the same material as that of the substrate which is subjected to epitaxial growth. Therefore, in this embodiment, as the buffer layer 15, it is preferable to use GaAs like the GaAs substrate 14. Further, as the buffer layer 15, in order to reduce the propagation of a defect, a multilayer film made of a material different from the GaAs substrate 14 can also be used. It is preferable that the thickness of the buffer layer 15 be 0.1 µm or more and it is more preferable that it be 0.2 µm or more.

The contact layer 16 is provided in order to lower contact resistance with an electrode. It is preferable that a material of the contact layer 16 be a material which has a larger bond gap than that of the active layer 11, and $Al_XGa_{1-X}As$, $(Al_XGa_{1-X})_YIn_{1-Y}P$ ($0 \leq X \leq 1$, $0 < Y \leq 1$) is preferable. Further, it is preferable that the lower limit of the carrier concentration of the contact layer 16 be $5 \times 10^{17}$ cm$^{-3}$ or more in order to lower contact resistance with an electrode, and $1 \times 10^{18}$ cm$^{-3}$ or more is more preferable. It is preferable that the upper limit of the carrier concentration be $2 \times 10^{19}$ cm$^{-3}$ or less where the lowering of crystallinity easily occurs. With respect to the thickness of the contact layer 16, 0.5 µm or more is preferable and 1 µm or more is preferred. The upper limitation of the thickness is not limited particularly, and 5 µm or less is preferable when cost of epitaxial growing process is taken into consideration.

In this embodiment, it is possible to apply a known growth method such as a molecular beam epitaxial method (MBE) or a low-pressure metal-organic chemical vapor deposition method (an MOCVD method). In particular, it is preferable to apply the MOCVD method having excellent mass-productivity. Specifically, in the GaAs substrate 14 which is used for the epitaxial growth of the compound semiconductor layer 2, it is preferable to remove contamination of the surface or a natural oxide film by carrying out a pretreatment such as a cleaning process or a thermal treatment before the growth. Each layer which is included in the above compounds semiconductor layer 2 is formed by setting the GaAs substrate 14 of a diameter of 50-150 mm in MOCVD apparatus, and then making them grow up epitaxially. In addition, as a MOCVD apparatus, commercial large-scale apparatus such as a planetary or a high-speed rotary type can be used.

When each layer of the compound semiconductor layer 2 is epitaxially grown, as a raw material of a group III constituent element, for example, trimethylaluminum (($CH_3)_3Al$), trimethylgallium (($CH_3)_3Ga$), and trimethylindium (($CH_3)_3In$) can be used. Further, as a doping material of Mg, for example, bis-cyclopentadienyl magnesium (bis-$(C_5H_5)_2Mg$) or the like can be used. Further, as a doping material of Si, for example, disilane ($Si_2H_6$) or the like can be used. Further, as a raw material of a group V constituent element, phosphine ($PH_3$), arsine ($AsH_3$), or the like can be used. Further, as the growth temperature of each layer, in the case of using p-type GaP as the current diffusion layer 8, a temperature in a range of 720° C. to 770° C. can be applied, and in each of the other layers, a temperature in a range of 600° C. to 700° C. can be applied. Further, the carrier concentration and the layer thickness of each layer and a temperature condition can be appropriately selected.

In the compound semiconductor layer 2 made in this way, an excellent surface state in which crystal defects are few can be obtained. Further, the compound semiconductor layer 2 may also be subjected to a surface treatment such as polishing considering an element structure.

Process of Bonding Functional Substrate

Next, the compound semiconductor layer 2 and the functional substrate 3 are bonded to each other. In the bonding of the compound semiconductor layer 2 and the functional substrate 3, first, mirror finishing is carried out by polishing the surface of the current diffusion layer 8 constituting the compound semiconductor layer 2. Next, the functional substrate 3 which is attached to the mirror-polished surface of the current diffusion layer 8 is prepared. In addition, the surface of the functional substrate 3 is polished into a mirror surface before it is bonded to the current diffusion layer 8. Next, the compound semiconductor layer 2 and the functional substrate 3 are loaded into a general semiconductor material attachment apparatus, and the mirror-polished surfaces of the two are irradiated with an Ar beam neutralized by collision of electrons in a vacuum. Thereafter, bonding can be performed at room temperature by overlapping the surfaces of the two over each other and then applying a load thereto in the attachment apparatus in which the vacuum is maintained (refer to FIG. 7). As the bonding, it is preferable that the materials of the bonding interface is the same material from the view point of a stable bonding condition Normal temperature bonding under such a vacuum is the most preferable for bonding (pasting), however, eutectic metal or adhesion may be used.

Process of Forming the First and the Second Electrodes

Next, the n-type ohmic electrode 4 of the first electrode and the p-type ohmic electrode 5 of the second electrode are formed. In the formation of the n-type ohmic electrode 4 and the p-type ohmic electrode 5, first, the GaAs substrate 14 and the GaAs buffer layer 15 are selectively removed from the compound semiconductor layer 2 bonded to the functional substrate 3, by an ammonia-based etchant. Next, the n-type ohmic electrode 4 is formed on the exposed surface of the contact layer 16. Specifically, after AuGe and Ni alloy/Au are laminated so as to become an arbitrary thickness by a vacuum deposition method, the shape of the n-type ohmic electrode 4 is formed by performing patterning with the use of, for example, general photolithographic methods.

Next, the current diffusion layer 8 is exposed by selectively removing the contact layer 16, the upper clad layer 13, the upper guide layer 12, the active layer 11, the lower guide layer 10, and the lower clad layer 9, and the p-type ohmic electrode 5 is then formed on the exposed surface (the upper surface 8a). Specifically, after Au/Be/Au are laminated so as to become an arbitrary thickness by a vacuum deposition method, the shape of the p-type ohmic electrode 5 is formed by performing patterning with the use of, for example, general photolithographic means. Thereafter, by performing alloying by performing a thermal treatment in conditions of, for example, 400° C. to 500° C. and 5 minutes to 20 minutes, it is possible to form the low-resistance n-type and p-type ohmic electrodes 4 and 5.

Processing Functional Substrate

Next, the shape of functional substrate 3 is processed. The functional substrate 3 is processed by firstly performing a V-shaped groove on the surface on which the third electrode 6 is not formed. And an inclined plane 3b is formed, which has an angle α between the inside surface of V-shaped groove in the side of the third electrode 6 and the plane parallel to light-emitting surface. Secondly, Dice cutting is performed in predetermined distance from the side of compound semiconductor layer 2, and chips are formed. In addition, the perpendicular plane 3a of the functional substrate 3 is formed by dice cutting during the formation of chips.

As a method of forming the inclined plane 3b, it is not limited in particular, a method of combination of conventional methods such as wet etching, dry etching, scribing method, laser machining, can be used. However, it is the most preferable to use a dice cutting method having high controllability of shape and high productivity. Manufacturing yield can be improved by using the dice cutting method.

As a method of forming the perpendicular plane 3a, it is not limited in particular, however, it is preferable that a scribe-breaking method, a laser machining method or a dice cutting method can be used. However, when a laser machining method or a dice cutting method is used, manufacturing cost can be lowered. In other words, manufacturing cost can be lowered in mass-producing light-emitting diodes because that there is no necessity for designing cutting margin in the case of chip isolation. On the other hand, the dice cutting method is superior in cutting stability.

Finally, a crush layer and fouling are etched with a mixed solution of sulfuric acid and hydrogen peroxide if necessary. In this way the light-emitting diode 1 is produced.

Method of Manufacturing Light-Emitting Diode Lamp

Next, a method of manufacturing the light-emitting diode lamp 41 using the light-emitting diode 1, that is, a method of mounting the light-emitting diode 1 will be described.

As shown in FIGS. 1 and 2, a given quantity of light-emitting diodes 1 are mounted on the surface of the mount substrate 42. In the mounting of the light-emitting diode 1, first, alignment of the mount substrate 42 and the light-emitting diode 1 is performed, thereby disposing the light-emitting diode 1 at a given position on the surface of the mount substrate 42. Next, the light-emitting diode 1 is die-bonded to the surface of the mount substrate 42 by Ag paste. Next, the n-type ohmic electrode 4 of the light-emitting diode 1 and the n-electrode terminal 43 of the mount substrate 42 are connected to each other by using the gold wire 45 (wire bonding). Next, the p-type ohmic electrode 5 of the light-emitting diode 1 and the p-electrode terminal 44 of the mount substrate 42 are connected to each other by using the gold wire 46. Finally, the surface of the mount substrate 42 on which the light-emitting diode 1 is mounted is sealed by a general epoxy resin 47. In this way, the light-emitting diode lamp 41 using the light-emitting diode 1 is manufactured.

In addition, emission spectrum of light-emitting diode lamp 41, for example, having a peak light wavelength in a range of 720-760 nm, can be obtained by adjusting the composition of active layer 11. In addition, since dispersion of the well layer 17 and barrier layer 18 in active layer 11 are depressed by current diffusion layer 8a, half band width of emission spectrum becomes falling in the range of 10-40 nm.

As discussed above, according to the present embodiment, light-emitting diode 1 includes a compound semiconductor layer 2 including light-emitting section 7 having well layer 17 made from composition formula $(Al_{X1} Ga_{1-X1})As$ $(0 \leq X1 \leq 0.36)$.

In addition, on the light-emitting section 7, a current diffusion layer 8 is installed in the light-emitting diode 1 of the present embodiment. Since the current diffusion layer 8 is transparent for the emitting light wavelength, it does not absorb the emission of light from light-emitting section 7. As a result, the light-emitting diode 1 having high output and high efficiency can be obtained. The functional substrate, as a stable material, has superior humidity resistance without worrying about corrosion.

Thus, according to light-emitting diode 1 of the present embodiment, the light-emitting diode 1 having an emitting light wavelength of 720 nm to 760 nm, superior monochromatism, high output and high efficiency, and humidity resistance can be provided. In addition, according to the light-emitting diode 1 of the present embodiment, the light-emitting diode 1 having high output with efficiency more than about 1.5 times than the light-emitting diode of transparent substrate AlGaAs type, which was produced by conventional liquid phase epitaxial growth method, can be provided. In addition, reliability under high temperature and high humidity is improved, too.

In addition, according to the present embodiment, the light-emitting diode lamp 41 includes light-emitting diode 1 having the emitting light wavelength of about 730 nm, superior monochromatism, high output and high efficiency, and humidity resistance. Therefore, the light-emitting diode lamp 41 which is preferable for illumination for plant upbringing can be provided.

Light-Emitting Diode (Second Embodiment)

The light-emitting diode of the second embodiment, which the invention is applied, includes: a light-emitting section 7, which comprises an active layer 11, having a quantum well structure and formed by laminating alternately a well layer 17 which comprises a composition expressed by the composition formula of $(Al_{X1} Ga_{1-X1})As$ ($0 \leq X1 \leq 1$) and a barrier layer 18 which comprises a composition expressed by the composition formula of $(Al_{X4} Ga_{1-X4})_{Y2} In_{1-Y2} P$ ($0 \leq X4 \leq 1$, $0 < Y2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section 7; and a functional substrate 3 bonded to the current diffusion layer 8.

The difference between the light-emitting diode of the second embodiment and that of the first embodiment is that the barrier layer 18 of the second embodiment comprises a composition expressed by the composition formula of $(Al_{X4} Ga_{1-X4})_{Y2} In_{1-Y2} P$ ($0 \leq X4 \leq 1$, $0 < Y2 \leq 1$).

Since it is preferable that barrier layer 18 has a composition having larger bang gap than that of the well layer 17, and from the viewpoint of crystallinity, it is preferable that Al concentration is low. Therefore, it is preferable that the range of X3 is 0.3-0.7 and the range of Y2 is 0.4-0.6. The most preferable composition X2, Y2 is decided by the composition of the well layer.

Light-Emitting Diode (Third Embodiment)

Figure 8A:
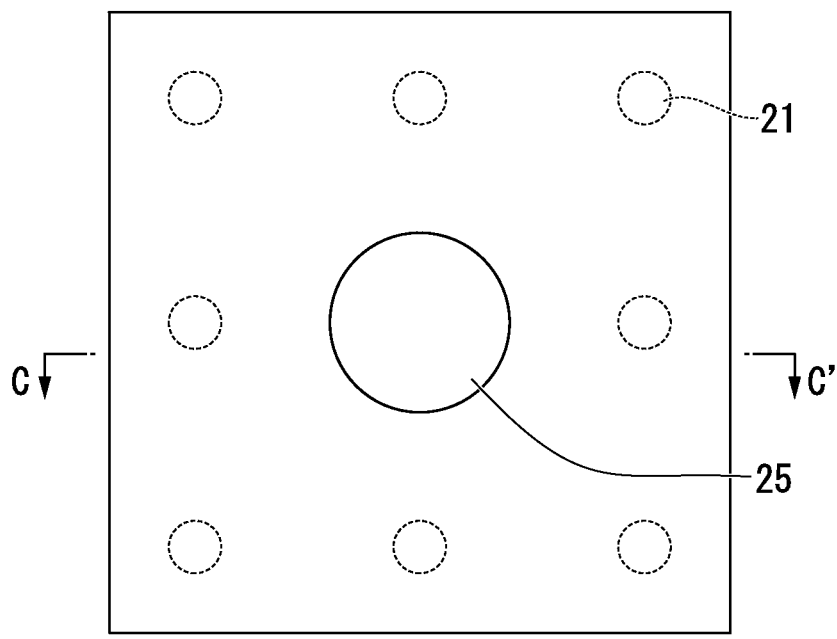
FIG. 8A is a plan view of a light-emitting diode lamp using a light-emitting diode related to another embodiment of the invention, and 8B is a cross-sectional schematic view taken along line C-C' in FIG. 8A.
Figure 8B:
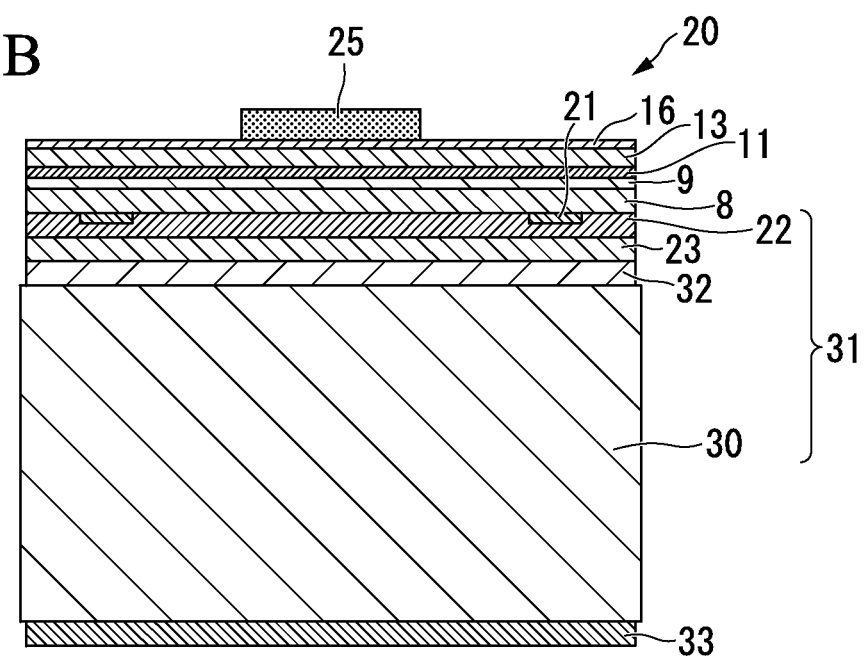

FIGS. 8A and 8B are diagrams for describing the light-emitting diode related to the third embodiment to which the invention is applied, wherein FIG. 8A is a plan view and FIG. 8B is a cross-sectional view along line C-C' shown in FIG. 8A.

The light-emitting diode of the third embodiment includes: a light-emitting section, which includes an active layer 11, having a quantum well structure and formed by laminating alternately a well layer 17 which comprises a composition expressed by the composition formula of $(Al_{X1} Ga_{1-X1})As$ ($0 \leq X1 \leq 1$) and a barrier layer 18 which comprises a composition expressed by the composition formula of $(Al_{X2} Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section; and a functional substrate 31 which includes a reflection layer 23 having reflection index of 90% or more at the emitting wavelength, the functional substrate 31 is bonded to the current diffusion layer 8.

Since the light-emitting diode of the third embodiment includes the functional substrate 31 having the reflection layer 23 having reflection index of 90% or more at the emitting wavelength, emitting light can be extracted from the main light extraction surface effectively.

As example shown in FIGS. 8A and 8B, the functional substrate 31 includes a reflection structure including a second electrode 21 on lower surface 8b of the current diffusion layer 8, a transparent conducting layer 22 and a reflection layer 23 which are laminated to cover the second electrode 21; and a layer (substrate) 30 including silicon or germanium.

In the light-emitting diode of the third embodiment, as functional substrate 31, silicon or germanium is preferable. Since the materials are hard to corrode, humidity resistance can be improved.

As the reflection layer 23, for example, silver (Ag), aluminium (Al), gold (Au) or alloy thereof may be used. Since these materials have high reflectance, the reflectance of the reflection layer 23 can be 90% or more.

The functional substrate 31 may include a combination of bonding reflection layer 23 with a cheap substrate (layer) such as silicon or germanium by using eutectic metal such as AuIn, AuGe, or AuSn. Since AuIn has low bonding temperature, and small difference in thermal expansion coefficient from the light-emitting section in particular, it is the most preferable combination to bond the cheapest silicon substrate (a silicon layer) with AuIn.

For example, as functional substrate 31, it is more preferable from the viewpoint of stability of quality to insert a layer made from a metal having a high melting point such as titanium (Ti), tungsten (W) or platinum (Pt) so that current diffusion layer, reflection layer metal and eutectic metal do not diffuse mutually.

Light-Emitting Diode (4th Embodiment)

Figure 9:
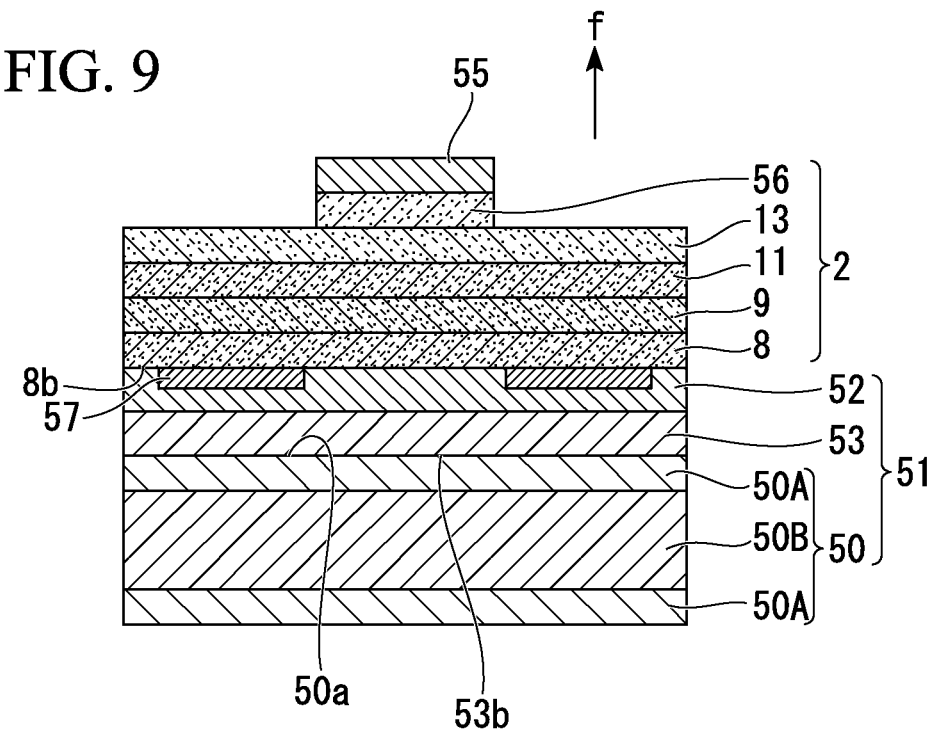
FIG. 9 is a cross-sectional schematic view of a light-emitting diode lamp using a light-emitting diode related to another embodiment of the invention.

FIG. 9 is diagram for describing the light-emitting diode related to the 4th embodiment to which the invention is applied.

The light-emitting diode of the third embodiment includes: a light-emitting section, which includes an active layer 11, having a quantum well structure and formed by laminating alternately a well layer 17 which comprises a composition expressed by the composition formula of $(Al_{X1} Ga_{1-X1})As$ ($0 \leq X1 \leq 1$) and a barrier layer 18 which comprises a composition expressed by the composition formula of $(Al_{X2} Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section; and a functional substrate 51 which includes a reflection layer 53 having reflection index of 90% or more at the emitting wavelength and a metal substrate 50, the functional substrate 51 is bonded to the current diffusion layer 8.

As the light-emitting diode of the 4th embodiment, the point that the functional substrate includes a metal substrate is different from that of the light-emitting diode of the second embodiment.

Since the metal substrate has a high heat dissipation characteristic, using the metal substrate in the light-emitting diode not only can contribute to emit light in high brightness, but also can increase the lifetime of the light-emitting diode.

From the viewpoint of heat dissipation characteristics, it is preferable to use a metal substrate made from a metal having a coefficient of thermal conductivity of 130 W/m·K or more. For example, the metal having the coefficient of thermal conductivity of 130 W/m·K or more is molybdenum (138 W/m·K) and tungsten (174 W/m·K).

As shown in FIG. 9, the compound semiconductor layer 2 includes an active layer 11, a first clad layer (lower part clad) 9 and a second clad layer (upper part clad) 13 between both of which the active layer 11 is inserted through a guide layer (not shown), a current diffusion layer 8 below the first clad layer (lower part clad) 9, a first electrode 55 above the second clad layer (upper part clad) 13, and a contact layer 56 having about the same size in planar view.

A functional substrate 51 includes a second electrode 57 on lower surface 8b of the current diffusion layer 8, a reflection structure obtained by laminating a transparent conducting layer 52 and reflection layer 53 in order to cover the second electrode 57, and a metal substrate 50. The surface 53b of the reflection layer 53 opposite to the semiconductor compound layer is bonded to the bonding surface 50a of the metal substrate 50.

As the reflection layer 53, for example, a metal such as copper, silver, gold, aluminium or alloy thereof may be used. Since these materials have high reflectance, the reflectance of the reflection layer 53 can be 90% or more. Since reflection layer 53 is formed, light emitted from the active layer 11 is reflected in front direction f by the reflection layer 53, and the light extraction efficiency in front direction f can be improved. As a result, a light-emitting diode having higher intensity can be produced.

As the reflection layer 53, multilayer including Ag, a Ni/Ti barrier layer, and Au-typed eutectic metal (bonding metal) in the above order from the side of transparent conducting layer 52 is preferable.

The bonding metal is a metal having low electric resistance and low melting point. The metal substrate can be bonded without giving the compound semiconductor layer 2 heat stress by using the metal for bonding.

As the bonding metal, Au-typed eutectic metal having a low melting point and having chemical stability may be used. As Au-typed eutectic metal, for example, an eutectic composition (As Au-typed eutectic metal) of alloy such as AuSn, AuGe, AuSi can be used.

In addition, it is preferable to add a metal such as titanium, chromium, tungsten in the bonding metal. As a result, the metal such as titanium, chromium, tungsten can prevent, as barrier metal, impurity in the metal substrate from diffusing into the reflection layer 53 and depressing the reaction.

Transparent conducting layer 52 includes ITO layer and IZO layer. A reflection structure may include the reflection layer 53 only.

In addition, as a substitution for transparent conducting layer 52, or combination with transparent conducting layer 52, a so-called cold mirror which utilizes refractive index difference of transparent materials may be put together to reflection layer 53. For example, a multilayer film of oxidation titanium film or silicon oxide, white alumina and AlN may be used.

As the metal substrate 50, a plural metal layers may be used.

It is preferable that two kinds of metal layers are laminated alternately to form metal substrate.

Particularly, it is preferable that the layer number of these two kinds of metal layers is an odd number.

In this case, from the viewpoint of warping and cracking of the metal substrate, when a second metal layer 50B uses a material having smaller coefficient of thermal expansion than that of compound semiconductor layer 2, it is preferable that a first metal layer 50A uses a material having larger coefficient of thermal expansion than that of compound semiconductor layer 2. Since the coefficient of thermal expansion of the whole metal substrate is similar to coefficient of thermal expansion of the compound semiconductor layer, warping and cracking of the metal substrate when bonding the compound semiconductor layer can be repressed. As a result, manufacturing yield of the light-emitting diode can be improved. When second a second metal layer 50B uses a material having larger coefficient of thermal expansion than that of compound semiconductor layer 2, it is preferable that a first metal layer 50A uses a material having smaller coefficient of thermal expansion than that of compound semiconductor layer 2. Since the coefficient of thermal expansion of the whole metal substrate is similar to coefficient of thermal expansion of the compound semiconductor layer, warping and cracking of the metal substrate when bonding the compound semiconductor layer can be repressed. As a result, manufacturing yield of the light-emitting diode can be improved.

From the viewpoint of above, two kinds of metal layers may be used as either the first metal layer or the second metal layer.

As two kinds of metal layers, for example, a combination between a metal layer made from silver (coefficient of thermal expansion=18.9 ppm/K), copper (coefficient of thermal expansion=16.5 ppm/K) gold (coefficient of thermal expansion=14.2 ppm/K) aluminium (coefficient of thermal expansion=23.1 ppm/K), nickel (coefficient of thermal expansion=13.4 ppm/K) and alloy thereof; and a metal layer made from molybdenum (coefficient of thermal expansion=5.1 ppm/K), tungsten (coefficient of thermal expansion=4.3 ppm/K), chromium (coefficient of thermal expansion=4.9 ppm/K) and alloy thereof can be used.

A metal substrate having three layers of Cu/Mo/Cu is preferable. From the above view point, a similar effect is provided with the metal substrate having three layers of Mo/Cu/Mo. However, since the metal substrate having three layers of Cu/Mo/Cu has a structure in which Mo having strong mechanical strength is surround by Cu which is easy to process, it is easier to be processed than that of the metal substrate having three layers of Mo/Cu/Mo.

As the coefficient of thermal expansion of the whole metal substrate, for example, metal substrate having three layers of Cu (30 µm)/Mo (25 µm)/Cu (30 µm) is 6.1 ppm/K, and the metal substrate having three layers of Mo (25 µm)/Cu (70 µm)/Mo (25 µm) is 5.7 ppm/K, In addition, from the viewpoint of heat dissipation, it is preferable that a metal layer of the metal substrate is made from materials having high heat-conductivity. As a result, since heat dissipation ability of metal substrate is improved, not only the light-emitting diode can emit light in high brightness, but also the light-emitting diode having a long lifetime can be obtained.

For example, it is preferable that silver (heat-conductivity=420 W/m·K), copper (heat-conductivity=398 W/m·K), gold (heat-conductivity=320 W/m·K), aluminium (heat-conductivity=236 W/m·K), molybdenum (heat-conductivity=138 W/m·K), or tungsten (heat-conductivity=174 W/m·K), and an alloy thereof can be used.

It is more preferable that the coefficient of thermal expansion of the materials of the metal layers is approximately equal to the coefficient of thermal expansion of the compound semiconductor layer. It is particularly preferable that the material of the metal layer has the coefficient of thermal expansion which is within ±1.5 ppm/K of the coefficient of thermal expansion of the compound semiconductor layer. Since the stress, which is generated by heat when metal substrate is bonded with the compound semiconductor layer, to light-emitting section can be lowered, crack of metal substrate, which is generated by heat when bonding the compound semiconductor layer, can be repressed. As a result, manufacturing yield of the light-emitting diode can be improved.

As a heat-conductivity of the whole metal substrate, for example, the heat-conductivity of metal substrate having three layers of Cu (30 µm)/Mo (25 µm)/Cu (30 µm) is 250 W/m·K and the heat-conductivity of metal substrate having three layers of Mo (25 µm)/Cu (70 µm)/Mo (25 µm) is 220 W/m·K.

Light-Emitting Diode(5th Embodiment)

The light-emitting diode of the 5th embodiment includes: a light-emitting section, which includes an active layer 11, having a quantum well structure and formed by laminating alternately a well layer 17 which comprises a composition expressed by the composition formula of $(Al_{X1} Ga_{1-X1})As$ ($0 \leq X1 \leq 1$) and a barrier layer 18 which comprises a composition expressed by the composition formula of $(Al_{X4} Ga_{1-X4})_{Y2} In_{1-Y2} P$ ($0 \leq X4 \leq 1$, $0<Y2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0<Y1 \leq 1$); a current diffusion layer 8 formed on the light-emitting section; and a functional substrate 31 which includes a reflection layer 23 having reflection index of 90% or more at the emitting wavelength, the functional substrate 31 is bonded to the current diffusion layer 8.

As the functional substrate of the present embodiment, the example of functional substrates illustrated in the third embodiment and fourth embodiment can be used.

Light-Emitting Diode(6th Embodiment)

FIGS. 3 and 4 are diagrams for describing the light-emitting diode related to the 6th embodiment to which the invention is applied, wherein FIG. 3 is a plan view and FIG. 4 is a cross-sectional view along line B-B' shown in FIG. 3. In addition, FIG. 5 is a cross-section of a multilayer.

The light-emitting diode of the 6th embodiment includes: a light-emitting section 7, which comprises an active layer 11, having a quantum well structure and formed by laminating alternately a well layer 17 which comprises a composition expressed by the composition formula of $(Al_{X1} Ga_{1-X1})As$ ($0.20 \leq X1 \leq 0.36$) and a barrier layer 18 which comprises a composition expressed by the composition formula of $(Al_{X2} Ga_{1-X2})As$ ($0<X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0<Y1 \leq 1$); a current diffusion layer 8 formed on the light-emitting section 7; and a functional substrate 3 bonded to the current diffusion layer 8, wherein the thickness of well layer 17 is 3 to 30 nm and emitting wavelength is 660 nm to 720 nm.

The main light extraction surface in the present embodiment is the surface that is the opposite side of the bonding surface of the compound semiconductor layer with the functional substrate 3.

The compound semiconductor layer (also called an epitaxial growth layer) 2 has a structure in which a p, n-junction type light-emitting section 7, and a current diffusion layer 8 are sequentially stacked, as shown in FIG. 4. A known functional layer can be added to the structure of the compound semiconductor layer 2 on a timely basis. For example, it is possible to provide a known layer structure such as a contact layer for reducing contact resistance of the ohmic electrodes, current diffusion layer to make general of light-emitting section scatter element driving current planarly, or a current blocking layer or current constriction layer for restricting an area through which an element driving current flows. In addition, it is preferable that the compound semiconductor layer 2 be a layer formed by epitaxial growth on a GaAs substrate.

The light-emitting section 7 has a configuration in which at least a p-type lower clad layer 9, lower guide layer (not shown), a light-emitting layer (active layer) 10, upper guide layer (not shown) and an n-type upper clad layer 13 are sequentially laminated on the current diffusion layer 8, as shown in FIG. 4. That is, in order to obtain high-intensity luminescence, it is preferable that the light-emitting section 7 be made to be a so-called double hetero (DH) structure which includes the lower clad layer 9 and the upper clad layer 13 disposed to confront each other on the lower side and the upper side of the active layer 11 in order to "confine" a carrier leading to radiation recombination, and luminescence in the active layer 11.

It is preferable for the active layer 11 to include a well structure to control emitting light wavelength of the light-emitting diode (LED) as shown in FIG. 5. In other words, the active layer 11 includes a multi-layer structure (multilayer) having well layers and barrier layers, and has barrier layers 18 at both ends of the multi-layer structure.

It is preferable that the layer thickness of the active layer 11 be in a range of 0.02 μm to 2 μm. Further, a conduction type of the active layer 11 is not particularly limited and any of an un-doped type, a p type, and an n type can be selected. In order to increase light-emitting efficiency, it is preferable to make the active layer 11 be the un-doped type having excellent crystallinity or have a carrier concentration of less than $3 \times 10^{17}$ cm$^{-3}$.

Table 4 shows correlation between Al composition X1 and emission peak wavelength, when the thickness of the well layer 17 is 17 nm. It is understood that emission peak wavelength becomes longer while Al composition X1 becomes lower. In addition, Al composition, corresponding to the peak wavelength which is not listed in Table 4, can be estimated

TABLE 4

| Peak Wavelength (nm) | Al composition (X) |
|---|---|
| 660 | 0.33 |
| 680 | 0.28 |
| 700 | 0.24 |
| 720 | 0.20 |

As the thickness of the well layer 17, a range of 3-30 nm is preferred. More preferably, it is in the range of 5-20 nm.

Table 5 shows a correlation between the thickness of the well layer 17 and emission peak wavelength when Al composition of the well layer 17 X1=0.24. It is understood that emission peak wavelength becomes shorter while the well layer 17 becomes thinner because of quantum effect. When it is thick, emission peak wavelength is constant according to composition. In addition, thickness of layer corresponding to the emission peak wavelength which is not listed in Table 5 can be estimated.

TABLE 5

| Peak Wavelength (nm) | Thickness (nm) |
|---|---|
| 680 | 5 |
| 690 | 8 |
| 700 | 17 |
| 710 | 25 |

For example, in order to obtain a predetermined emission peak wavelength in the range of 680 to 720 nm, according to the correlation of emission peak wavelength, and Al composition X1 and thickness of the well layer 17, Al composition X1 and thickness of the well layer 17 can be decided.

The barrier layer 18 has composition expressed by the composition formula of $(Al_{X2} Ga_{1-X2})As$ ($0<X2 \leq 1$). Since it is preferable that barrier layer 18 has a composition having larger bang gap than that of the well layer 17, and from the viewpoint of crystallinity, it is preferable that Al concentration is low. Therefore, it is preferable that the range of X2 is 0.4-0.6. The most preferable composition X2 is decided by the composition of the well layer.

It is preferable for thickness of barrier layer 18 to be thicker than thickness of well layer 17. As a result, light-emitting efficiency of well layer 17 can be improved.

In the multi-layer structure having well layers 17 and barrier layers 18, the pair number of alternately laminating a well layer 17 and barrier layer 18 is not limited particularly, but it is preferable to be 40 pairs or less and two pairs or more. In other words, it is preferable that the active layer 11 include 2-40 layers of the well layer 17. Since the active layer has a preferred light-emitting efficiency, it is preferable that there are more than two layers of well layers 17. On the other hand, since carrier density in the well layer 17 and barrier layer 18 is low, when too many pairs are used, forward direction voltage ($V_F$) increases. Because of this, it is preferable to use 40 pairs or less and more preferable to use 20 pairs or less.

The lower guide layer 10 and the upper guide layer 12 are respectively provided on the lower surface and the upper surface of the active layer 11, as shown in FIG. 4. Specifically, the lower guide layer 10 is provided on the lower surface of the active layer 11 and the upper guide layer 12 is provided on the upper surface of the active layer 11.

Lower guide layer 10 and upper part guide layer 12 has composition expressed by the composition formula of $(Al_X Ga_{1-X})As$ ($0<X\leq1$). Since it is preferable that it has a composition having larger bang gap than that of barrier layer 18, it is preferable that Al concentration is low, the range of X is 0.4-0.7 preferably. From the viewpoint of crystallinity, the most preferable composition X is decided by the composition of the well layer.

Table 6 shows compositions X1 of barrier layer 18 and guide layer which have the most larger output at emission peak wavelength when the thickness of the well layer 17 is 17 nm. Since it is preferable that barrier layer and guide layer have a composition having larger bang gap than that of the well layer, and from the viewpoint of crystallinity, the most preferable composition is decided by the composition of the well layer.

TABLE 6

| Peak Wavelength (nm) | Well (X) | Barrier (X) | Guide (X) |
| --- | --- | --- | --- |
| 680 | 0.28 | 0.45 | 0.6 |
| 700 | 0.24 | 0.40 | 0.6 |

The lower guide layer 10 and upper guide layer 12 are installed to reduce transfer of defects between the lower clad layer 9 and active layer 11, and between the upper clad layer 13 and active layer 11, respectively. In other words, since V group constituent elements of the lower clad layer 9 and upper part clad layer 13 of the present invention are phosphor (P) whereas V group constituent elements of the lower guide layer 10, upper part guide layer 12 and active layer 11 are arsenic (As), it is easy to produce defect in an interface surface. Transfer of defect to active layer 11 causes performance deterioration of light-emitting diode. Therefore, the thickness of the lower guide layer 10 and layer of upper guide layer 12 is preferably 10 nm or more, and more preferably 20 nm-100 nm.

Conduction types of the lower guide layer 10 and upper part guide layer 12 are not limited particularly, and any one of undoped type, p type and n-type can be used. It is preferable to use the undoped type having excellent crystallinity or use a carrier density less than $3\times10^{17}$ cm$^{-3}$ to raise light-emitting efficiency.

The lower clad layer 9 and the upper clad layer 13 are respectively provided on the lower surface and the upper surface of the active layer 11, as shown in FIG. 4. Specifically, the lower clad layer 9 is provided on the lower surface of the active layer 11 and the upper clad layer 13 is provided on the upper surface of the active layer 11.

As the material of the lower clad layer 9 and upper clad layer 13, a semiconductor material having a composition expressed by the composition formula of $(Al_{X3} Ga_{1-X3})_{Y1} In_{1-Y1} P$ ($0\leq X3\leq1$, $0<Y1\leq1$), and having a larger band gap than barrier layer 18 is preferable, and a material having a larger band gap than the upper guide layer 12 and lower guide layer 10 is more preferable. As the material, the composition having the formula $(Al_{X3} Ga_{1-X3})_{Y1} In_{1-Y1} P$ ($0\leq X3\leq1$, $0<Y1\leq1$) in which X3 is in the range of 0.3 to 0.7, or Y1 is in the range of 0.4 to 0.6.

The lower clad layer 9 and the upper clad layer 13 are constituted such that polarities are different from each other. Further, with respect to the carrier concentration and the thicknesses of the lower clad layer 9 and the upper clad layer 13, known preferred ranges can be used, and it is preferable to optimize conditions such that the light-emitting efficiency of the active layer 11 is increased. In addition, by control of the lower clad layer 9 and composition of the upper clad layer 13, it can reduce warping of the compound semiconductor layer 2.

Specifically, as the lower clad layer 9, it is preferable to use a semiconductor material made of, for example, Mg-doped p-type $(Al_{X3} Ga_{1-X3})_{Y1} In_{1-Y1} P$ ($0.3\leq X3\leq0.7$, $0.4\leq Y1\leq0.6$). Further, with respect to the carrier concentration, a range of $2\times10^{17}$ to $2\times10^{18}$ cm$^{-3}$ is preferable, and with respect to the layer thickness, a range of 0.1 µm to 1 µm is preferable.

On the other hand, as the upper clad layer 13, it is preferable to use a semiconductor material made of, for example, Si-doped n-type $(Al_{X3} Ga_{1-X3})_{Y1} In_{1-Y1} P$ ($0.3\leq X3\leq0.7$, $0.4\leq Y1\leq0.6$). Further, with respect to the carrier concentration, a range of $1\times10^{17}$ cm$^{-3}$ to $1\times10^{18}$ cm$^{-3}$ is preferable, and with respect to the layer thickness, a range of 0.1 µm to 1 µm is preferable. In addition, the polarities of the lower clad layer 9 and the upper clad layer 13 can be appropriately selected in consideration of an element structure of the compound semiconductor layer 2.

Further, a known layer structure such as a contact layer for reducing contact resistance of the ohmic electrodes, or a current blocking layer, current diffusion layer to make general of light-emitting section scatter element driving current planarly, or current constriction layer for restricting an area through which an element driving current flows, can be provided above the constitution layer of the light-emitting section 7.

Current diffusion layer 8 is installed at lower side of light-emitting section 7, as shown in FIG. 4. The current diffusion layer 8 is formed in order to relax the distortion that produced by active layer 11 when compound semiconductor layer 2 is formed epitaxially on GaAs substrate.

In addition, as the current diffusion layer 8, a transparent material at emitting wavelength of light-emitting section 7 (active layer 11) can be used, such as GaP. When GaP is used as the current diffusion layer 8, and functional substrate 3 also uses GaP substrate, it is easy to bond them and high bond strength can be obtained.

In addition, it is preferable that the thickness of current diffusion layer 8 is in the range of 0.5-20 µm. When less than 0.5 µm, current diffusion is insufficient. When more than 20 µm, the production cost increases since it is necessary to form crystal to such thickness.

The functional substrate 3 is bonded to the surface on the opposite side to the main light extraction surface of the compound semiconductor layer 2. That is, the functional substrate 3 is bonded to the current diffusion layer 8 constituting the compound semiconductor layer 2, as shown in FIG. 4. The functional substrate 3 is made of a material which has sufficient strength to mechanically support the light-emitting section 7 and is capable of transmitting light which is emitted from the light-emitting section 7 and which is optically transparent to the emitting wavelength from the active layer 11. In addition, the construction material that is chemically stable and that was superior in humidity resistance is preferable. For example, it is the construction material that does not contain the Al which is easy to corrode.

As the functional substrate 3, it is preferable that the substrate is superior in humidity resistance, and it is more preferable that the substrate is GaP or SiC having a good heat-conduction.

In addition, it is preferable that the functional substrate 3 be made to have a thickness of, for example, about 50 µm or more in order to support the light-emitting section 7 with a mechanically sufficient strength. Further, in order to facilitate mechanical working of the compound semiconductor layer 2 after the functional substrate 3 is bonded to the compound semiconductor layer 2, it is preferable to set the thickness of the functional substrate 3 not to exceed 300 µm. That is, it is most preferable that the functional substrate 3 be constituted by a GaP substrate having a thickness of not less than about 50 µm and not more than about 300 µm.

In addition, as shown in FIG. 4, the side face of the functional substrate 3 includes a perpendicular plane 3a which is close to the compound semiconductor 2, wherein the perpendicular plane is perpendicular to the main light-extraction surface; and an inclined plane 3b which is far to the compound semiconductor 2, wherein the inclined plane is inclined inside to the main light-extraction surface. As a result, the light emitted from the active layer 11 to the side of the functional substrate 3 can be extracted outside efficiently. In addition, among the light emitted from the active layer 11 to the side of the functional substrate 3, the light, which is reflected back in perpendicular plane 3a, can be extracted from the inclined plane 3b, and the light, which is reflected back in inclined plane 3b, can be extracted from the perpendicular plane 3a. As a result, extraction efficiency of light can be raised because of a synergistic effect of perpendicular plane 3a and inclined plane 3b.

In addition, in the present embodiment, it is preferable that angle α between the inclined plane 3b and the plane parallel to light-emitting surface is in the range of 55 to 80 degrees. In such range, the light reflected back by the functional substrate 3 can be extracted efficiently outside.

In addition, it is preferable that the thickness of (thickness direction) of perpendicular plane 3a is in a range of 30 to 100 µm. When the thickness of (thickness direction) of perpendicular plane 3a is in a range, the light reflected back by the functional substrate 3 can be returned to light-emitting surface efficiently, and further be extracted from the main light-extraction surface. As a result, the light-emitting efficiency of light-emitting diode 1 can be improved.

In addition, it is preferable for the inclined plane 3b of the functional substrate 3 to be rough-processed. Since the inclined plane 3b is rough-processed, the light extraction efficiency can be raised. In other words, a total reflection by the inclined plane 3b is restrained by making inclined plane 3b rough, and light extraction efficiency can be improved.

There may be a high resistive layer in the bonding interface between the compound semiconductor layer 2 and the functional substrate 3. In other words, a high resistive layer (not shown in drawings) may be installed between compound semiconductor layer 2 and functional substrate 3. When the high resistive layer has a higher resistance value than the functional substrate 3 and the high resistive layer is installed, it has function to reduce current of opposite direction from the current diffusion layer 8 of the compound semiconductor layer 2 to the functional substrate 3. In addition, the bonding structure shows a voltage resistance to the voltage of the opposite direction that is applied from the functional substrate 3 to the current diffusion layer 8 carelessly. However, the breakdown voltage is preferably set to a lower value than the voltage of opposite direction of light-emitting section 7 of p, n junction type.

The n-type ohmic electrode 4 and the p-type ohmic electrode 5 are low-resistance ohmic contact electrodes provided on the main light extraction surface of the light-emitting diode 1. Here, the n-type ohmic electrode 4 is provided above the upper clad layer 13 and, for example, AuGe, or an alloy composed of Ni allow/Au can be used. On the other hand, the p-type ohmic electrode 5 is provided on the exposed upper surface 8a of the current diffusion layer 8, as shown in FIG. 4, and an alloy composed of AuBe/Au or AuZn/Au can be used.

Here, in the light-emitting diode 1 of this embodiment, it is preferable to form the p-type ohmic electrode 5 as the second electrode on the current diffusion layer 8. By such a configuration, the effect of lowering the operating voltage can be obtained. Further, by forming the p-type ohmic electrode 5 on the current diffusion layer 8 made of p-type GaP, excellent ohmic contact can be obtained, so that it is possible to lower the operating voltage.

In addition, in this embodiment, it is preferable that the polarity of the first electrode is n type, and the polarity of the second electrode is p type. High brightness of light-emitting diode 1 can be achieved when such a constitution is used. On the other hand, when the first electrode is p type, current diffusion becomes worse, and brightness become lower. In contrast, current diffusion is improved when the first electrode is n type, and high brightness of light-emitting diode 1 can be achieved.

In the light-emitting diode 1 of this embodiment, it is preferable to dispose the n-type ohmic electrode 4 and the p-type ohmic electrode 5 so as to be at diagonal positions, as shown in FIG. 3. Further, it is most preferable to take a configuration in which the p-type ohmic electrode 5 is surrounded by the compound semiconductor layer 2. By such a configuration, the effect of lowering the operating voltage can be obtained. Further, the p-type ohmic electrode 5 is surrounded on all four sides by the n-type ohmic electrodes 4, whereby it becomes easy for an electric current to flow in all directions, and as a result, the operating voltage is lowered.

Further, in the light-emitting diode 1 of this embodiment, it is preferable to form the n-type ohmic electrode 4 into the form of a reticulation such as a honeycomb or a grating shape, as shown in FIG. 3. By such a configuration, the effect of reducing $V_F$ or the effect of improving reliability can be obtained. Further, by forming it into the form of a grid, it is possible to uniformly inject an electric current into the active layer 11, and as a result, the effect of improving reliability can be obtained. In addition, in the light-emitting diode 1 of this embodiment, it is preferable to constitute the n-type ohmic electrode 4 by a pad-shaped electrode (a pad electrode) and an electrode of a linear shape (a linear electrode) having a width of 10 μm or less. By such a configuration, higher brightness can be attained. Further, by narrowing the width of the linear electrode, it is possible to increase an opening area of the main light extraction surface, so that it is possible to achieve higher brightness.

Method of Manufacturing Light-Emitting Diode

Next, a method of manufacturing the light-emitting diode 1 of this embodiment will be described. FIG. 6 is a cross-sectional view of an epitaxial wafer which is used in the light-emitting diode 1 of this embodiment. Further, FIG. 7 is a cross-sectional schematic view of a bonded wafer which is used in the light-emitting diode 1 of this embodiment.

Process of Forming Compound Semiconductor Layer

First, as shown in FIG. 6, the compound semiconductor layer 2 is made. The compound semiconductor layer 2 is made by sequentially laminating a buffer layer 15 made of GaAs, an etching stopper layer (not shown) provided in order to be used for selective etching, a contact layer 16 made of Si-doped n-type GaInP, the n-type upper clad layer 13, the upper guide layer 12, the active layer 11, the lower guide layer 10, the p-type lower clad layer 9, and the current diffusion layer 8 made of Mg-doped p-type GaP, on a GaAs substrate 14.

As the GaAs substrate 14, a commercially available single-crystal substrate manufactured by a known manufacturing method can be used. It is preferable that the epitaxially grown surface of the GaAs substrate 14 be smooth. With respect to the plane orientation of the surface of the GaAs substrate 14, a substrate in which epitaxial growth is easy and which is mass-produced and has a (100) plane and a plane deviated within ±20° from (100) is preferable in terms of stability of quality. Further, it is more preferable that a range of the plane orientation of the GaAs substrate 14 be 15°±5° deviated in a (0-1-1) direction from a (100) direction.

It is preferable that the dislocation density of the GaAs substrate 14 be low in order to improve the crystallinity of the compound semiconductor layer 2. Specifically, for example, 10000 pieces $cm^{-2}$ or less, preferably, 1000 pieces $cm^{-2}$ or less is preferable.

The GaAs substrate 14 may also be any of an n-type and a p-type. The carrier concentration of the GaAs substrate 14 can be appropriately selected in terms of a desired electric conductivity and an element structure. For example, in a case where the GaAs substrate 14 is a silicon-doped p-type, it is preferable that the carrier concentration be in a range of $1\times10^{17}$ $cm^{-3}$ to $5\times10^{18}$ $cm^{-3}$. In contrast, in a case where the GaAs substrate 14 is a zinc-doped p-type, it is preferable that the carrier concentration be in a range of $2\times10^{18}$ $cm^{-3}$ to $5\times10^{19}$ $cm^{-3}$.

Thickness of GaAs substrate 14 may be in an appropriate range according to size of substrate. It may be broken during a manufacturing process of compound semiconductor layer 2, if the thickness of GaAs substrate 14 is thinner than that in an appropriate range. On the other hand, material costs rise if thickness of GaAs substrate 14 is thicker that that in the appropriate range. Therefore, when substrate size of GaAs substrate 14 is large, for example, in the case of the diameter of 75 mm, thickness of 250-500 μm is preferable to preclude crack in handling. In the case of a diameter of 50 mm, thickness of 200-400 μm is preferable, and thickness of 350-600 μm is preferable in the case of a diameter of 100 mm.

Since the thickness of substrate is increased depending on substrate size of GaAs substrate 14, warping of compound semiconductor layer 2 due to light-emitting section 7 can be reduced. As a result, distribution of temperature in epitaxial growth becomes homogeneous, and then in-plane wavelength distribution of active layer 11 can be lowered. In addition, the shape of the GaAs substrate 14 may be rectangle, without limitation to circle in particular.

The buffer layer 15 is provided in order to reduce lattice mismatch between the GaAs substrate 14 and the constitution layer of the light-emitting section 7. Therefore, if the quality of a substrate or an epitaxial growth condition is selected, the buffer layer 15 is not necessarily required. Further, it is preferable that a material of the buffer layer 15 be the same material as that of the substrate which is subjected to epitaxial growth. Therefore, in this embodiment, as the buffer layer 15, it is preferable to use GaAs like the GaAs substrate 14. Further, as the buffer layer 15, in order to reduce the propagation of a defect, a multilayer film made of a material different from the GaAs substrate 14 can also be used. It is preferable that the thickness of the buffer layer 15 be 0.1 μm or more and it is more preferable that it be 0.2 μm or more.

The contact layer 16 is provided in order to lower contact resistance with an electrode. It is preferable that a material of the contact layer 16 be a material which has a larger bond gap than that of the active layer 11, and $Al_XGa_{1-X}As$, $(Al_XGa_{1-X})_YIn_{1-Y}P$ ($0\leq X\leq 1$, $0<Y\leq 1$) is preferable. Further, it is preferable that the lower limit of the carrier concentration of the contact layer 16 be $5\times10^{17}$ $cm^{-3}$ or more in order to lower contact resistance with an electrode, and $1\times10^{18}$ $cm^{-3}$ or more is more preferable. It is preferable that the upper limit of the carrier concentration be $2\times10^{19}$ $cm^{-3}$ or less where the lowering of crystallinity easily occurs. With respect to the thickness of the contact layer 16, 0.5 μm or more is preferable and 1 μm or more is preferred. The upper limitation of the thickness is not limited particularly, and 5 μm or less is preferable when cost of epitaxial growing process is taken into consideration.

In this embodiment, it is possible to apply a known growth method such as a molecular beam epitaxial method (MBE) or a low-pressure metal-organic chemical vapor deposition method (an MOCVD method). In particular, it is preferable to apply the MOCVD method having excellent mass-productivity. Specifically, in the GaAs substrate 14 which is used for the epitaxial growth of the compound semiconductor layer 2, it is preferable to remove contamination of the surface or a natural oxide film by carrying out a pretreatment such as a cleaning process or a thermal treatment before the growth. Each layer which is included in the above compounds semiconductor layer 2 is formed by setting the GaAs substrate 14 of a diameter of 50-150 mm in MOCVD apparatus, and then making them grow up epitaxially. In addition, as a MOCVD apparatus, commercial large-scale apparatus such as a planetary or a high-speed rotary type can be used.

When each layer of the compound semiconductor layer 2 is epitaxially grown, as a raw material of a group III constituent element, for example, trimethylaluminum ($(CH_3)_3Al$), trimethylgallium ($(CH_3)_3Ga$), and trimethylindium ($(CH_3)_3In$) can be used. Further, as a doping material of Mg, for example, bis-cyclopentadienyl magnesium (bis-$(C_5H_5)_2Mg$) or the like can be used. Further, as a doping material of Si, for example, disilane ($Si_2H_6$) or the like can be used. Further, as a raw material of a group V constituent element, phosphine ($PH_3$), arsine ($AsH_3$), or the like can be used. Further, as the growth temperature of each layer, in the case of using p-type GaP as the current diffusion layer 8, a temperature in a range of 720° C. to 770° C. can be applied, and in each of the other layers, a temperature in a range of 600° C. to 700° C. can be applied. Further, the carrier concentration and the layer thickness of each layer and a temperature condition can be appropriately selected.

In the compound semiconductor layer 2 made in this way, an excellent surface state in which crystal defects are few can be obtained. Further, the compound semiconductor layer 2 may also be subjected to a surface treatment such as polishing considering an element structure.

Process of Bonding Functional Substrate

Next, the compound semiconductor layer 2 and the functional substrate 3 are bonded to each other. In the bonding of the compound semiconductor layer 2 and the functional substrate 3, first, mirror finishing is carried out by polishing the surface of the current diffusion layer 8 constituting the compound semiconductor layer 2. Next, the functional substrate 3 which is attached to the mirror-polished surface of the current diffusion layer 8 is prepared. In addition, the surface of the functional substrate 3 is polished into a mirror surface before it is bonded to the current diffusion layer 8. Next, the compound semiconductor layer 2 and the functional substrate 3 are loaded into a general semiconductor material attachment apparatus, and the mirror-polished surfaces of the two are irradiated with an Ar beam neutralized by collision of electrons in a vacuum. Thereafter, bonding can be performed at room temperature by overlapping the surfaces of the two over each other and then applying a load thereto in the attachment apparatus in which the vacuum is maintained (refer to FIG. 7). As the bonding, it is preferable that the materials of the bonding interface is the same material from the view point of a stable bonding condition Normal temperature bonding under such a vacuum is the most preferable for bonding (pasting), however, eutectic metal or adhesion may be used.

Process of Forming the First and the Second Electrodes

Next, the n-type ohmic electrode 4 of the first electrode and the p-type ohmic electrode 5 of the second electrode are formed. In the formation of the n-type ohmic electrode 4 and the p-type ohmic electrode 5, first, the GaAs substrate 14 and the GaAs buffer layer 15 are selectively removed from the compound semiconductor layer 2 bonded to the functional substrate 3, by an ammonia-based etchant. Next, the n-type ohmic electrode 4 is formed on the exposed surface of the contact layer 16. Specifically, after AuGe and Ni alloy/Au are laminated so as to become an arbitrary thickness by a vacuum deposition method, the shape of the n-type ohmic electrode 4 is formed by performing patterning with the use of, for example, general photolithographic methods.

Next, the current diffusion layer 8 is exposed by selectively removing the contact layer 16, the upper clad layer 13, the upper guide layer 12, the active layer 11, the lower guide layer 10, and the lower clad layer 9, and the p-type ohmic electrode 5 is then formed on the exposed surface (the upper surface 8a). Specifically, after Au/Be/Au are laminated so as to become an arbitrary thickness by a vacuum deposition method, the shape of the p-type ohmic electrode 5 is formed by performing patterning with the use of, for example, general photolithographic means. Thereafter, by performing alloying by performing a thermal treatment in conditions of, for example, 400° C. to 500° C. and 5 minutes to 20 minutes, it is possible to form the low-resistance n-type and p-type ohmic electrodes 4 and 5.

Processing Functional Substrate

Next, the shape of functional substrate 3 is processed. The functional substrate 3 is processed by firstly performing a V-shaped groove on the surface on which the third electrode 6 is not formed. And an inclined plane 3b is formed, which has an angle α between the inside surface of V-shaped groove in the side of the third electrode 6 and the plane parallel to light-emitting surface. Secondly, Dice cutting is performed in predetermined distance from the side of compound semiconductor layer 2, and chips are formed. In addition, the perpendicular plane 3a of the functional substrate 3 is formed by dice cutting during the formation of chips.

As a method of forming the inclined plane 3b, it is not limited in particular, a method of combination of conventional methods such as wet etching, dry etching, scribing method, laser machining, can be used. However, it is the most preferable to use a dice cutting method having high controllability of shape and high productivity. Manufacturing yield can be improved by using the dice cutting method.

As a method of forming the perpendicular plane 3a, it is not limited in particular, however, it is preferable that a scribe-breaking method, a laser machining method or a dice cutting method can be used. However, when a laser machining method or a dice cutting method is used, manufacturing cost can be lowered. In other words, manufacturing cost can be lowered in mass-producing light-emitting diodes because that there is no necessity for designing cutting margin in the case of chip isolation. On the other hand, the dice cutting method is superior in cutting stability.

Finally, a crush layer and fouling are etched with a mixed solution of sulfuric acid and hydrogen peroxide if necessary. In this way the light-emitting diode 1 is produced.

Method of Manufacturing Light-Emitting Diode Lamp

Next, a method of manufacturing the light-emitting diode lamp 41 using the light-emitting diode 1, that is, a method of mounting the light-emitting diode 1 will be described.

As shown in FIGS. 1 and 2, a given quantity of light-emitting diodes 1 are mounted on the surface of the mount substrate 42. In the mounting of the light-emitting diode 1, first, alignment of the mount substrate 42 and the light-emitting diode 1 is performed, thereby disposing the light-emitting diode 1 at a given position on the surface of the mount substrate 42. Next, the light-emitting diode 1 is die-bonded to the surface of the mount substrate 42 by Ag paste. Next, the n-type ohmic electrode 4 of the light-emitting diode 1 and the n-electrode terminal 43 of the mount substrate 42 are connected to each other by using the gold wire 45 (wire bonding). Next, the p-type ohmic electrode 5 of the light-emitting diode 1 and the p-electrode terminal 44 of the mount substrate 42 are connected to each other by using the gold wire 46. Finally, the surface of the mount substrate 42 on which the light-emitting diode 1 is mounted is sealed by a general epoxy resin 47. In this way, the light-emitting diode lamp 41 using the light-emitting diode 1 is manufactured.

In addition, emission spectrum of light-emitting diode lamp 41, for example, having a peak light wavelength in a range of 720-760 nm, can be obtained by adjusting the composition of active layer 11. In addition, since dispersion of the well layer 17 and barrier layer 18 in active layer 11 are depressed by current diffusion layer 8a, half band width of emission spectrum becomes falling in the range of 10-40 nm.

As discussed above, according to the present embodiment, light-emitting diode 1 includes a compound semiconductor layer 2 including light-emitting section 7 having well layer 17 made from composition formula $(Al_{X1}Ga_{1-X1})As$ $(0.20 \leq X \leq 0.36)$.

In addition, on the light-emitting section 7, a current diffusion layer 8 is installed in the light-emitting diode 1 of the present embodiment. Since the current diffusion layer 8 is transparent for the emitting light wavelength, it does not absorb the emission of light from light-emitting section 7. As a result, the light-emitting diode 1 having high output and high efficiency can be obtained. The functional substrate, as a stable material, has superior humidity resistance without worrying about corrosion.

Thus, according to light-emitting diode 1 of the present embodiment, the light-emitting diode 1 having an emitting light wavelength of 660 nm to 720 nm, superior monochromatism, high output and high efficiency, and humidity resistance can be provided. In addition, according to the light-emitting diode 1 of the present embodiment, the light-emitting diode 1 having high output with efficiency more than about 1.5 times than the light-emitting diode of transparent substrate AlGaAs type, which was produced by conventional liquid phase epitaxial growth method, can be provided. In addition, reliability under high temperature and high humidity is improved, too.

In addition, according to the present embodiment, the light-emitting diode lamp 41 includes light-emitting diode 1 having the emitting light wavelength of 660 nm to 720 nm, superior monochromatism, high output and high efficiency, and humidity resistance. Therefore, the light-emitting diode lamp 41 which is preferable for illumination for plant upbringing can be provided.

Light-Emitting Diode(7th Embodiment)

The light-emitting diode of the 7th embodiment, which the invention is applied, includes: a light-emitting section 7, which comprises an active layer 11, having a quantum well structure and formed by laminating alternately a well layer 17 which comprises a composition expressed by the composition formula of $(Al_{X1} Ga_{1-X1})As$ ($0.20 \leq X1 \leq 0.36$) and a barrier layer 18 which comprises a composition expressed by the composition formula of $(Al_{X4} Ga_{1-X4})_{Y2} In_{1-Y2} P$ ($0 \leq X4 \leq 1$, $0 < Y2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section 7; and a functional substrate 3 bonded to the current diffusion layer 8, wherein the thickness of well layer 17 is 3 to 30 nm and emitting wavelength is 660 nm to 720 nm.

The difference between the light-emitting diode of the 7th embodiment and that of the 6th embodiment is that the barrier layer 18 of the second embodiment comprises a composition expressed by the composition formula of $(Al_{X4} Ga_{1-X4})_{Y2} In_{1-Y2} P$ ($0 \leq X4 \leq 1$, $0 < Y2 \leq 1$).

Since it is preferable that barrier layer 18 has a composition having larger bang gap than that of the well layer 17, and from the viewpoint of crystallinity, it is preferable that Al concentration is low. Therefore, it is preferable that the range of X3 is 0.3-0.7 and the range of Y2 is 0.4-0.6. The most preferable composition X2, Y2 is decided by the composition of the well layer.

Light-Emitting Diode(8th Embodiment)

FIGS. 8A and 8B are diagrams for describing the light-emitting diode related to the 8th embodiment to which the invention is applied, wherein FIG. 8A is a plan view and FIG. 8B is a cross-sectional view along line C-C' shown in FIG. 8A.

The light-emitting diode of the 8th embodiment includes: a light-emitting section, which includes an active layer 11, having a quantum well structure and formed by laminating alternately a well layer 17 which comprises a composition expressed by the composition formula of $(Al_{X1} Ga_{1-X1})As$ ($0.20 \leq X1 \leq 0.36$) and a barrier layer 18 which comprises a composition expressed by the composition formula of $(Al_{X2} Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section; and a functional substrate 31 which includes a reflection layer 23 having reflection index of 90% or more at the emitting wavelength, the functional substrate 31 is bonded to the current diffusion layer 8, wherein the thickness of well layer 17 is 3 to 30 nm and emitting wavelength is 660 nm to 720 nm.

Since the light-emitting diode of the 8th embodiment includes the functional substrate 31 having the reflection layer 23 having reflection index of 90% or more at the emitting wavelength, emitting light can be extracted from the main light extraction surface effectively.

As example shown in FIGS. 8A and 8B, the functional substrate 31 includes a reflection structure including a second electrode 21 on lower surface 8b of the current diffusion layer 8, a transparent conducting layer 22 and a reflection layer 23 which are laminated to cover the second electrode 21; and a layer (substrate) 30 including silicon or germanium.

In the light-emitting diode of the 8th embodiment, as functional substrate 31, silicon or germanium is preferable. Since the materials are hard to corrode, humidity resistance can be improved.

As the reflection layer 23, for example, silver (Ag), aluminium (Al), gold (Au) or alloy thereof may be used. Since these materials have high reflectance, the reflectance of the reflection layer 23 can be 90% or more.

The functional substrate 31 may include a combination of bonding reflection layer 23 with a cheap substrate (layer) such as silicon or germanium by using eutectic metal such as AuIn, AuGe, or AuSn. Since AuIn has low bonding temperature, and small difference in thermal expansion coefficient from the light-emitting section in particular, it is the most preferable combination to bond the cheapest silicon substrate (a silicon layer) with AuIn.

For example, as functional substrate 31, it is more preferable from the viewpoint of stability of quality to insert a layer made from a metal having a high melting point such as titanium (Ti), tungsten (W) or platinum (Pt) so that current diffusion layer, reflection layer metal and eutectic metal do not diffuse mutually.

Light-Emitting Diode(9th Embodiment)

FIG. 9 is diagram for describing the light-emitting diode related to the 9th embodiment to which the invention is applied.

The light-emitting diode of the 9th embodiment includes: a light-emitting section, which includes an active layer 11, having a quantum well structure and formed by laminating alternately a well layer 17 which comprises a composition expressed by the composition formula of $(Al_{X1} Ga_{1-X1})As$ ($0.20 \leq X1 \leq 0.36$) and a barrier layer 18 which comprises a composition expressed by the composition formula of $(Al_{X2} Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section; and a functional substrate 51 which includes a reflection layer 53 having reflection index of 90% or more at the emitting wavelength and a metal substrate 50, the functional substrate 51 is bonded to the current diffusion layer 8, wherein the thickness of well layer 17 is 3 to 30 nm and emitting wavelength is 660 nm to 720 nm.

As light-emitting diode of the 9th embodiment, the point that the functional substrate includes metal substrate is different from that of the light-emitting diode of the 8th embodiment.

Since the metal substrate has a high heat dissipation characteristic, using the metal substrate in the light-emitting diode not only can contribute to emit light in high brightness, but also can increase the lifetime of the light-emitting diode.

From the viewpoint of heat dissipation characteristics, it is preferable to use a metal substrate made from a metal having a coefficient of thermal conductivity of 130 W/m·K or more. For example, the metal having the coefficient of thermal conductivity of 130 W/m·K or more is molybdenum (138 W/m·K) and tungsten (174 W/m·K).

As shown in FIG. 9, the compound semiconductor layer 2 includes an active layer 11, a first clad layer (lower part clad) 9 and a second clad layer (upper part clad) 13 between both of which the active layer 11 is inserted through a guide layer (not shown), a current diffusion layer 8 below the first clad layer (lower part clad) 9, a first electrode 55 above the second clad layer (upper part clad) 13, and a contact layer 56 having about the same size in planar view.

A functional substrate 51 includes a second electrode 57 on lower surface 8b of the current diffusion layer 8, a reflection structure obtained by laminating a transparent conducting layer 52 and reflection layer 53 in order to cover the second electrode 57, and a metal substrate 50. The surface 53b of the reflection layer 53 opposite to the semiconductor compound layer is bonded to the bonding surface 50a of the metal substrate 50.

As the reflection layer 53, for example, a metal such as copper, silver, gold, aluminium or alloy thereof may be used. Since these materials have high reflectance, the reflectance of the reflection layer 53 can be 90% or more. Since reflection layer 53 is formed, light emitted from the active layer 11 is reflected in front direction f by the reflection layer 53, and the light extraction efficiency in front direction f can be improved. As a result, a light-emitting diode having higher intensity can be produced.

As the reflection layer 53, multilayer including Ag, a Ni/Ti barrier layer, and Au-typed eutectic metal (bonding metal) in the above order from the side of transparent conducting layer 52 is preferable.

The bonding metal is a metal having low electric resistance and low melting point. The metal substrate can be bonded without giving the compound semiconductor layer 2 heat stress by using the metal for bonding.

As the bonding metal, Au-typed eutectic metal having a low melting point and having chemical stability may be used. As Au-typed eutectic metal, for example, an eutectic composition (As Au-typed eutectic metal) of alloy such as AuSn, AuGe, AuSi can be used.

In addition, it is preferable to add a metal such as titanium, chromium, tungsten in the bonding metal. As a result, the metal such as titanium, chromium, tungsten can prevent, as barrier metal, impurity in the metal substrate from diffusing into the reflection layer 53 and depressing the reaction.

Transparent conducting layer 52 includes ITO layer and IZO layer. A reflection structure may include the reflection layer 53 only.

In addition, as a substitution for transparent conducting layer 52, or combination with transparent conducting layer 52, a so-called cold mirror which utilizes refractive index difference of transparent materials may be put together to reflection layer 53. For example, a multilayer film of oxidation titanium film or silicon oxide, white alumina and AlN may be used.

As the metal substrate 50, a plural metal layers may be used.

It is preferable that two kinds of metal layers are laminated alternately to form metal substrate.

Particularly, it is preferable that the layer number of these two kinds of metal layers is an odd number.

In this case, from the viewpoint of warping and cracking of the metal substrate, when a second metal layer 50B uses a material having smaller coefficient of thermal expansion than that of compound semiconductor layer 2, it is preferable that a first metal layer 50A uses a material having larger coefficient of thermal expansion than that of compound semiconductor layer 2. Since the coefficient of thermal expansion of the whole metal substrate is similar to coefficient of thermal expansion of the compound semiconductor layer, warping and cracking of the metal substrate when bonding the compound semiconductor layer can be repressed. As a result, manufacturing yield of the light-emitting diode can be improved. When second a second metal layer 50B uses a material having larger coefficient of thermal expansion than that of compound semiconductor layer 2, it is preferable that a first metal layer 50A uses a material having smaller coefficient of thermal expansion than that of compound semiconductor layer 2. Since the coefficient of thermal expansion of the whole metal substrate is similar to coefficient of thermal expansion of the compound semiconductor layer, warping and cracking of the metal substrate when bonding the compound semiconductor layer can be repressed. As a result, manufacturing yield of the light-emitting diode can be improved.

From the viewpoint of above, two kinds of metal layers may be used as either the first metal layer or the second metal layer.

As two kinds of metal layers, for example, a combination between a metal layer made from silver (coefficient of thermal expansion=18.9 ppm/K), copper (coefficient of thermal expansion=16.5 ppm/K) gold (coefficient of thermal expansion=14.2 ppm/K) aluminium (coefficient of thermal expansion=23.1 ppm/K), nickel (coefficient of thermal expansion=13.4 ppm/K) and alloy thereof; and a metal layer made from molybdenum (coefficient of thermal expansion=5.1 ppm/K), tungsten (coefficient of thermal expansion=4.3 ppm/K), chromium (coefficient of thermal expansion=4.9 ppm/K) and alloy thereof can be used.

A metal substrate having three layers of Cu/Mo/Cu is preferable. From the above view point, a similar effect is provided with the metal substrate having three layers of Mo/Cu/Mo. However, since the metal substrate having three layers of Cu/Mo/Cu has a structure in which Mo having strong mechanical strength is surround by Cu which is easy to process, it is easier to be processed than that of the metal substrate having three layers of Mo/Cu/Mo.

As the coefficient of thermal expansion of the whole metal substrate, for example, metal substrate having three layers of Cu (30 μm)/Mo (25 μm)/Cu (30 μm) is 6.1 ppm/K, and the metal substrate having three layers of Mo (25 μm)/Cu (70 μm)/Mo (25 μm) is 5.7 ppm/K, In addition, from the viewpoint of heat dissipation, it is preferable that a metal layer of the metal substrate is made from materials having high heat-conductivity. As a result, since heat dissipation ability of metal substrate is improved, not only the light-emitting diode can emit light in high brightness, but also the light-emitting diode having a long lifetime can be obtained.

For example, it is preferable that silver (heat-conductivity=420 W/m·K), copper (heat-conductivity=398 W/m·K), gold (heat-conductivity=320 W/m·K), aluminium (heat-conductivity=236 W/m·K), molybdenum (heat-conductivity=138 W/m·K), or tungsten (heat-conductivity=174 W/m·K), and an alloy thereof can be used.

It is more preferable that the coefficient of thermal expansion of the materials of the metal layers is approximately equal to the coefficient of thermal expansion of the compound semiconductor layer. It is particularly preferable that the material of the metal layer has the coefficient of thermal expansion which is within ±1.5 ppm/K of the coefficient of thermal expansion of the compound semiconductor layer. Since the stress, which is generated by heat when metal substrate is bonded with the compound semiconductor layer, to light-emitting section can be lowered, crack of metal substrate, which is generated by heat when bonding the compound semiconductor layer, can be repressed. As a result, manufacturing yield of the light-emitting diode can be improved.

As a heat-conductivity of the whole metal substrate, for example, the heat-conductivity of metal substrate having three layers of Cu (30 μm)/Mo (25 μm)/Cu (30 μm) is 250 W/m·K and the heat-conductivity of metal substrate having three layers of Mo (25 μm)/Cu (70 μm)/Mo (25 μm) is 220 W/m·K.

Light-Emitting Diode(10th Embodiment)

The light-emitting diode of the 10th embodiment includes: a light-emitting section, which includes an active layer 11, having a quantum well structure and formed by laminating alternately a well layer 17 which comprises a composition expressed by the composition formula of $(Al_{X1} Ga_{1-X1})As$ ($0.20 \leq X1 \leq 0.36$) and a barrier layer 18 which comprises a composition expressed by the composition formula of $(Al_{X4} Ga_{1-X4})_{Y2} In_{1-Y2} P$ ($0 \leq X4 \leq 1$, $0 < Y2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section; and a functional substrate 31 which includes a reflection layer 23 having reflection index of 90% or more at the emitting wavelength, the functional substrate 31 is bonded to the current diffusion layer 8, wherein the thickness of well layer 17 is 3 to 30 nm and emitting wavelength is 660 nm to 720 nm.

As the functional substrate of the present embodiment, the example of functional substrates illustrated in the 8th embodiment and 9th embodiment can be used.

Light-Emitting Diode(11th Embodiment)

FIGS. 3 and 4 are diagrams for describing the light-emitting diode related to the 11th embodiment to which the invention is applied, wherein FIG. 3 is a plan view and FIG. 4 is a cross-sectional view along line B-B' shown in FIG. 3. In addition, FIG. 5 is a cross-section of a multilayer.

The light-emitting diode of the 11th embodiment includes: a light-emitting section 7, which comprises an active layer 11, having a quantum well structure and formed by laminating alternately a well layer 17 which comprises a composition expressed by the composition formula of $(Al_{X1} Ga_{1-X1})As$ ($0 \leq X1 \leq 0.20$) and a barrier layer 18 which comprises a composition expressed by the composition formula of $(Al_{X2} Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section 7; and a functional substrate 3 bonded to the current diffusion layer 8, wherein the thickness of well layer 17 is 3 to 30 nm and emitting wavelength is 760 nm to 850 nm.

The main light extraction surface in the present embodiment is the surface that is the opposite side of the bonding surface of the compound semiconductor layer with the functional substrate 3.

The compound semiconductor layer (also called an epitaxial growth layer) 2 has a structure in which a p, n-junction type light-emitting section 7, and a current diffusion layer 8 are sequentially stacked, as shown in FIG. 4. A known functional layer can be added to the structure of the compound semiconductor layer 2 on a timely basis. For example, it is possible to provide a known layer structure such as a contact layer for reducing contact resistance of the ohmic electrodes, current diffusion layer to make general of light-emitting section scatter element driving current planarly, or a current blocking layer or current constriction layer for restricting an area through which an element driving current flows. In addition, it is preferable that the compound semiconductor layer 2 be a layer formed by epitaxial growth on a GaAs substrate.

The light-emitting section 7 has a configuration in which at least a p-type lower clad layer 9, lower guide layer (not shown), a light-emitting layer (active layer) 10, upper guide layer (not shown) and an n-type upper clad layer 13 are sequentially laminated on the current diffusion layer 8, as shown in FIG. 4. That is, in order to obtain high-intensity luminescence, it is preferable that the light-emitting section 7 be made to be a so-called double hetero (DH) structure which includes the lower clad layer 9 and the upper clad layer 13 disposed to confront each other on the lower side and the upper side of the active layer 11 in order to "confine" a carrier leading to radiation recombination, and luminescence in the active layer 11.

It is preferable for the active layer 11 to include a well structure to control emitting light wavelength of the light-emitting diode (LED) as shown in FIG. 5. In other words, the active layer 11 includes a multi-layer structure (multilayer) having well layers and barrier layers, and has barrier layers 18 at both ends of the multi-layer structure.

It is preferable that the layer thickness of the active layer 11 be in a range of 0.02 μm to 2 μm. Further, a conduction type of the active layer 11 is not particularly limited and any of an un-doped type, a p type, and an n type can be selected. In order to increase light-emitting efficiency, it is preferable to make the active layer 11 be the un-doped type having excellent crystallinity or have a carrier concentration of less than $3 \times 10^{17}$ cm$^{-3}$.

Table 7 shows correlation between Al composition X1 and emission peak wavelength, when the thickness of the well layer 17 is 17 nm. It is understood that emission peak wavelength becomes longer while Al composition X1 becomes lower. In addition, Al composition, corresponding to the peak wavelength which is not listed in Table 7, can be estimated

TABLE 7

| Peak Wavelength (nm) | Al composition (X) |
|---|---|
| 720 | 0.20 |
| 730 | 0.18 |
| 760 | 0.13 |
| 800 | 0.07 |
| 830 | 0.03 |
| 850 | 0.00 |

As the thickness of the well layer 17, a range of 3-30 nm is preferred. More preferably, it is in the range of 5-20 nm.

Table 8 shows a correlation between the thickness of the well layer 17 and emission peak wavelength when Al composition of the well layer 17 X1=0.03. It is understood that emission peak wavelength becomes shorter while the well layer 17 becomes thinner because of quantum effect. When it is thick, emission peak wavelength is constant according to composition. In addition, thickness of layer corresponding to the emission peak wavelength which is not listed in Table 8 can be estimated.

TABLE 8

| Peak Wavelength (nm) | Thickness (nm) |
|---|---|
| 810 | 5 |
| 820 | 10 |
| 830 | 17 |
| 840 | 30 |

For example, in order to obtain a predetermined emission peak wavelength in the range of 760 to 850 nm, according to the correlation of emission peak wavelength, and Al composition X1 and thickness of the well layer 17, Al composition X1 and thickness of the well layer 17 can be decided.

The barrier layer 18 has composition expressed by the composition formula of $(Al_{X2} Ga_{1-X2})As$ $(0<X2\leq1)$. Since it is preferable that barrier layer 18 has a composition having larger bang gap than that of the well layer 17, and from the viewpoint of crystallinity, it is preferable that Al concentration is low. Therefore, it is preferable that the range of X2 is 0.1-0.4. The most preferable composition X2 is decided by the composition of the well layer.

It is preferable for thickness of barrier layer 18 to be thicker than thickness of well layer 17. As a result, light-emitting efficiency of well layer 17 can be improved.

In the multi-layer structure having well layers 17 and barrier layers 18, the pair number of alternately laminating a well layer 17 and barrier layer 18 is not limited particularly, but it is preferable to be 40 pairs or less and two pairs or more. In other words, it is preferable that the active layer 11 include 2-40 layers of the well layer 17. Since the active layer has a preferred light-emitting efficiency, it is preferable that there are more than two layers of well layers 17. On the other hand, since carrier density in the well layer 17 and barrier layer 18 is low, when too many pairs are used, forward direction voltage ($V_F$) increases. Because of this, it is preferable to use 40 pairs or less and more preferable to use 20 pairs or less.

The lower guide layer 10 and the upper guide layer 12 are respectively provided on the lower surface and the upper surface of the active layer 11, as shown in FIG. 4. Specifically, the lower guide layer 10 is provided on the lower surface of the active layer 11 and the upper guide layer 12 is provided on the upper surface of the active layer 11.

Lower guide layer 10 and upper part guide layer 12 has composition expressed by the composition formula of $(Al_XGa_{1-X})As$ $(0<X\leq1)$. Since it is preferable that it has a composition having larger bang gap than that of barrier layer 18, it is preferable that Al concentration is low, the range of X is 0.2-0.6 preferably. From the viewpoint of crystallinity, the most preferable composition X is decided by the composition of the well layer.

Table 9 shows compositions X of barrier layer 18 and guide layer which have the most larger output at emission peak wavelength when the thickness of the well layer 17 is 17 nm. Since it is preferable that barrier layer and guide layer have a composition having larger bang gap than that of the well layer, and from the viewpoint of crystallinity, the most preferable composition is decided by the composition of the well layer.

TABLE 9

| Peak Wavelength (nm) | Well (X) | Barrier (X) | Guide (X) |
|---|---|---|---|
| 730 | 0.18 | 0.30 | 0.4 |
| 760 | 0.13 | 0.30 | 0.4 |
| 800 | 0.07 | 0.20 | 0.3 |
| 830 | 0.03 | 0.20 | 0.3 |
| 850 | 0.00 | 0.20 | 0.3 |

The lower guide layer 10 and upper guide layer 12 are installed to reduce transfer of defects between the lower clad layer 9 and active layer 11, and between the upper clad layer 13 and active layer 11, respectively. In other words, since V group constituent elements of the lower clad layer 9 and upper part clad layer 13 of the present invention are phosphor (P) whereas V group constituent elements of the lower guide layer 10, upper part guide layer 12 and active layer 11 are arsenic (As), it is easy to produce defect in an interface surface. Transfer of defect to active layer 11 causes performance deterioration of light-emitting diode. Therefore, the thickness of the lower guide layer 10 and layer of upper guide layer 12 is preferably 10 nm or more, and more preferably 20 nm-100 nm.

Conduction types of the lower guide layer 10 and upper part guide layer 12 are not limited particularly, and any one of undoped type, p type and n-type can be used. It is preferable to use the undoped type having excellent crystallinity or use a carrier density less than $3\times10^{17}$ cm$^{-3}$ to raise light-emitting efficiency.

The lower clad layer 9 and the upper clad layer 13 are respectively provided on the lower surface and the upper surface of the active layer 11, as shown in FIG. 4. Specifically, the lower clad layer 9 is provided on the lower surface of the active layer 11 and the upper clad layer 13 is provided on the upper surface of the active layer 11.

As the material of the lower clad layer 9 and upper clad layer 13, a semiconductor material having a composition expressed by the composition formula of $(Al_{X3} Ga_{1-X3})_{Y1} In_{1-Y1} P$ $(0\leq X3\leq1, 0<Y1\leq1)$, and having a larger band gap than barrier layer 18 is preferable, and a material having a larger band gap than the upper guide layer 12 and lower guide layer 10 is more preferable. As the material, the composition having the formula $(Al_{X3} Ga_{1-X3})_{Y1} In_{1-Y1} P$ $(0\leq X3\leq1, 0<Y1\leq1)$ in which X3 is in the range of 0.3 to 0.7, or Y1 is in the range of 0.4 to 0.6.

The lower clad layer 9 and the upper clad layer 13 are constituted such that polarities are different from each other. Further, with respect to the carrier concentration and the thicknesses of the lower clad layer 9 and the upper clad layer 13, known preferred ranges can be used, and it is preferable to optimize conditions such that the light-emitting efficiency of the active layer 11 is increased. In addition, by control of the lower clad layer 9 and composition of the upper clad layer 13, it can reduce warping of the compound semiconductor layer 2.

Specifically, as the lower clad layer 9, it is preferable to use a semiconductor material made of, for example, Mg-doped p-type $(Al_{X3} Ga_{1-X3})_{Y1} In_{1-Y1} P$ $(0.3\leq X3\leq0.7, 0.4\leq Y1\leq0.6)$. Further, with respect to the carrier concentration, a range of $2\times10^{17}$ to $2\times10^{18}$ cm$^{-3}$ is preferable, and with respect to the layer thickness, a range of 0.1 μm to 1 μm is preferable.

On the other hand, as the upper clad layer 13, it is preferable to use a semiconductor material made of, for example, Si-doped n-type $(Al_{X3} Ga_{1-X3})_{Y1} In_{1-Y1} P$ $(0.3\leq X3\leq0.7, 0.4\leq Y1\leq0.6)$. Further, with respect to the carrier concentration, a range of $1\times10^{17}$ cm$^{-3}$ to $1\times10^{18}$ cm$^{-3}$ is preferable, and with respect to the layer thickness, a range of 0.1 μm to 1 μm is preferable. In addition, the polarities of the lower clad layer 9 and the upper clad layer 13 can be appropriately selected in consideration of an element structure of the compound semiconductor layer 2.

Further, a known layer structure such as a contact layer for reducing contact resistance of the ohmic electrodes, or a current blocking layer, current diffusion layer to make general of light-emitting section scatter element driving current planarly, or current constriction layer for restricting an area through which an element driving current flows, can be provided above the constitution layer of the light-emitting section 7.

Current diffusion layer 8 is installed at lower side of light-emitting section 7, as shown in FIG. 4. The current diffusion layer 8 is formed in order to relax the distortion that produced by active layer 11 when compound semiconductor layer 2 is formed epitaxially on GaAs substrate.

In addition, as the current diffusion layer 8, a transparent material at emitting wavelength of light-emitting section 7 (active layer 11) can be used, such as GaP. When GaP is used as the current diffusion layer 8, and functional substrate 3 also uses GaP substrate, it is easy to bond them and high bond strength can be obtained.

In addition, it is preferable that the thickness of current diffusion layer 8 is in the range of 0.5-20 μm. When less than 0.5 μm, current diffusion is insufficient. When more than 20 μm, the production cost increases since it is necessary to form crystal to such thickness.

The functional substrate 3 is bonded to the surface on the opposite side to the main light extraction surface of the compound semiconductor layer 2. That is, the functional substrate 3 is bonded to the current diffusion layer 8 side constituting the compound semiconductor layer 2, as shown in FIG. 4. The functional substrate 3 is made of a material which has sufficient strength to mechanically support the light-emitting section 7 and is capable of transmitting light which is emitted from the light-emitting section 7 and which is optically transparent to the emitting wavelength from the active layer 11. In addition, the construction material that is chemically stable and that was superior in humidity resistance is preferable. For example, it is the construction material that does not contain the Al which is easy to corrode.

As the functional substrate 3, it is preferable that the substrate is superior in humidity resistance, and it is more preferable that the substrate is GaP or SiC having a good heat-conduction. In addition, it is preferable that the substrate is sapphire having a strong mechanical strength. Particularly, GaP is the most preferable substrate material because that the thermal expansion coefficient is near to AlGaAs.

In addition, it is preferable that the functional substrate 3 be made to have a thickness of, for example, about 50 μm or more in order to support the light-emitting section 7 with a mechanically sufficient strength. Further, in order to facilitate mechanical working of the compound semiconductor layer 2 after the functional substrate 3 is bonded to the compound semiconductor layer 2, it is preferable to set the thickness of the functional substrate 3 not to exceed 300 μm. That is, it is most preferable that the functional substrate 3 be constituted by a GaP substrate having a thickness of not less than about 50 μm and not more than about 300 μm.

In addition, as shown in FIG. 4, the side face of the functional substrate 3 includes a perpendicular plane 3a which is close to the compound semiconductor 2, wherein the perpendicular plane is perpendicular to the main light-extraction surface; and an inclined plane 3b which is far to the compound semiconductor 2, wherein the inclined plane is inclined inside to the main light-extraction surface. As a result, the light emitted from the light-emitting layer 11 to the side of the functional substrate 3 can be extracted outside efficiently. In addition, among the light emitted from the light-emitting layer 11 to the side of the functional substrate 3, the light, which is reflected back in perpendicular plane 3a, can be extracted from the inclined plane 3b, and the light, which is reflected back in inclined plane 3b, can be extracted from the perpendicular plane 3a. As a result, extraction efficiency of light can be raised because of a synergistic effect of perpendicular plane 3a and inclined plane 3b.

In addition, in the present embodiment, it is preferable that angle α between the inclined plane 3b and the plane parallel to light-emitting surface is in the range of 55 to 80 degrees. In such range, the light reflected back by the functional substrate 3 can be extracted efficiently outside.

In addition, it is preferable that the thickness of (thickness direction) of perpendicular plane 3a is in a range of 30 to 100 μm. When the thickness of (thickness direction) of perpendicular plane 3a is in a range, the light reflected back by the functional substrate 3 can be returned to light-emitting surface efficiently, and further be extracted from the main light-extraction surface. As a result, the light-emitting efficiency of light-emitting diode 1 can be improved.

In addition, it is preferable for the inclined plane 3b of the functional substrate 3 to be rough-processed. Since the inclined plane 3b is rough-processed, the light extraction efficiency can be raised. In other words, a total reflection by the inclined plane 3b is restrained by making inclined plane 3b rough, and light extraction efficiency can be improved.

There may be a high resistive layer in the bonding interface between the compound semiconductor layer 2 and the functional substrate 3. In other words, a high resistive layer (not shown in drawings) may be installed between compound semiconductor layer 2 and functional substrate 3. When the high resistive layer has a higher resistance value than the functional substrate 3 and the high resistive layer is installed, it has function to reduce current of opposite direction from the current diffusion layer 8 of the compound semiconductor layer 2 to the functional substrate 3. In addition, the bonding structure shows a voltage resistance to the voltage of the opposite direction that is applied from the functional substrate 3 to the current diffusion layer 8 carelessly. However, the breakdown voltage is preferably set to a lower value than the voltage of opposite direction of light-emitting section 7 of p, n junction type.

In addition, the current paths can be installed by the connection with the third electrode 6 in backside of the chip, or with an Ag paste.

The n-type ohmic electrode 4 and the p-type ohmic electrode 5 are low-resistance ohmic contact electrodes provided on the main light extraction surface of the light-emitting diode 1. Here, the n-type ohmic electrode 4 is provided above the upper clad layer 13 and, for example, AuGe, or an alloy composed of Ni allow/Au can be used. On the other hand, the p-type ohmic electrode 5 is provided on the exposed upper surface 8a of the current diffusion layer 8, as shown in FIG. 4, and an alloy composed of AuBe/Au or AuZn/Au can be used.

Here, in the light-emitting diode 1 of this embodiment, it is preferable to form the p-type ohmic electrode 5 as the second electrode on the current diffusion layer 8. By such a configuration, the effect of lowering the operating voltage can be obtained. Further, by forming the p-type ohmic electrode 5 on the current diffusion layer 8 made of p-type GaP, excellent ohmic contact can be obtained, so that it is possible to lower the operating voltage.

In addition, in this embodiment, it is preferable that the polarity of the first electrode is n type, and the polarity of the second electrode is p type. High brightness of light-emitting diode 1 can be achieved when such a constitution is used. On the other hand, when the first electrode is p type, current diffusion becomes worse, and brightness become lower. In contrast, current diffusion is improved when the first electrode is n type, and high brightness of light-emitting diode 1 can be achieved.

In the light-emitting diode 1 of this embodiment, it is preferable to dispose the n-type ohmic electrode 4 and the p-type ohmic electrode 5 so as to be at diagonal positions, as shown in FIG. 3. Further, it is most preferable to take a configuration in which the p-type ohmic electrode 5 is surrounded by the compound semiconductor layer 2. By such a configuration, the effect of lowering the operating voltage can be obtained. Further, the p-type ohmic electrode 5 is surrounded on all four sides by the n-type ohmic electrodes 4, whereby it becomes easy for an electric current to flow in all directions, and as a result, the operating voltage is lowered.

Further, in the light-emitting diode 1 of this embodiment, it is preferable to form the n-type ohmic electrode 4 into the form of a reticulation such as a honeycomb or a grating shape, as shown in FIG. 3. By such a configuration, the effect of reducing $V_F$ or the effect of improving reliability can be obtained. Further, by forming it into the form of a grid, it is possible to uniformly inject an electric current into the active layer 11, and as a result, the effect of improving reliability can be obtained. In addition, in the light-emitting diode 1 of this embodiment, it is preferable to constitute the n-type ohmic electrode 4 by a pad-shaped electrode (a pad electrode) and an electrode of a linear shape (a linear electrode) having a width of 10 µm or less. By such a configuration, higher brightness can be attained. Further, by narrowing the width of the linear electrode, it is possible to increase an opening area of the main light extraction surface, so that it is possible to achieve higher brightness.

Method of Manufacturing Light-Emitting Diode

Next, a method of manufacturing the light-emitting diode 1 of this embodiment will be described. FIG. 6 is a cross-sectional view of an epitaxial wafer which is used in the light-emitting diode 1 of this embodiment. Further, FIG. 7 is a cross-sectional schematic view of a bonded wafer which is used in the light-emitting diode 1 of this embodiment.

Process of Forming Compound Semiconductor Layer

First, as shown in FIG. 6, the compound semiconductor layer 2 is made. The compound semiconductor layer 2 is made by sequentially laminating a buffer layer 15 made of GaAs, an etching stopper layer (not shown) provided in order to be used for selective etching, a contact layer 16 made of Si-doped n-type GaInP, the n-type upper clad layer 13, the upper guide layer 12, the active layer 11, the lower guide layer 10, the p-type lower clad layer 9, and the current diffusion layer 8 made of Mg-doped p-type GaP, on a GaAs substrate 14.

As the GaAs substrate 14, a commercially available single-crystal substrate manufactured by a known manufacturing method can be used. It is preferable that the epitaxially grown surface of the GaAs substrate 14 be smooth. With respect to the plane orientation of the surface of the GaAs substrate 14, a substrate in which epitaxial growth is easy and which is mass-produced and has a (100) plane and a plane deviated within ±20° from (100) is preferable in terms of stability of quality. Further, it is more preferable that a range of the plane orientation of the GaAs substrate 14 be 15°±5° deviated in a (0-1-1) direction from a (100) direction.

It is preferable that the dislocation density of the GaAs substrate 14 be low in order to improve the crystallinity of the compound semiconductor layer 2. Specifically, for example, 10000 pieces $cm^{-2}$ or less, preferably, 1000 pieces $cm^{-2}$ or less is preferable.

The GaAs substrate 14 may also be any of an n-type and a p-type. The carrier concentration of the GaAs substrate 14 can be appropriately selected in terms of a desired electric conductivity and an element structure. For example, in a case where the GaAs substrate 14 is a silicon-doped p-type, it is preferable that the carrier concentration be in a range of $1\times10^{17}$ $cm^{-3}$ to $5\times10^{18}$ $cm^{-3}$. In contrast, in a case where the GaAs substrate 14 is a zinc-doped p-type, it is preferable that the carrier concentration be in a range of $2\times10^{18}$ $cm^{-3}$ to $5\times10^{19}$ $cm^{-3}$.

Thickness of GaAs substrate 14 may be in an appropriate range according to size of substrate. It may be broken during a manufacturing process of compound semiconductor layer 2, if the thickness of GaAs substrate 14 is thinner than that in an appropriate range. On the other hand, material costs rise if thickness of GaAs substrate 14 is thicker that that in the appropriate range. Therefore, when substrate size of GaAs substrate 14 is large, for example, in the case of the diameter of 75 mm, thickness of 250-500 µm is preferable to preclude crack in handling. In the case of a diameter of 50 mm, thickness of 200-400 µm is preferable, and thickness of 350-600 µm is preferable in the case of a diameter of 100 mm.

Since the thickness of substrate is increased depending on substrate size of GaAs substrate 14, warping of compound semiconductor layer 2 due to light-emitting section 7 can be reduced. As a result, distribution of temperature in epitaxial growth becomes homogeneous, and then in-plane wavelength distribution of active layer 11 can be lowered. In addition, the shape of the GaAs substrate 14 may be rectangle, without limitation to circle in particular.

The buffer layer 15 is provided in order to reduce lattice mismatch between the GaAs substrate 14 and the constitution layer of the light-emitting section 7. Therefore, if the quality of a substrate or an epitaxial growth condition is selected, the buffer layer 15 is not necessarily required. Further, it is preferable that a material of the buffer layer 15 be the same material as that of the substrate which is subjected to epitaxial growth. Therefore, in this embodiment, as the buffer layer 15, it is preferable to use GaAs like the GaAs substrate 14. Further, as the buffer layer 15, in order to reduce the propagation of a defect, a multilayer film made of a material different from the GaAs substrate 14 can also be used. It is preferable that the thickness of the buffer layer 15 be 0.1 µm or more and it is more preferable that it be 0.2 µm or more.

The contact layer 16 is provided in order to lower contact resistance with an electrode. It is preferable that a material of the contact layer 16 be a material which has a larger bond gap than that of the active layer 11, and $Al_XGa_{1-X}As$, $(Al_XGa_{1-X})_YIn_{1-Y}P$ ($0 \leq X \leq 1$, $0 < Y \leq 1$) is preferable. Further, it is preferable that the lower limit of the carrier concentration of the contact layer 16 be $5\times10^{17}$ $cm^{-3}$ or more in order to lower contact resistance with an electrode, and $1\times10^{18}$ $cm^{-3}$ or more is more preferable. It is preferable that the upper limit of the carrier concentration be $2\times10^{19}$ $cm^{-3}$ or less where the lowering of crystallinity easily occurs. With respect to the thickness of the contact layer 16, 0.5 µm or more is preferable and 1 µm or more is preferred. The upper limitation of the thickness is not limited particularly, and 5 µm or less is preferable when cost of epitaxial growing process is taken into consideration.

In this embodiment, it is possible to apply a known growth method such as a molecular beam epitaxial method (MBE) or a low-pressure metal-organic chemical vapor deposition method (an MOCVD method). In particular, it is preferable to apply the MOCVD method having excellent mass-productivity. Specifically, in the GaAs substrate 14 which is used for the epitaxial growth of the compound semiconductor layer 2, it is preferable to remove contamination of the surface or a natural oxide film by carrying out a pretreatment such as a cleaning process or a thermal treatment before the growth. Each layer which is included in the above compounds semiconductor layer 2 is formed by setting the GaAs substrate 14 of a diameter of 50-150 mm in MOCVD apparatus, and then making them grow up epitaxially. In addition, as a MOCVD apparatus, commercial large-scale apparatus such as a planetary or a high-speed rotary type can be used.

When each layer of the compound semiconductor layer 2 is epitaxially grown, as a raw material of a group III constituent element, for example, trimethylaluminum (($CH_3$)$_3$Al), trimethylgallium (($CH_3$)$_3$Ga), and trimethylindium (($CH_3$)$_3$In) can be used. Further, as a doping material of Mg, for example, bis-cyclopentadienyl magnesium (bis-($C_5H_5$)$_2$Mg) or the like can be used. Further, as a doping material of Si, for example, disilane ($Si_2H_6$) or the like can be used. Further, as a raw material of a group V constituent element, phosphine ($PH_3$), arsine ($AsH_3$), or the like can be used. Further, as the growth temperature of each layer, in the case of using p-type GaP as the current diffusion layer 8, a temperature in a range of 720° C. to 770° C. can be applied, and in each of the other layers, a temperature in a range of 600° C. to 700° C. can be applied. Further, the carrier concentration and the layer thickness of each layer and a temperature condition can be appropriately selected.

In the compound semiconductor layer 2 made in this way, an excellent surface state in which crystal defects are few can be obtained. Further, the compound semiconductor layer 2 may also be subjected to a surface treatment such as polishing considering an element structure.

Process of Bonding Functional Substrate

Next, the compound semiconductor layer 2 and the functional substrate 3 are bonded to each other. In the bonding of the compound semiconductor layer 2 and the functional substrate 3, first, mirror finishing is carried out by polishing the surface of the current diffusion layer 8 constituting the compound semiconductor layer 2. Next, the functional substrate 3 which is attached to the mirror-polished surface of the current diffusion layer 8 is prepared. In addition, the surface of the functional substrate 3 is polished into a mirror surface before it is bonded to the current diffusion layer 8. Next, the compound semiconductor layer 2 and the functional substrate 3 are loaded into a general semiconductor material attachment apparatus, and the mirror-polished surfaces of the two are irradiated with an Ar beam neutralized by collision of electrons in a vacuum. Thereafter, bonding can be performed at room temperature by overlapping the surfaces of the two over each other and then applying a load thereto in the attachment apparatus in which the vacuum is maintained (refer to FIG. 7). As the bonding, it is preferable that the materials of the bonding interface is the same material from the view point of a stable bonding condition Normal temperature bonding under such a vacuum is the most preferable for bonding (pasting), however, eutectic metal or adhesion may be used.

Process of Forming the First and the Second Electrodes

Next, the n-type ohmic electrode 4 of the first electrode and the p-type ohmic electrode 5 of the second electrode are formed. In the formation of the n-type ohmic electrode 4 and the p-type ohmic electrode 5, first, the GaAs substrate 14 and the GaAs buffer layer 15 are selectively removed from the compound semiconductor layer 2 bonded to the functional substrate 3, by an ammonia-based etchant. Next, the n-type ohmic electrode 4 is formed on the exposed surface of the contact layer 16. Specifically, after AuGe and Ni alloy/Au are laminated so as to become an arbitrary thickness by a vacuum deposition method, the shape of the n-type ohmic electrode 4 is formed by performing patterning with the use of, for example, general photolithographic methods.

Next, the current diffusion layer 8 is exposed by selectively removing the contact layer 16, the upper clad layer 13, the upper guide layer 12, the active layer 11, the lower guide layer 10, and the lower clad layer 9, and the p-type ohmic electrode 5 is then formed on the exposed surface (the upper surface 8a). Specifically, after Au/Be/Au are laminated so as to become an arbitrary thickness by a vacuum deposition method, the shape of the p-type ohmic electrode 5 is formed by performing patterning with the use of, for example, general photolithographic means. Thereafter, by performing alloying by performing a thermal treatment in conditions of, for example, 400° C. to 500° C. and 5 minutes to 20 minutes, it is possible to form the low-resistance n-type and p-type ohmic electrodes 4 and 5.

Processing Functional Substrate

Next, the shape of functional substrate 3 is processed. The functional substrate 3 is processed by firstly performing a V-shaped groove on the surface on which the third electrode 6 is not formed. And an inclined plane 3b is formed, which has an angle α between the inside surface of V-shaped groove in the side of the third electrode 6 and the plane parallel to light-emitting surface. Secondly, Dice cutting is performed in predetermined distance from the side of compound semiconductor layer 2, and chips are formed. In addition, the perpendicular plane 3a of the functional substrate 3 is formed by dice cutting during the formation of chips.

As a method of forming the inclined plane 3b, it is not limited in particular, a method of combination of conventional methods such as wet etching, dry etching, scribing method, laser machining, can be used. However, it is the most preferable to use a dice cutting method having high controllability of shape and high productivity. Manufacturing yield can be improved by using the dice cutting method.

As a method of forming the perpendicular plane 3a, it is not limited in particular, however, it is preferable that a scribe-breaking method, a laser machining method or a dice cutting method can be used. However, when a laser machining method or a dice cutting method is used, manufacturing cost can be lowered. In other words, manufacturing cost can be lowered in mass-producing light-emitting diodes because that there is no necessity for designing cutting margin in the case of chip isolation. On the other hand, the dice cutting method is superior in cutting stability.

Finally, a crush layer and fouling are etched with a mixed solution of sulfuric acid and hydrogen peroxide if necessary. In this way the light-emitting diode 1 is produced.

Method of Manufacturing Light-Emitting Diode Lamp

Next, a method of manufacturing the light-emitting diode lamp 41 using the light-emitting diode 1, that is, a method of mounting the light-emitting diode 1 will be described.

As shown in FIGS. 1 and 2, a given quantity of light-emitting diodes 1 are mounted on the surface of the mount substrate 42. In the mounting of the light-emitting diode 1, first, alignment of the mount substrate 42 and the light-emitting diode 1 is performed, thereby disposing the light-emitting diode 1 at a given position on the surface of the mount substrate 42. Next, the light-emitting diode 1 is die-bonded to the surface of the mount substrate 42 by Ag paste. Next, the n-type ohmic electrode 4 of the light-emitting diode 1 and the n-electrode terminal 43 of the mount substrate 42 are connected to each other by using the gold wire 45 (wire bonding). Next, the p-type ohmic electrode 5 of the light-emitting diode 1 and the p-electrode terminal 44 of the mount substrate 42 are connected to each other by using the gold wire 46. Finally, the surface of the mount substrate 42 on which the light-emitting diode 1 is mounted is sealed by a general epoxy resin 47. In this way, the light-emitting diode lamp 41 using the light-emitting diode 1 is manufactured.

In addition, emission spectrum of light-emitting diode lamp 41, for example, having a peak light wavelength in a range of 760-850 nm, can be obtained by adjusting the composition of active layer 11. In addition, since dispersion of the well layer 17 and barrier layer 18 in active layer 11 are depressed by current diffusion layer 8a, half band width of emission spectrum becomes falling in the range of 10-40 nm.

As discussed above, according to the present embodiment, light-emitting diode 1 includes a compound semiconductor layer 2 including light-emitting section 7 having well layer 17 made from composition formula $(Al_{X1}Ga_{1-X1})As$ ($0 \leq X1 \leq 0.2$).

In addition, on the light-emitting section 7, a current diffusion layer 8 is installed in the light-emitting diode 1 of the present embodiment. Since the current diffusion layer 8 is transparent for the emitting light wavelength, it does not absorb the emission of light from light-emitting section 7. As a result, the light-emitting diode 1 having high output and high efficiency can be obtained. The functional substrate, as a stable material, has superior humidity resistance without worrying about corrosion.

Thus, according to light-emitting diode 1 of the present embodiment, the light-emitting diode 1 having an emitting light wavelength of 760 nm-850 nm, superior monochromatism, high output and high efficiency, and humidity resistance can be provided. In addition, according to the light-emitting diode 1 of the present embodiment, the light-emitting diode 1 having high output with efficiency more than about 1.5 times than the light-emitting diode of transparent substrate AlGaAs type, which was produced by conventional liquid phase epitaxial growth method, can be provided. In addition, reliability under high temperature and high humidity is improved, too.

In addition, according to the present embodiment, the light-emitting diode lamp 41 includes light-emitting diode 1 having the emiting light wavelength of 760 nm-850 nm, superior monochromatism, high output and high efficiency, and humidity resistance. Therefore, the light-emitting diode lamp 41 which is preferable for illumination for plant upbringing can be provided.

Light-Emitting Diode(12th Embodiment)

The light-emitting diode of the 12th embodiment, which the invention is applied, includes: a light-emitting section 7, which comprises an active layer 11, having a quantum well structure and formed by laminating alternately a well layer 17 which comprises a composition expressed by the composition formula of $(Al_{X1}Ga_{1-X1})As$ ($0 \leq X1 \leq 0.2$) and a barrier layer 18 which comprises a composition expressed by the composition formula of $(Al_{X4}Ga_{1-X4})_{Y2}In_{1-Y2}P$ ($0 \leq X4 \leq 1$, $0 < Y2 \leq 1$), and a first clad layer 9 and a second clad layer 13, between both of which the active layer 11 was sandwiched, wherein the first and the second clad layers comprise a composition expressed by the composition formula of $(Al_{X3}Ga_{1-X3})_{Y1}In_{1-Y1}P$ ($0 \leq X3 \leq 1$, $0 < Y1 \leq 1$); a current diffusion layer 8 formed on the light-emitting section 7; and a functional substrate 3 bonded to the current diffusion layer 8, wherein the thickness of well layer 17 is 3 to 30 nm and emitting wavelength is 760 nm to 850 nm.

The difference between the light-emitting diode of the 12th embodiment and that of the 11th embodiment is that the barrier layer 18 of the second embodiment comprises a composition expressed by the composition formula of $(Al_{X4}Ga_{1-X4})_{Y2}In_{1-Y2}P$ ($0 \leq X4 \leq 1$, $0 < Y2 \leq 1$).

Since it is preferable that barrier layer 18 has a composition having larger bang gap than that of the well layer 17, and from the viewpoint of crystallinity, it is preferable that Al concentration is low. Therefore, it is preferable that the range of X3 is 0.3-0.7 and the range of Y2 is 0.4-0.6. The most preferable composition X2, Y2 is decided by the composition of the well layer.

Light-Emitting diode(13th Embodiment)

FIGS. 8A and 8B are diagrams for describing the light-emitting diode related to the 13th embodiment to which the invention is applied, wherein FIG. 8A is a plan view and FIG. 8B is a cross-sectional view along line C-C' shown in FIG. 8A.

The light-emitting diode of the 13th embodiment includes: a light-emitting section, which includes an active layer 11, having a quantum well structure and formed by laminating alternately a well layer 17 which comprises a composition expressed by the composition formula of $(Al_{X1}Ga_{1-X1})As$ ($0 \leq X1 \leq 0.20$) and a barrier layer 18 which comprises a composition expressed by the composition formula of $(Al_{X2}Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3}Ga_{1-X3})_{Y1}In_{1-Y1}P$ ($0 \leq X3 \leq 1$, $0 < Y1 \leq 1$); a current diffusion layer 8 formed on the light-emitting section; and a functional substrate 31 which includes a reflection layer 23 having reflection index of 90% or more at the emitting wavelength, the functional substrate 31 is bonded to the current diffusion layer 8, wherein the thickness of well layer 17 is 3 to 30 nm and emitting wavelength is 760 nm to 850 nm.

Since the light-emitting diode of the second embodiment includes the functional substrate 31 having the reflection layer 23 having reflection index of 90% or more at the emitting wavelength, emitting light can be extracted from the main light extraction surface effectively.

As example shown in FIGS. 8A and 8B, the functional substrate 31 includes a reflection structure including a second electrode 21 on lower surface 8b of the current diffusion layer 8, a transparent conducting layer 22 and a reflection layer 23 which are laminated to cover the second electrode 21; and a layer (substrate) 30 including silicon or germanium.

In the light-emitting diode of the third embodiment, as functional substrate 31, silicon or germanium is preferable. Since the materials are hard to corrode, humidity resistance can be improved.

As the reflection layer 23, for example, silver (Ag), aluminium (Al), gold (Au) or alloy thereof may be used. Since these materials have high reflectance, the reflectance of the reflection layer 23 can be 90% or more.

The functional substrate 31 may include a combination of bonding reflection layer 23 with a cheap substrate (layer) such as silicon or germanium by using eutectic metal such as AuIn, AuGe, or AuSn. Since AuIn has low bonding temperature, and small difference in thermal expansion coefficient from the light-emitting section in particular, it is the most preferable combination to bond the cheapest silicon substrate (a silicon layer) with AuIn.

For example, as functional substrate 31, it is more preferable from the viewpoint of stability of quality to insert a layer made from a metal having a high melting point such as titanium (Ti), tungsten (W) or platinum (Pt) so that current diffusion layer, reflection layer metal and eutectic metal do not diffuse mutually.

Light-Emitting Diode(14th Embodiment)

FIG. 9 is diagram for describing the light-emitting diode related to the 14th embodiment to which the invention is applied.

The light-emitting diode of the 14th embodiment includes: a light-emitting section, which includes an active layer 11, having a quantum well structure and formed by laminating alternately a well layer 17 which comprises a composition expressed by the composition formula of $(Al_{X1} Ga_{1-X1})As$ ($0 \leq X1 \leq 0.2$) and a barrier layer 18 which comprises a composition expressed by the composition formula of $(Al_{X2} Ga_{1-X2})As$ ($0 < X2 \leq 1$), and a first clad layer 9 and a second clad layer 13, between both of which the active layer 11 was sandwiched, wherein the first and the second clad layers comprise a composition expressed by the composition formula of $(Al_{X3} Ga_{1-X3})_{Y1} In_{1-Y1} P$ ($0 \leq X3 \leq 1$, $0 < Y1 \leq 1$); a current diffusion layer 8 formed on the light-emitting section; and a functional substrate 51 which includes a reflection layer 53 having reflection index of 90% or more at the emitting wavelength and a metal substrate 50, the functional substrate 51 is bonded to the current diffusion layer 8, wherein the thickness of well layer 17 is 3 to 30 nm and emitting wavelength is 760 nm to 850 nm.

As light-emitting diode of the 14th embodiment, the point that the functional substrate includes metal substrate is different from that of the light-emitting diode of the 13th embodiment.

Since the metal substrate has a high heat dissipation characteristic, using the metal substrate in the light-emitting diode not only can contribute to emit light in high brightness, but also can increase the lifetime of the light-emitting diode.

From the viewpoint of heat dissipation characteristics, it is preferable to use a metal substrate made from a metal having a coefficient of thermal conductivity of 130 W/m·K or more. For example, the metal having the coefficient of thermal conductivity of 130 W/m·K or more is molybdenum (138 W/m·K) and tungsten (174 W/m·K).

As shown in FIG. 9, the compound semiconductor layer 2 includes an active layer 11, a first clad layer (lower part clad) 9 and a second clad layer (upper part clad) 13 between both of which the active layer 11 is inserted through a guide layer (not shown), a current diffusion layer 8 below the first clad layer (lower part clad) 9, a first electrode 55 above the second clad layer (upper part clad) 13, and a contact layer 56 having about the same size in planar view.

A functional substrate 51 includes a second electrode 57 on lower surface 8b of the current diffusion layer 8, a reflection structure obtained by laminating a transparent conducting layer 52 and reflection layer 53 in order to cover the second electrode 57, and a metal substrate 50. The surface 53b of the reflection layer 53 opposite to the semiconductor compound layer is bonded to the bonding surface 50a of the metal substrate 50.

As the reflection layer 53, for example, a metal such as copper, silver, gold, aluminium or alloy thereof may be used. Since these materials have high reflectance, the reflectance of the reflection layer 53 can be 90% or more. Since reflection layer 53 is formed, light emitted from the active layer 11 is reflected in front direction f by the reflection layer 53, and the light extraction efficiency in front direction f can be improved. As a result, a light-emitting diode having higher intensity can be produced.

As the reflection layer 53, multilayer including Ag, a Ni/Ti barrier layer, and Au-typed eutectic metal (bonding metal) in the above order from the side of transparent conducting layer 52 is preferable.

The bonding metal is a metal having low electric resistance and low melting point. The metal substrate can be bonded without giving the compound semiconductor layer 2 heat stress by using the metal for bonding.

As the bonding metal, Au-typed eutectic metal having a low melting point and having chemical stability may be used. As Au-typed eutectic metal, for example, an eutectic composition (As Au-typed eutectic metal) of alloy such as AuSn, AuGe, AuSi can be used.

In addition, it is preferable to add a metal such as titanium, chromium, tungsten in the bonding metal. As a result, the metal such as titanium, chromium, tungsten can prevent, as barrier metal, impurity in the metal substrate from diffusing into the reflection layer 53 and depressing the reaction.

Transparent conducting layer 52 includes ITO layer and IZO layer. A reflection structure may include the reflection layer 53 only.

In addition, as a substitution for transparent conducting layer 52, or combination with transparent conducting layer 52, a so-called cold mirror which utilizes refractive index difference of transparent materials may be put together to reflection layer 53. For example, a multilayer film of oxidation titanium film or silicon oxide, white alumina and AlN may be used.

As the metal substrate 50, a plural metal layers may be used.

It is preferable that two kinds of metal layers are laminated alternately to form metal substrate.

Particularly, it is preferable that the layer number of these two kinds of metal layers is an odd number.

In this case, from the viewpoint of warping and cracking of the metal substrate, when a second metal layer 50B uses a material having smaller coefficient of thermal expansion than that of compound semiconductor layer 2, it is preferable that a first metal layer 50A uses a material having larger coefficient of thermal expansion than that of compound semiconductor layer 2. Since the coefficient of thermal expansion of the whole metal substrate is similar to coefficient of thermal expansion of the compound semiconductor layer, warping and cracking of the metal substrate when bonding the compound semiconductor layer can be repressed. As a result, manufacturing yield of the light-emitting diode can be improved. When second a second metal layer 50B uses a material having larger coefficient of thermal expansion than that of compound semiconductor layer 2, it is preferable that a first metal layer 50A uses a material having smaller coefficient of thermal expansion than that of compound semiconductor layer 2. Since the coefficient of thermal expansion of the whole metal substrate is similar to coefficient of thermal expansion of the compound semiconductor layer, warping and cracking of the metal substrate when bonding the compound semiconductor layer can be repressed. As a result, manufacturing yield of the light-emitting diode can be improved.

From the viewpoint of above, two kinds of metal layers may be used as either the first metal layer or the second metal layer.

As two kinds of metal layers, for example, a combination between a metal layer made from silver (coefficient of thermal expansion=18.9 ppm/K), copper (coefficient of thermal expansion=16.5 ppm/K) gold (coefficient of thermal expansion=14.2 ppm/K) aluminium (coefficient of thermal expansion=23.1 ppm/K), nickel (coefficient of thermal expansion=13.4 ppm/K) and alloy thereof; and a metal layer made from molybdenum (coefficient of thermal expansion=5.1 ppm/K), tungsten (coefficient of thermal expansion=4.3 ppm/K), chromium (coefficient of thermal expansion=4.9 ppm/K) and alloy thereof can be used.

A metal substrate having three layers of Cu/Mo/Cu is preferable. From the above view point, a similar effect is provided with the metal substrate having three layers of Mo/Cu/Mo. However, since the metal substrate having three layers of Cu/Mo/Cu has a structure in which Mo having strong mechanical strength is surround by Cu which is easy to process, it is easier to be processed than that of the metal substrate having three layers of Mo/Cu/Mo.

As the coefficient of thermal expansion of the whole metal substrate, for example, metal substrate having three layers of Cu (30 μm)/Mo (25 μm)/Cu (30 μm) is 6.1 ppm/K, and the metal substrate having three layers of Mo (25 μm)/Cu (70 μm)/Mo (25 μm) is 5.7 ppm/K, In addition, from the viewpoint of heat dissipation, it is preferable that a metal layer of the metal substrate is made from materials having high heat-conductivity. As a result, since heat dissipation ability of metal substrate is improved, not only the light-emitting diode can emit light in high brightness, but also the light-emitting diode having a long lifetime can be obtained.

For example, it is preferable that silver (heat-conductivity=420 W/m·K), copper (heat-conductivity=398 W/m·K), gold (heat-conductivity=320 W/m·K), aluminium (heat-conductivity=236 W/m·K), molybdenum (heat-conductivity=138 W/m·K), or tungsten (heat-conductivity=174 W/m·K), and an alloy thereof can be used.

It is more preferable that the coefficient of thermal expansion of the materials of the metal layers is approximately equal to the coefficient of thermal expansion of the compound semiconductor layer. It is particularly preferable that the material of the metal layer has the coefficient of thermal expansion which is within ±1.5 ppm/K of the coefficient of thermal expansion of the compound semiconductor layer. Since the stress, which is generated by heat when metal substrate is bonded with the compound semiconductor layer, to light-emitting section can be lowered, crack of metal substrate, which is generated by heat when bonding the compound semiconductor layer, can be repressed. As a result, manufacturing yield of the light-emitting diode can be improved.

As a heat-conductivity of the whole metal substrate, for example, the heat-conductivity of metal substrate having three layers of Cu (30 μm)/Mo (25 μm)/Cu (30 μm) is 250 W/m·K and the heat-conductivity of metal substrate having three layers of Mo (25 μm)/Cu (70 μm)/Mo (25 μm) is 220 W/m·K.

Light-Emitting Diode(15th Embodiment)

The light-emitting diode of the 15th embodiment includes: a light-emitting section, which includes an active layer 11, having a quantum well structure and formed by laminating alternately a well layer 17 which comprises a composition expressed by the composition formula of $(Al_{X1}Ga_{1-X1})As$ ($0 \leq X1 \leq 0.2$) and a barrier layer 18 which comprises a composition expressed by the composition formula of $(Al_{X4}Ga_{1-X4})_{Y2}In_{1-Y2}P$ ($0 \leq X4 \leq 1$, $0 < Y2 \leq 1$), and a first clad layer 9 and a second clad layer 13, between both of which the active layer 11 was sandwiched, wherein the first and the second clad layers comprise a composition expressed by the composition formula of $(Al_{X3}Ga_{1-X3})_{Y1}In_{1-Y1}P$ ($0 \leq X3 \leq 1$, $0 < Y1 \leq 1$); a current diffusion layer 8 formed on the light-emitting section; and a functional substrate 31 which includes a reflection layer 23 having reflection index of 90% or more at the emitting wavelength, the functional substrate 31 is bonded to the current diffusion layer 8, wherein the thickness of well layer 17 is 3 to 30 nm and emitting wavelength is 760 nm to 850 nm.

As the functional substrate of the present embodiment, the example of functional substrates illustrated in the 13th embodiment and 14th embodiment can be used.

EXAMPLES

Hereinafter, the effects of the invention will be specifically described using Examples. In addition, the invention is not limited to these Examples.

In accordance with the Examples, an example of producing a light-emitting diode of the present invention is described concretely. After the light-emitting diode was obtained, for characteristic evaluation, a light-emitting diode lamp in which a light-emitting diode chip is mounted on a substrate was manufactured.

Example 1

The light-emitting diode of Example 1 is an example of the first embodiment.

At first, an epitaxial wafer was manufactured by sequentially laminating compound semiconductor layers on a GaAs substrate made of a Si-doped n-type GaAs single crystal. In the GaAs substrate, a plane inclined by 15° in a (0-1-1) direction from a (100) plane was set to be a growth plane and a carrier concentration was set to be $2 \times 10^{18}$ cm$^{-3}$. The thickness of GaAs substrate was 0.5 μm. The compound semiconductor layers are an n-type buffer layer made of Si-doped GaAs, an n-type contact layer made of Si-doped $(Al_{0.7}Ga_{0.3})_{0.5}In_{0.5}P$, an n-type upper clad layer made of Si-doped $(Al_{0.7}Ga_{0.3})_{0.5}In_{0.5}P$, an upper guide layer made of $Al_{0.4}Ga_{0.6}As$, well layer/barrier layer composed of 20 pairs of $Al_{0.18}Ga_{0.82}As/Al_{0.3}Ga_{0.7}As$, a lower guide layer made of $Al_{0.4}Ga_{0.6}As$, a p-type lower clad layer made of Mg-doped $(Al_{0.7}Ga_{0.3})_{0.5}In_{0.5}P$, a thin-film intermediate layer made of $(Al_{0.5}Ga_{0.5})_{0.5}In_{0.5}P$, and a current diffusion layer made of Mg-doped p-type GaP.

In this example, the epitaxial wafer was formed by making the compound semiconductor layers epitaxially grow in the GaAs substrate having a diameter of 76 mm and a thickness of 350 μm with the use of a low-pressure metal-organic chemical vapor deposition apparatus (MOCVD apparatus). When making epitaxial growth layers grow, as a raw material of a group III constituent element, trimethylaluminum $((CH_3)_3Al)$, trimethylgallium $((CH_3)_3Ga)$, and trimethylindium $((CH_3)_3In)$ were used. Further, as a doping material of Mg, bis-cyclopentadienyl magnesium (bis-$(C_5H_5)_2$Mg) was used. Further, as a doping material of Si, disilane $(Si_2H_6)$ was used. Further, as a raw material of a group V constituent element, phosphine $(PH_3)$ and arsine $(AsH_3)$ were used. Further, as the growth temperature of each layer, the current diffusion layer made of p-type GaP was grown at 750° C. In each of the other layers, growth was performed at 700° C.

In the buffer layer made of GaAs, a carrier concentration was set to be about $2 \times 10^{18}$ cm$^{-3}$ and a layer thickness was set to be about 0.5 μm. In the contact layer, a carrier concentration was set to be about $2 \times 10^{18}$ cm$^{-3}$ and a layer thickness was set to be about 3.5 μm. In the upper clad layer, a carrier concentration was set to be about $1 \times 10^{18}$ cm$^{-3}$ and a layer thickness was set to be about 0.5 μm. The upper guide layer was set to be undoped and a layer thickness was set to be about 50 nm. The well layer was set to be undoped $Al_{0.18}Ga_{0.82}As$ having a layer thickness of about 17 nm, and the barrier layer was set to be undoped $Al_{0.3}Ga_{0.7}As$ having a layer thickness of about 19 nm. Further, a well layer and a barrier layer were alternately laminated in 20 pairs. The lower guide layer was set to be undoped and a layer thickness was set to be about 50 nm. In the lower clad layer, a carrier concentration was set to be about $8\times10^{17}$ cm$^{-3}$ and a layer thickness was set to be about 0.5 μm. In the intermediate layer, a carrier concentration was set to be about $8\times10^{17}$ cm$^{-3}$ and a layer thickness was set to be about 0.05 μm. In the current diffusion layer made of GaP, a carrier concentration was set to be about $3\times10^{18}$ cm$^{-3}$ and a layer thickness was set to be about 9 μm.

Next, the current diffusion layer was mirror-finished by polishing it up to a region which reached a depth of about 1 μm from the surface. As a result of mirror-finishing, the roughness of the surface was made to be 0.18 nm. On the other hand, a functional substrate made of n-type GaP which is attached to the mirror-polished surface was prepared. As the functional substrate for attachment, a single crystal in which Si was added thereto such that a carrier concentration became about $2\times10^{17}$ cm$^{-3}$, and a plane orientation was set to be (111), was used. Further, the diameter of the functional substrate was 76 mm and the thickness was 250 μm. The surface of the functional substrate was finished to have a root-mean-square value (rms) of 0.12 nm by polishing it into a mirror surface before it was bonded to the current diffusion layer.

Next, the functional substrate and the epitaxial wafer were loaded into a general semiconductor material attachment apparatus and the inside of the apparatus was evacuated until a vacuum of $3\times10^{-5}$ Pa was obtained.

Next, the surfaces of both the functional substrate and the current diffusion layer were irradiated with an Ar beam neutralized by collision of electrons over three minutes. Thereafter, in the attachment apparatus in which a vacuum was maintained, the surfaces of the functional substrate and the current diffusion layer were bonded to each other at room temperature by overlapping the surfaces over each other and then applying a load thereto such that pressure on each surface became 50 g/cm$^2$. In this way, a bonded wafer was formed.

Next, the GaAs substrate and the GaAs buffer layer were selectively removed from the bonded wafer by an ammonia-based etchant. Next, AuGe, Ni alloy having a thickness of 0.5 μm, Pt having a thickness of 0.2 μm and Au having a thickness of 1 μm were formed on the surface of the contact layer as the first electrode by a vacuum deposition method. Thereafter, an n-type ohmic electrode, as a first electrode, was formed by performing patterning with the use of general photolithography means. The main light extraction surface, which was obtained by removing GaAs substrate, was then rough treated.

Next, the epitaxial layer in an area to form a p-type ohmic electrode was selectively removed, thereby exposing the current diffusion layer. On the exposed surface, the p-type ohmic electrode was formed by a vacuum deposition method such that AuBe became 0.2 μm and Au became 1 μm. Thereafter, the low-resistance p-type and n-type ohmic electrodes were formed by carrying out alloying by performing a thermal treatment at 450° C. and for 10 minutes.

The third electrode having a thickness of 0.2 μm and a size of 230 μm×230 μm was formed on the functional substrate.

Next, from the backside of the functional substrate, the functional substrate is processed by performing a V-shaped groove in the surface in which the third electrode is not formed by using dice cutting saw, wherein the V-shaped groove has an inclined plane having an angle α of 70 degrees and a perpendicular plane having a thickness of 80 μm. Secondly, the substrate was cut from the side of compound semiconductor layer in an interval of 350 μm by using dice cutting saw, and chips were formed. And then, a crush layer and fouling, which were yielded during the dice cutting, were etched with a mixed solution of sulfuric acid and hydrogen peroxide. And then, the light-emitting diode of Example 1 was obtained.

One hundred pieces of the light-emitting diode lamps each having the light-emitting diode chip of Example 1 manufactured as described above mounted on a mount substrate were assembled. The light-emitting diode lamp was produced by keeping a mount substrate by a die-bonder (mount), wire-bonding a n-type ohmic electrode of the light-emitting diode and a n-electrode terminal of the mount substrate by a gold wire, wire-bonding the p-type ohmic electrode to a p-electrode terminal by a gold wire, and then performing sealing with a general epoxy resin.

The evaluation results of the characteristics of the light-emitting diode (the light-emitting diode lamp) are shown in Table 10.

As shown in Table 10, when electric current flowed between the n-type and p-type ohmic electrodes, infrared light having a peak wavelength of 730 nm was emitted. A forward voltage ($V_F$) was about 2.0 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 14 mW.

Moreover, under the condition of high temperature and high humidity of 60° C. and 90RH %, 20 mA power-on tests of twenty of the lamps were performed.

The average of output survival rate after 1000 hours later was 98%. There was no variation of $V_F$, and it was 100%.

TABLE 10

|  | Device Structure | Substrate | Barrier Layer | $\lambda_P$ (nm) | Po (20 mA) | $V_F$ (20 mA) | Reliability Po: % | Reliability $V_F$: % |
|---|---|---|---|---|---|---|---|---|
| Example 1 | Transparent | GaP | AlGaAs | 730 | 14.0 | 2.0 | 98 | 100 |
| Example 2 | Transparent | GaP | AlGaInP | 730 | 12.0 | 2.2 | 99 | 100 |
| Example 3 | Reflection | Si | AlGaAs | 730 | 10.0 | 1.9 | 98 | 100 |
| Example 4 | Reflection | Cu/Mo/Cu | AlGaAs | 730 | 10.0 | 1.9 | 99 | 100 |
| Example 5 | Reflection | Si | AlGaInP | 730 | 9.4 | 2.1 | 99 | 100 |
| Example 6 | Transparent | GaP | AlGaAs | 720 | 14.0 | 2.0 | 100 | 100 |
| Example 7 | Transparent | GaP | AlGaInP | 720 | 12.0 | 2.2 | 99 | 100 |
| Example 8 | Reflection | Si | AlGaAs | 720 | 10.0 | 1.9 | 98 | 100 |
| Example 9 | Reflection | Si | AlGaInP | 720 | 9.5 | 2.1 | 100 | 100 |
| Example 10 | Transparent | GaP | AlGaAs | 760 | 15.0 | 2.0 | 98 | 100 |
| Example 11 | Transparent | GaP | AlGaInP | 760 | 12.7 | 2.2 | 99 | 100 |

TABLE 10-continued

| | Device Structure | Substrate | Barrier Layer | $\lambda_P$ (nm) | Po (20 mA) | $V_F$ (20 mA) | Reliability Po: % | Reliability $V_F$: % |
|---|---|---|---|---|---|---|---|---|
| Example 12 | Reflection | Si | AlGaAs | 760 | 11.0 | 1.9 | 98 | 100 |
| Example 13 | Transparent | GaP | AlGaAs | 725 | 14.0 | 2.0 | 98 | 100 |
| Example 14 | Transparent | GaP | AlGaAs | 755 | 14.7 | 2.0 | 98 | 100 |
| Comparative example 1 | Liquid phase epitaxial | AlGaAs | | 730 | 5.0 | 1.9 | 83 | 105 |

Example 2

The light-emitting diode of Example 2 is an example of the second embodiment.

The condition was the same as that of Example 1 except that the compound semiconductor layer was formed by the following condition.

In the GaAs substrate made of a Si-doped n-type GaAs single crystal, a plane inclined by 15° in a (0-1-1) direction from a (100) plane was set to be a growth plane and a carrier concentration was set to be $2\times10^{18}$ cm$^{-3}$. The thickness of GaAs substrate was 0.5 µm. The compound semiconductor layers are an n-type buffer layer made of Si-doped GaAs, an n-type contact layer made of Si-doped $(Al_{0.7}Ga_{0.3})_{0.5}In_{0.5}P$, an n-type upper clad layer made of Si-doped $(Al_{0.7}Ga_{0.3})_{0.5}In_{0.5}P$, an upper guide layer made of $(Al_{0.3}Ga_{0.7})_{0.5}In_{0.5}P$, well layer/barrier layer composed of 20 pairs of $Al_{0.18}Ga_{0.82}As/(Al_{0.1}Ga_{0.9})_{0.5}In_{0.5}P$, a lower guide layer made of $(Al_{0.3}Ga_{0.7})_{0.5}In_{0.5}P$, a p-type lower clad layer made of Mg-doped $(Al_{0.7}Ga_{0.3})_{0.5}In_{0.5}P$, a thin-film intermediate layer made of $(Al_{0.5}Ga_{0.5})_{0.5}In_{0.5}P$, and a current diffusion layer made of Mg-doped p-type GaP.

In the buffer layer made of GaAs, a carrier concentration was set to be about $2\times10^{18}$ cm$^{-3}$ and a layer thickness was set to be about 0.5 µm. In the contact layer, a carrier concentration was set to be about $2\times10^{18}$ cm$^{-3}$ and a layer thickness was set to be about 3.5 µm. In the upper clad layer, a carrier concentration was set to be about $1\times10^{18}$ cm$^{-3}$ and a layer thickness was set to be about 0.5 µm. The upper guide layer was set to be undoped and a layer thickness was set to be about 50 nm. The well layer was set to be undoped $Al_{0.18}Ga_{0.82}As$ having a layer thickness of about 17 nm, and the barrier layer was set to be undoped $(Al_{0.1}Ga_{0.9})_{0.5}In_{0.5}P$ having a layer thickness of about 19 nm. Further, a well layer and a barrier layer were alternately laminated in 20 pairs. The lower guide layer was set to be undoped and a layer thickness was set to be about 50 nm. In the lower clad layer, a carrier concentration was set to be about $8\times10^{17}$ cm$^{-3}$ and a layer thickness was set to be about 0.5 µm. In the intermediate layer, a carrier concentration was set to be about $8\times10^{17}$ cm$^{-3}$ and a layer thickness was set to be about 0.05 µm. In the current diffusion layer made of GaP, a carrier concentration was set to be about $3\times10^{18}$ cm$^{-3}$ and a layer thickness was set to be about 9 µm.

The evaluation results of the characteristics of the light-emitting diode (the light-emitting diode lamp) are shown in Table 10.

As shown in Table 10, when electric current flowed between the n-type and p-type ohmic electrodes, infrared light having a peak wavelength of 730 nm was emitted. A forward voltage ($V_F$) was about 2.2 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 12 mW.

Moreover, under the condition of high temperature and high humidity of 60° C. and 90RH %, 20 mA power-on tests of twenty of the lamps were performed.

The average of output survival rate after 1000 hours later was 99%. There was no variation of $V_F$, and it was 100%.

Example 3

Light-emitting diode of Example 3 is an example of the third embodiment, in which a functional substrate including a reflection layer was bonded with a current diffusion layer. As shown in FIGS. 8A and 8B, a method of forming the light-emitting diode of Example 3 was explained. In addition, in the FIGS. 8A and 8B, the lower guide layer and the upper guide layer were not shown.

The compound semiconductor layer was formed in the same condition as that of Example 1.

Next, on the surface of current diffusion layer 8, eight electrodes 21 made from AuBe/Au alloy at dot shape having a thickness of 0.2 µm and a diameter of 20 µm, were placed in the same interval and at a distance of 50 µm from the end of the light extraction surface.

Next, ITO layer 22 as a transparent conducting layer having a thickness of 0.4 µm was formed by a sputtering method. Layer 23 made from silver alloy/Ti/Au in thickness of 0.2 µm/0.1 µm/1 µm was formed as reflection layer 23.

On the other hand, layer 32 made from Ti/Au/In in thickness of 0.1 µm/0.5 µm/0.3 µm was formed on the surface of silicon substrate 31. Layer 33 made from Ti/Au in thickness of 0.1 µm/0.5 µm was formed on the backside of the silicon substrate 31. The Au surface of the light-emitting diode wafer and the In surface of the silicon substrate were overlapped, and pressurized under a temperature of 320° C. and pressure of 500 g/cm$^2$, as a result, the functional substrate was bonded to the light-emitting diode wafer.

After GaAs substrate was removed, on the surface of the contact layer 16, an ohmic electrode 25 made from AuGe/Au, having a diameter of 100 µm and thickness of 3 µm was formed. And then p, n ohmic electrodes were performed by an alloying-process of heat-treatment under 420° C. for five minutes.

Next, the surface of contact layer 16 was rough-processed.

After removing the semiconductor layer, reflection layer of segment, and eutectic metal on the section to be dice cut, a silicon substrate was cut in a 350 µm pitch to obtain a regular square by using a dice cutting saw.

The evaluation results of the characteristics of the light-emitting diode (the light-emitting diode lamp) are shown in Table 10.

As shown in Table 10, when electric current flowed between the n-type and p-type ohmic electrodes, infrared light having a peak wavelength of 730 nm was emitted. A forward voltage ($V_F$) was about 1.9 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 10 mW.

Moreover, under the condition of high temperature and high humidity of 60° C. and 90RH %, 20 mA power-on tests of twenty of the lamps were performed.

The average of output survival rate after 1000 hours later was 98%. There was no variation of $V_F$, and it was 100%.

Example 4

The light-emitting diode of Example 4 is an example of the 4th embodiment, in which a current diffusion layer was bonded with a functional substrate including a reflection layer and a metal substrate. As shown in FIG. 9, light-emitting diode of Example 4 is described.

At first, a metal substrate was produced. It was produced by preparing two approximately flat Cu boards of thickness 10 µm and one approximately flat Mo board of thickness 75 µm, inserting the Mo board into the two pieces of Cu boards to overlap the three boards, placing them into a pressure-applying apparatus, and applying load to the metal boards at high temperature in the thickness direction. As a result, a metal substrate including three layers of Cu (10 µm)/Mo (75 µm)/Cu (10 µm) was produced.

The compound semiconductor layer was formed by the same method of Example 1, except that between the buffer layer and contact layer an etch stop layer made form Si-doped $(Al_{0.5}Ga_{0.5})_{0.5}In_{0.5}P$ with a thickness of 0.5 µm was formed.

On the surface 8b of the current diffusion layer 8, second electrodes 57 were formed in the same interval of 60 µm by laminating Au having a thickness of 0.2 µm on AuBe having a thickness of 0.4 µm, wherein the second electrodes 57 was a columnar shape having a diameter of 20 µm.

Next, an ITO layer 52 as a transparent conducting layer was formed by a sputtering method in thickness of 0.8 µm to cover second anode 57.

Next, on ITO layer 52, a reflection coating 53 was produced by forming a layer made from silver (Ag) alloy having a thickness of 0.7 µm by a vaporization method, and then, forming a layer made from nickel (Ni)/Titanium (Ti) having a thickness of 0.5 µm, and then and a layer made from gold (Au) having a thickness of 1 µm.

A bonding structure was formed by placing the structure made of ITO layer 52 and reflection coating 53a on the current diffusion layer 8 of the compound semiconductor layer and the metal substrate so as to make them face each other; transferring them into vacuum chamber; bonding them at 400° C. by using a 500 kg load.

And then, from a bonding structure, the GaAs substrate and the buffer layer which is used as a growth substrate of the compound semiconductor layer were removed by ammonia type etchant selectively. The etching stop layer was removed by HCl type etchant selectively.

Next, on a contact layer, a conducting layer for a first electrode was formed using vacuum deposition method by forming an AuGe layer having a thickness of 0.15 µm, and then forming Ni layer having a thickness of 0.05 µm, and moreover forming an Au layer having a thickness of 1 µm more. By using photolithography method, a first electrode 55 having a thickness 3 µm and diameter of 100 µm was produced by patterning the conducting layer for electrode to the shape of circle in planar view.

Contact layer 56 was formed by etching a section of contact layer except for the section below the first electrode, by using ammonia type etchant and using the first electrode as mask.

After removing the semiconductor layer, reflection layer of segment, and eutectic metal on the section to be dice cut, a silicon substrate was cut in a 350 µm pitch to obtain a regular square by using a dice cutting saw.

The evaluation results of the characteristics of the light-emitting diode (the light-emitting diode lamp) are shown in Table 10.

As shown in Table 10, when electric current flowed between the n-type and p-type ohmic electrodes, infrared light having a peak wavelength of 730 nm was emitted. A forward voltage ($V_F$) was about 1.9 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 10 mW.

Moreover, under the condition of high temperature and high humidity of 60° C. and 90RH %, 20 mA power-on tests of twenty of the lamps were performed.

The average of output survival rate after 1000 hours later was 99%. There was no variation of $V_F$, and it was 100%.

Example 5

Light-emitting diode of Example 5 is an example of the 5th embodiment.

The compound semiconductor layer was formed in the same condition as that of Example 2, and the other conditions are the same as Example 3.

The evaluation results of the characteristics of the light-emitting diode (the light-emitting diode lamp) are shown in Table 10.

As shown in Table 10, when electric current flowed between the n-type and p-type ohmic electrodes, infrared light having a peak wavelength of 730 nm was emitted. A forward voltage ($V_F$) was about 2.1 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 9.4 mW.

Moreover, under the condition of high temperature and high humidity of 60° C. and 90RH %, 20 mA power-on tests of twenty of the lamps were performed.

The average of output survival rate after 1000 hours later was 99%. There was no variation of $V_F$, and it was 100%.

Example 6

The light-emitting diode of Example 6 is an example of the first embodiment, and was produced under the same condition as that of Example 1, except that Al composition of the well layer is X1=0.20 and Al composition of a barrier layer having composition formula $(Al_{X2} Ga_{1-X2})As$ (0<X2≤1) is X2=0.35; and that is, the light-emitting section was changed to a well layer/barrier layer made from a pair of $Al_{0.2}Ga_{0.8}As/Al_{0.35}Ga_{0.65}As$ in order to obtain emitting light peak wavelength of 720 nm.

The evaluation results of the characteristics of this light-emitting diode (light-emitting diode lamp) are shown in Table 10. An red light having peak wavelength 680 nm was emitted, the emitting light output ($P_o$), the forward voltage ($V_F$), the average of output survival rate, the variation of forward direction voltage were 14 mW, 2V, 100%, 100%, respectively.

Example 7

The light-emitting diode of Example 7 is an example of the second embodiment, and was produced under the same condition as that of Example 1, except that Al composition of the well layer is X1=0.20 and Al composition of a barrier layer having composition expressed by the composition formula of $(Al_{X4} Ga_{1-X4})_{Y2} In_{1-Y2} P$ ($0 \leq X4 \leq 1$, $0 < Y2 \leq 1$) is X4=0.1, Y2=0.5; and that is, the light-emitting section was changed to a well layer/barrier layer made from a pair of $Al_{0.28}Ga_{0.72}As/(Al_{0.1}Ga_{0.9})_{0.5}In_{0.5}P$ in order to obtain emitting light peak wavelength of 720 nm.

The evaluation results of the characteristics of this light-emitting diode (light-emitting diode lamp) are shown in Table 10. An red light having peak wavelength 680 nm was emitted, the emitting light output ($P_o$), the forward voltage ($V_F$), the average of output survival rate, the variation of forward direction voltage were 12 mW, 2.2V, 99%, 100%, respectively.

Example 8

The light-emitting diode of Example 8 is an example of the third embodiment, and was produced under the same condition as that of Example 3, except that Al composition of the well layer is X1=0.20 and Al composition of a barrier layer having composition expressed by the composition formula of $(Al_{X2} Ga_{1-X2})As$ ($0 < X2 \leq 1$) is X2=0.35; and that is, the light-emitting section was changed to a well layer/barrier layer made from a pair of $Al_{0.2}Ga_{0.8}As/Al_{0.35}Ga_{0.65}As$ in order to obtain emitting light peak wavelength of 720 nm. The change of Al composition of a barrier layer from X2=0.30 to X2=0.35 did not affect the emitting light peak wavelength.

The evaluation results of the characteristics of this light-emitting diode (light-emitting diode lamp) are shown in Table 10. An red light having peak wavelength 720 nm was emitted, the emitting light output ($P_o$), the forward voltage ($V_F$), the average of output survival rate, the variation of forward direction voltage were 10 mW, 1.9V, 98%, 100%, respectively.

Example 9

The light-emitting diode of Example 9 is an example of the 5th embodiment, and was produced under the same condition as that of Example 3, except that Al composition of the well layer is X1=0.20 and Al composition of a barrier layer having composition expressed by the composition formula of $(Al_{X4} Ga_{1-X4})_{Y2} In_{1-Y2} P$ ($0 \leq X4 \leq 1$, $0 < Y2 \leq 1$) is X4=0.1, Y2=0.5; and that is, the light-emitting section was changed to a well layer/barrier layer made from a pair of $Al_{0.20}Ga_{0.80}As/(Al_{0.1}Ga_{0.9})_{0.5}In_{0.5}P$ in order to obtain emitting light peak wavelength of 720 nm.

The evaluation results of the characteristics of this light-emitting diode (light-emitting diode lamp) are shown in Table 10. An red light having peak wavelength 680 nm was emitted, the emitting light output ($P_o$), the forward voltage ($V_F$), the average of output survival rate, the variation of forward direction voltage were 9.5 mW, 2.1V, 100%, 100%, respectively.

Example 10

The light-emitting diode of Example 10 is an example of the first embodiment, and was produced under the same condition as that of Example 1, except that Al composition of the well layer is X1=0.13 and Al composition of a barrier layer having composition expressed by formula $(Al_{X2} Ga_{1-X2})As$ ($0 < X2 \leq 1$) is X2=0.3; and that is, the light-emitting section was changed to a well layer/barrier layer made from a pair of $Al_{0.13}Ga_{0.87}As/Al_{0.3}Ga_{0.7}As$ in order to obtain emitting light peak wavelength of 760 nm.

The evaluation results of the characteristics of this light-emitting diode (light-emitting diode lamp) are shown in Table 10. An infrared light having peak wavelength 760 nm was emitted, the emitting light output ($P_o$), the forward voltage ($V_F$), the average of output survival rate, the variation of forward direction voltage were 15 mW, 2.0V, 98%, 100%, respectively.

Example 11

The light-emitting diode of Example 10 is an example of the first embodiment, and was produced under the same condition as that of Example 1, except that Al composition of the well layer is X1=0.13 and Al composition of a barrier layer having composition expressed by formula $(Al_{X4} Ga_{1-X4})_{Y2} In_{1-Y2} P$ ($0 \leq X4 \leq 1$, $0 < Y2 \leq 1$) is X4=0.1, Y2=0.5; and that is, the light-emitting section was changed to a well layer/barrier layer made from a pair of $Al_{0.13}Ga_{0.87}As/(Al_{0.1}Ga_{0.9})_{0.5}In_{0.5}P$ in order to obtain emitting light peak wavelength of 760 nm.

The evaluation results of the characteristics of this light-emitting diode (light-emitting diode lamp) are shown in Table 10. An infrared light having peak wavelength 760 nm was emitted, the emitting light output ($P_o$), the forward voltage ($V_F$), the average of output survival rate, the variation of forward direction voltage were 12.7 mW, 2.2V, 99%, 100%, respectively.

Example 12

The light-emitting diode of Example 12 is an example of the third embodiment, and was produced under the same condition as that of Example 3, except that Al composition of the well layer is X1=0.13 and Al composition of a barrier layer having composition expressed by formula $(Al_{X2} Ga_{1-X2})As$ ($0 < X2 \leq 1$) is X2=0.3; and that is, the light-emitting section was changed to a well layer/barrier layer made from a pair of $Al_{0.13}Ga_{0.87}As/Al_{0.3}Ga_{0.7}As$ in order to obtain emitting light peak wavelength of 760 nm.

The evaluation results of the characteristics of this light-emitting diode (light-emitting diode lamp) are shown in Table 10. An infrared light having peak wavelength 760 nm was emitted, the emitting light output ($P_o$), the forward voltage ($V_F$), the average of output survival rate, the variation of forward direction voltage were 11 mW, 1.9V, 98%, 100%, respectively.

Example 13

The light-emitting diode of Example 13 is an example of the first embodiment, and was produced under the same condition as that of Example 1, except that Al composition of the well layer is X1=0.19 and Al composition of a barrier layer having composition formula $(Al_{X2} Ga_{1-X2})As$ ($0 < X2 \leq 1$) is X2=0.35; and that is, the light-emitting section was changed to a well layer/barrier layer made from a pair of $Al_{0.19}Ga_{0.81}As/Al_{0.35}Ga_{0.65}As$ in order to obtain emitting light peak wavelength of 725 nm.

The evaluation results of the characteristics of this light-emitting diode (light-emitting diode lamp) are shown in Table 10. An red light having peak wavelength 680 nm was emitted, the emitting light output ($P_o$), the forward voltage ($V_F$), the average of output survival rate, the variation of forward direction voltage were 14 mW, 2.0V, 98%, 100%, respectively.

Example 14

The light-emitting diode of Example 14 is an example of the first embodiment, and was produced under the same condition as that of Example 1, except that Al composition of the well layer is X1=0.15 and Al composition of a barrier layer having composition formula $(Al_{X2}\ Ga_{1-X2})As$ $(0<X2\le1)$ is X2=0.30; and that is, the light-emitting section was changed to a well layer/barrier layer made from a pair of $Al_{0.14}Ga_{0.86}As/Al_{0.30}Ga_{0.70}As$ in order to obtain emitting light peak wavelength of 755 nm.

The evaluation results of the characteristics of this light-emitting diode (light-emitting diode lamp) are shown in Table 10. An red light having peak wavelength 680 nm was emitted, the emitting light output ($P_o$), the forward voltage ($V_F$), the average of output survival rate, the variation of forward direction voltage were 14.7 mW, 2.0V, 98%, 100%, respectively.

Comparative Example 1

A light-emitting diode of Comparative example 1 was formed by a liquid phase epitaxial growth method that is known in prior art. The light-emitting diode of Comparative example 1 is a substrate-removing-typed light-emitting diode having a light-emitting section of a double hetero structure having an $Al_{0.2}Ga_{0.8}As$ light-emitting layer which was formed on a GaAs substrate.

In the manufacturing of the light-emitting diode of Comparative example 1, specifically, a n-type upper clad layer made of $Al_{0.7}Ga_{0.3}As$ and having a thickness of 20 μm, an undoped light-emitting layer made of $Al_{0.2}Ga_{0.8}As$ and having a thickness of 2 μm, an p-type lower clad layer made of $Al_{0.7}Ga_{0.3}As$ and having a thickness of 20 μm, and an p-type thick-film layer made of $Al_{0.7}Ga_{0.3}As$ transparent to the emitting wavelength and having a thickness of 120 μm were formed on a n-type GaAs single crystal substrate having a (100) plane by a liquid phase epitaxial growth method. After the epitaxial growth, the GaAs substrate was removed. Next, a n-type ohmic electrode having a diameter of 100 μm was formed on the surface of the n-type AlGaAs. Next, p-type ohmic electrodes each having a diameter of 20 μm were formed at intervals of 80 μm on the back surface of the p-type AlGaAs. Next, after cutting was performed at intervals of 350 μm by a dicing saw, a light-emitting diode chip of Comparative Example 1 was manufactured by removing fractured layers by etching and rough-processing surface or side face.

The evaluation results of the characteristics of a light-emitting diode lamp in which the light-emitting diode of Comparative example 1 is mounted are shown in Table 10. As shown in Table 10, when electric current flowed between the n-type and p-type ohmic electrodes, infrared light having a peak wavelength of 730 nm was emitted. Further, forward voltage ($V_F$) when electric current of 20 mA flowed in a forward direction was about 1.9 V. Further, a light-emitting output when a forward current was set to be 20 mA was 5 mW. In addition, any samples of comparative example 1 had lower output than Examples of the present invention.

Moreover, under the condition of high temperature and high humidity of 60° C. and 90RH %, 20 mA power-on tests of twenty of the lamps were performed.

The average of output survival rate after 1000 hours later was 83%. And Variation of $V_F$ was 105%.

The output of the light-emitting diode lamp of Comparative Example 1 which was ½ of the Examples of the present invention was very low. In addition, the reliability of the Examples under the condition of high temperature and high humidity had no variation. However, as the comparative example, decrease of output and increase of $V_F$ were observed. In that case, a surface, having high concentration Al, of light-emitting diode was oxidized (corrosion), as a result, light transmission was inhibited, and resistance increased.

Example 15

The light-emitting diode of Example 15 is an example of the 6th embodiment.

At first, an epitaxial wafer was manufactured by sequentially laminating compound semiconductor layers on a GaAs substrate made of a Si-doped n-type GaAs single crystal. In the GaAs substrate, a plane inclined by 15° in a (0-1-1) direction from a (100) plane was set to be a growth plane and a carrier concentration was set to be $2\times10^{18}$ cm$^{-3}$. The thickness of GaAs substrate was 0.5 μm. The compound semiconductor layers are an n-type buffer layer made of Si-doped GaAs, an n-type contact layer made of Si-doped $(Al_{0.7}Ga_{0.3})_{0.5}In_{0.5}P$, an n-type upper clad layer made of Si-doped $(Al_{0.7}Ga_{0.3})_{0.5}In_{0.5}P$, an upper guide layer made of $Al_{0.6}Ga_{0.4}As$, well layer/barrier layer composed of $Al_{0.24}Ga_{0.76}As/Al_{0.4}Ga_{0.6}As$, a lower guide layer made of $Al_{0.6}Ga_{0.4}As$, a p-type lower clad layer made of Mg-doped $(Al_{0.7}Ga_{0.3})_{0.5}In_{0.5}P$, a thin-film intermediate layer made of $(Al_{0.5}Ga_{0.5})_{0.5}In_{0.5}P$, and a current diffusion layer made of Mg-doped p-type GaP.

In this example, the epitaxial wafer was formed by making the compound semiconductor layers epitaxially grow in the GaAs substrate having a diameter of 76 mm and a thickness of 350 μm with the use of a low-pressure metal-organic chemical vapor deposition apparatus (MOCVD apparatus). When making epitaxial growth layers grow, as a raw material of a group III constituent element, trimethylaluminum $((CH_3)_3Al)$, trimethylgallium $((CH_3)_3Ga)$, and trimethylindium $((CH_3)_3In)$ were used. Further, as a doping material of Mg, bis-cyclopentadienyl magnesium $(bis-(C_5H_5)_2Mg)$ was used. Further, as a doping material of Si, disilane $(Si_2H_6)$ was used. Further, as a raw material of a group V constituent element, phosphine $(PH_3)$ and arsine $(AsH_3)$ were used. Further, as the growth temperature of each layer, the current diffusion layer made of p-type GaP was grown at 750° C. In each of the other layers, growth was performed at 700° C.

In the buffer layer made of GaAs, a carrier concentration was set to be about $2\times10^{18}$ cm$^{-3}$ and a layer thickness was set to be about 0.5 μm. In the contact layer, a carrier concentration was set to be about $2\times10^{18}$ cm$^{-3}$ and a layer thickness was set to be about 3.5 μm. In the upper clad layer, a carrier concentration was set to be about $1\times10^{18}$ cm$^{-3}$ and a layer thickness was set to be about 0.5 μm. The upper guide layer was set to be undoped and a layer thickness was set to be about 50 nm. The well layer was set to be undoped $Al_{0.24}Ga_{0.76}As$ having a layer thickness of about 17 nm, and the barrier layer was set to be undoped $Al_{0.4}Ga_{0.6}As$ having a layer thickness of about 19 nm. Further, a well layer and a barrier layer were alternately laminated in 20 pairs. The lower guide layer was set to be undoped and a layer thickness was set to be about 50 nm. In the lower clad layer, a carrier concentration was set to be about $8\times10^{17}$ cm$^{-3}$ and a layer thickness was set to be about 0.5 μm. In the intermediate layer, a carrier concentration was set to be about $8\times10^{17}$ cm$^{-3}$ and a layer thickness was set to be about 0.05 μm. In the current diffusion layer made of GaP, a carrier concentration was set to be about $3\times10^{18}$ cm$^{-3}$ and a layer thickness was set to be about 9 μm.

Next, the current diffusion layer was mirror-finished by polishing it up to a region which reached a depth of about 1 μm from the surface. As a result of mirror-finishing, the roughness of the surface was made to be 0.18 nm. On the other hand, a functional substrate made of n-type GaP which is attached to the mirror-polished surface was prepared. As the functional substrate for attachment, a single crystal in which Si was added thereto such that a carrier concentration became about $2×10^{17}$ cm$^{-3}$, and a plane orientation was set to be (111), was used. Further, the diameter of the functional substrate was 76 mm and the thickness was 250 μm. The surface of the functional substrate was finished to have a root-mean-square value (rms) of 0.12 nm by polishing it into a mirror surface before it was bonded to the current diffusion layer.

Next, the functional substrate and the epitaxial wafer were loaded into a general semiconductor material attachment apparatus and the inside of the apparatus was evacuated until a vacuum of $3×10^{-5}$ Pa was obtained.

Next, the surfaces of both the functional substrate and the current diffusion layer were irradiated with an Ar beam neutralized by collision of electrons over three minutes. Thereafter, in the attachment apparatus in which a vacuum was maintained, the surfaces of the functional substrate and the current diffusion layer were bonded to each other at room temperature by overlapping the surfaces over each other and then applying a load thereto such that pressure on each surface became 50 g/cm$^2$. In this way, a bonded wafer was formed.

Next, the GaAs substrate and the GaAs buffer layer were selectively removed from the bonded wafer by an ammonia-based etchant. Next, AuGe, Ni alloy having a thickness of 0.5 μm, Pt having a thickness of 0.2 μm and Au having a thickness of 1 μm were formed on the surface of the contact layer as the first electrode by a vacuum deposition method. Thereafter, an n-type ohmic electrode, as a first electrode, was formed by performing patterning with the use of general photolithography means. The main light extraction surface, which was obtained by removing GaAs substrate, was then rough treated.

Next, the epitaxial layer in an area to form a p-type ohmic electrode was selectively removed, thereby exposing the current diffusion layer. On the exposed surface, the p-type ohmic electrode was formed by a vacuum deposition method such that AuBe became 0.2 μm and Au became 1 μm. Thereafter, the low-resistance p-type and n-type ohmic electrodes were formed by carrying out alloying by performing a thermal treatment at 450° C. and for 10 minutes.

The third electrode having a thickness of 0.2 μm and a size of 230 μm×230 μm was formed on the functional substrate.

Next, from the backside of the functional substrate, the functional substrate is processed by performing a V-shaped groove in the surface in which the third electrode is not formed by using dice cutting saw, wherein the V-shaped groove has an inclined plane having an angle α of 70 degrees and a perpendicular plane having a thickness of 80 μm. Secondly, the substrate was cut from the side of compound semiconductor layer in an interval of 350 μm by using dice cutting saw, and chips were formed. And then, a crush layer and fouling, which were yielded during the dice cutting, were etched with a mixed solution of sulfuric acid and hydrogen peroxide. And then, the light-emitting diode of Example 15 was obtained.

One hundred pieces of the light-emitting diode lamps each having the light-emitting diode chip of Example 15 manufactured as described above mounted on a mount substrate were assembled. The light-emitting diode lamp was produced by keeping a mount substrate by a die-bonder (mount), wire-bonding a n-type ohmic electrode of the light-emitting diode and a n-electrode terminal of the mount substrate by a gold wire, wire-bonding the p-type ohmic electrode to a p-electrode terminal by a gold wire, and then performing sealing with a general silicon resin.

The evaluation results of the characteristics of the light-emitting diode (the light-emitting diode lamp) are shown in Table 11.

As shown in Table 11, when electric current flowed between the n-type and p-type ohmic electrodes, infrared light having a peak wavelength of 700 nm was emitted. A forward voltage ($V_F$) was about 2.0 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 13 mW.

Moreover, under the condition of high temperature and high humidity of 60° C. and 90RH %, 20 mA power-on tests of twenty of the lamps were performed.

The average of output survival rate after 1000 hours later was 98%. There was no variation of $V_F$, and it was 100%.

TABLE 11

| | Device Structure | Substrate | Barrier Layer | $λ_P$ (nm) | Po (20 mA) | $V_F$ (20 mA) | Reliability Po: % | Reliability $V_F$: % |
|---|---|---|---|---|---|---|---|---|
| Example 15 | Transparent | GaP | AlGaAs | 700 | 13.0 | 2.0 | 98 | 100 |
| Example 16 | Transparent | GaP | AlGaInP | 700 | 11.2 | 2.2 | 99 | 100 |
| Example 17 | Reflection | Si | AlGaAs | 700 | 9.0 | 1.9 | 98 | 100 |
| Example 18 | Reflection | Cu/Mo/Cu | AlGaAs | 700 | 9.0 | 1.9 | 99 | 100 |
| Example 19 | Reflection | Si | AlGaInP | 700 | 8.2 | 2.2 | 100 | 100 |
| Example 20 | Transparent | GaP | AlGaAs | 680 | 11.0 | 2.0 | 99 | 100 |
| Example 21 | Transparent | GaP | AlGaInP | 680 | 9.6 | 2.2 | 100 | 100 |
| Example 22 | Reflection | Si | AlGaAs | 680 | 8.0 | 1.9 | 98 | 100 |
| Example 23 | Reflection | Si | AlGaInP | 680 | 7.2 | 2.2 | 100 | 100 |
| Example 24 | Transparent | GaP | AlGaAs | 720 | 14.0 | 2.0 | 100 | 100 |
| Example 25 | Transparent | GaP | AlGaInP | 720 | 12.0 | 2.2 | 99 | 100 |
| Example 26 | Transparent | GaP | AlGaAs | 660 | 8.0 | 2.0 | 98 | 100 |
| Example 27 | Transparent | GaP | AlGaInP | 660 | 7.6 | 2.3 | 100 | 100 |
| Comparative example 2 | Liquid phase epitaxial | AlGaAs | | 700 | 3.8 | 1.9 | 78 | 105 |
| Comparative example 3 | Liquid phase epitaxial | AlGaAs | | 680 | 2.8 | 1.9 | 74 | 107 |

Example 16

The light-emitting diode of Example 16 is an example of the 7th embodiment.

The condition was the same as that of Example 15 except that the compound semiconductor layer was formed by the following condition.

In the GaAs substrate made of a Si-doped n-type GaAs single crystal, a plane inclined by 15° in a (0-1-1) direction from a (100) plane was set to be a growth plane and a carrier concentration was set to be $2\times10^{18}$ cm$^{-3}$. The thickness of GaAs substrate was 0.5 μm. The compound semiconductor layers are an n-type buffer layer made of Si-doped GaAs, an n-type contact layer made of Si-doped $(Al_{0.7}Ga_{0.3})_{0.5}In_{0.5}P$, an n-type upper clad layer made of Si-doped $(Al_{0.7}Ga_{0.3})_{0.5}In_{0.5}P$, an upper guide layer made of $(Al_{0.3}Ga_{0.7})_{0.5}In_{0.5}P$, well layer/barrier layer composed of 20 pairs of $Al_{0.24}Ga_{0.76}As/(Al_{0.1}Ga_{0.9})_{0.5}In_{0.5}P$, a lower guide layer made of $(Al_{0.3}Ga_{0.7})_{0.5}In_{0.5}P$, a p-type lower clad layer made of Mg-doped $(Al_{0.7}Ga_{0.3})_{0.5}In_{0.5}P$, a thin-film intermediate layer made of $(Al_{0.5}Ga_{0.5})_{0.5}In_{0.5}P$, and a current diffusion layer made of Mg-doped p-type GaP.

In the buffer layer made of GaAs, a carrier concentration was set to be about $2\times10^{18}$ cm$^{-3}$ and a layer thickness was set to be about 0.5 μm. In the contact layer, a carrier concentration was set to be about $2\times10^{18}$ cm$^{-3}$ and a layer thickness was set to be about 3.5 μm. In the upper clad layer, a carrier concentration was set to be about $1\times10^{18}$ cm$^{-3}$ and a layer thickness was set to be about 0.5 μm. The upper guide layer was set to be undoped and a layer thickness was set to be about 50 nm. The well layer was set to be undoped $Al_{0.24}Ga_{0.76}As$ having a layer thickness of about 17 nm, and the barrier layer was set to be undoped $(Al_{0.1}Ga_{0.9})_{0.5}In_{0.5}P$ having a layer thickness of about 19 nm. Further, a well layer and a barrier layer were alternately laminated in 20 pairs. The lower guide layer was set to be undoped and a layer thickness was set to be about 50 nm. In the lower clad layer, a carrier concentration was set to be about $8\times10^{17}$ cm$^{-3}$ and a layer thickness was set to be about 0.5 μm. In the intermediate layer, a carrier concentration was set to be about $8\times10^{17}$ cm$^{-3}$ and a layer thickness was set to be about 0.05 μm. In the current diffusion layer made of GaP, a carrier concentration was set to be about $3\times10^{18}$ cm$^{-3}$ and a layer thickness was set to be about 9 μm.

The evaluation results of the characteristics of the light-emitting diode (the light-emitting diode lamp) are shown in Table 11.

As shown in Table 11, when electric current flowed between the n-type and p-type ohmic electrodes, infrared light having a peak wavelength of 700 nm was emitted. A forward voltage ($V_F$) was about 2.2 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 11.2 mW.

Moreover, under the condition of high temperature and high humidity of 60° C. and 90RH %, 20 mA power-on tests of twenty of the lamps were performed.

The average of output survival rate after 1000 hours later was 99%. There was no variation of $V_F$, and it was 100%.

Example 17

Light-emitting diode of Example 17 is an example of the 8th embodiment, in which a functional substrate including a reflection layer was bonded with a current diffusion layer. As shown in FIGS. 8A and 8B, a method of forming the light-emitting diode of Example 17 was explained. In addition, in the FIGS. 8A and 8B, the lower guide layer and the upper guide layer were not shown.

The compound semiconductor layer was formed in the same condition as that of Example 15.

Next, on the surface of current diffusion layer 8, eight electrodes 21 made from AuBe/Au alloy at dot shape having a thickness of 0.2 μm and a diameter of 20 μm, were placed in the same interval and at a distance of 50 μm from the end of the light extraction surface.

Next, ITO layer 22 as a transparent conducting layer having a thickness of 0.4 μm was formed by a sputtering method. Layer 23 made from silver alloy/Ti/Au in thickness of 0.2 μm/0.1 μm/1 μm was formed as reflection layer 23.

On the other hand, layer 32 made from Ti/Au/In in thickness of 0.1 μm/0.5 μm/0.3 μm was formed on the surface of silicon substrate 31. Layer 33 made from Ti/Au in thickness of 0.1 μm/0.5 μm was formed on the backside of the silicon substrate 31. The Au surface of the light-emitting diode wafer and the In surface of the silicon substrate were overlapped, and pressurized under a temperature of 320° C. and pressure of 500 g/cm², as a result, the functional substrate was bonded to the light-emitting diode wafer.

After GaAs substrate was removed, on the surface of the contact layer 16, a ohmic electrode 25 made from AuGe/Au, having a diameter of 100 μm and thickness of 3 μm was formed. And then p, n ohmic electrodes were performed by an alloying-process of heat-treatment under 420° C. for five minutes.

Next, the surface of contact layer 16 was rough-processed.

After removing the semiconductor layer, reflection layer of segment, and eutectic metal on the section to be dice cut, a silicon substrate was cut in a 350 μm pitch to obtain a regular square by using a dice cutting saw.

The evaluation results of the characteristics of the light-emitting diode (the light-emitting diode lamp) are shown in Table 11.

As shown in Table 11, when electric current flowed between the n-type and p-type ohmic electrodes, infrared light having a peak wavelength of 700 nm was emitted. A forward voltage ($V_F$) was about 1.9 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 9 mW.

Moreover, under the condition of high temperature and high humidity of 60° C. and 90RH %, 20 mA power-on tests of twenty of the lamps were performed.

The average of output survival rate after 1000 hours later was 98%. There was no variation of $V_F$, and it was 100%.

Example 18

The light-emitting diode of Example 18 is an example of the 9th embodiment, in which a current diffusion layer was bonded with a functional substrate including a reflection layer and a metal substrate. As shown in FIG. 9, light-emitting diode of Example 18 is described.

At first, a metal substrate was produced. It was produced by preparing two approximately flat Cu boards of thickness 10 μm and one approximately flat Mo board of thickness 75 μm, inserting the Mo board into the two pieces of Cu boards to overlap the three boards, placing them into a pressure-applying apparatus, and applying load to the metal boards at high temperature in the thickness direction. As a result, a metal substrate including three layers of Cu (10 μm)/Mo (75 μm)/Cu (10 μm) was produced.

The compound semiconductor layer was formed by the same method of Example 1, except that between the buffer layer and contact layer an etch stop layer made form Si-doped $(Al_{0.5}Ga_{0.5})0.5In_{0.5}P$ with a thickness of 0.5 μm was formed.

On the surface 8b of the current diffusion layer 8, second electrodes 57 were formed in the same interval of 60 μm by laminating Au having a thickness of 0.2 μm on AuBe having a thickness of 0.4 μm, wherein the second electrodes 57 was a columnar shape having a diameter of 20 μm.

Next, an ITO layer 52 as a transparent conducting layer was formed by a sputtering method in thickness of 0.8 μm to cover second anode 57.

Next, on ITO layer 52, a reflection coating 53 was produced by forming a layer made from silver (Ag) alloy having a thickness of 0.7 μm by a vaporization method, and then, forming a layer made from nickel (Ni)/Titanium (Ti) having a thickness of 0.5 μm, and then and a layer made from gold (Au) having a thickness of 1 μm.

A bonding structure was formed by placing the structure made of ITO layer 52 and reflection coating 53a on the current diffusion layer 8 of the compound semiconductor layer and the metal substrate so as to make them face each other; transferring them into vacuum chamber; bonding them at 400° C. by using a 500 kg load.

And then, from a bonding structure, the GaAs substrate and the buffer layer which is used as a growth substrate of the compound semiconductor layer were removed by ammonia type etchant selectively. The etching stop layer was removed by HCl type etchant selectively.

Next, on a contact layer, a conducting layer for a first electrode was formed using vacuum deposition method by forming an AuGe layer having a thickness of 0.15 μm, and then forming Ni layer having a thickness of 0.05 μm, and moreover forming an Au layer having a thickness of 1 μm more. By using photolithography method, a first electrode 55 having a thickness 3 μm and diameter of 100 μm was produced by patterning the conducting layer for electrode to the shape of circle in planar view.

Contact layer 56 was formed by etching a section of contact layer except for the section below the first electrode, by using ammonia type etchant and using the first electrode as mask.

After removing the semiconductor layer, reflection layer of segment, and eutectic metal on the section to be dice cut, a silicon substrate was cut in a 350 μm pitch to obtain a regular square by using a dice cutting saw.

The evaluation results of the characteristics of the light-emitting diode (the light-emitting diode lamp) are shown in Table 11.

As shown in Table 11, when electric current flowed between the n-type and p-type ohmic electrodes, infrared light having a peak wavelength of 700 nm was emitted. A forward voltage ($V_F$) was about 1.9 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 9 mW.

Moreover, under the condition of high temperature and high humidity of 60° C. and 90RH %, 20 mA power-on tests of twenty of the lamps were performed.

The average of output survival rate after 1000 hours later was 99%. There was no variation of $V_F$, and it was 100%.

Example 19

Light-emitting diode of Example 19 is an example of the 10th embodiment.

The compound semiconductor layer was formed in the same condition as that of Example 16, and the other conditions are the same as Example 17.

The evaluation results of the characteristics of the light-emitting diode (the light-emitting diode lamp) are shown in Table 11.

As shown in Table 11, when electric current flowed between the n-type and p-type ohmic electrodes, infrared light having a peak wavelength of 700 nm was emitted. A forward voltage ($V_F$) was about 2.2 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 8.2 mW.

Moreover, under the condition of high temperature and high humidity of 60° C. and 90RH %, 20 mA power-on tests of twenty of the lamps were performed.

The average of output survival rate after 1000 hours later was 100%. There was no variation of $V_F$, and it was 100%.

Example 20

The light-emitting diode of Example 20 is an example of the 6th embodiment, and was produced under the same condition as that of Example 15, except that Al composition of the well layer is X1=0.28 and Al composition of a barrier layer having composition formula $(Al_{X2} Ga_{1-X2})As$ (0<X2≤1) is X2=0.45; and that is, the light-emitting section was changed to a well layer/barrier layer made from a pair of $Al_{0.28}Ga_{0.72}As/Al_{0.45}Ga_{0.55}As$ in order to obtain emitting light peak wavelength of 680 nm.

The evaluation results of the characteristics of this light-emitting diode (light-emitting diode lamp) are shown in Table 11. An red light having peak wavelength 680 nm was emitted, the emitting light output ($P_o$), the forward voltage ($V_F$), the average of output survival rate, the variation of forward direction voltage were 11 mW, 2V, 99%, 100%, respectively.

Example 21

The light-emitting diode of Example 21 is an example of the 7th embodiment, and was produced under the same condition as that of Example 15, except that Al composition of the well layer is X1=0.28 and Al composition of a barrier layer having composition expressed by the composition formula of $(Al_{X4} Ga_{1-X4})_{Y2} In_{1-Y2} P$ (0≤X4≤1, 0<Y2≤1) is X4=0.1, Y2=0.5; and that is, the light-emitting section was changed to a well layer/barrier layer made from a pair of $Al_{0.28}Ga_{0.72}As/(Al_{0.1}Ga_{0.9})_{0.5}In_{0.5}P$ in order to obtain emitting light peak wavelength of 680 nm.

The evaluation results of the characteristics of this light-emitting diode (light-emitting diode lamp) are shown in Table 11. An red light having peak wavelength 680 nm was emitted, the emitting light output ($P_o$), the forward voltage ($V_F$), the average of output survival rate, the variation of forward direction voltage were 9.6 mW, 2.2V, 100%, 100%, respectively.

Example 22

The light-emitting diode of Example 22 is an example of the 8th embodiment, and was produced under the same condition as that of Example 17, except that Al composition of the well layer is X1=0.28 and Al composition of a barrier layer having composition formula $(Al_{X2} Ga_{1-X2})As$ $(0<X2≤1)$ is X2=0.45; and that is, the light-emitting section was changed to a well layer/barrier layer made from a pair of $Al_{0.28}Ga_{0.72}As/Al_{0.45}Ga_{0.55}As$ in order to obtain emitting light peak wavelength of 680 nm.

The evaluation results of the characteristics of this light-emitting diode (light-emitting diode lamp) are shown in Table 11. An red light having peak wavelength 680 nm was emitted, the emitting light output ($P_o$), the forward voltage ($V_F$), the average of output survival rate, the variation of forward direction voltage were 8 mW, 1.9V, 98%, 100%, respectively.

Example 23

The light-emitting diode of Example 23 is an example of the 10th embodiment, and was produced under the same condition as that of Example 17, except that Al composition of the well layer is X1=0.28 and Al composition of a barrier layer having composition expressed by the composition formula of $(Al_{X4} Ga_{1-X4})_{Y2} In_{1-Y2} P$ $(0≤X4≤1, 0<Y2≤1)$ is X4=0.1, Y2=0.5; and that is, the light-emitting section was changed to a well layer/barrier layer made from a pair of $Al_{0.28}Ga_{0.72}As/(Al_{0.1}Ga_{0.9})_{0.5}In_{0.5}P$ in order to obtain emitting light peak wavelength of 680 nm.

The evaluation results of the characteristics of this light-emitting diode (light-emitting diode lamp) are shown in Table 10. An red light having peak wavelength 680 nm was emitted, the emitting light output ($P_o$), the forward voltage ($V_F$), the average of output survival rate, the variation of forward direction voltage were 7.2 mW, 2.2V, 100%, 100%, respectively.

Example 24

The light-emitting diode of Example 24 is an example of the 6th embodiment, and was produced under the same condition as that of Example 15, except that Al composition of the well layer is X1=0.2 and Al composition of a barrier layer having composition formula $(Al_{X2} Ga_{1-X2})As$ $(0<X2≤1)$ is X2=0.4; and that is, the light-emitting section was changed to a well layer/barrier layer made from a pair of $Al_{0.2}Ga_{0.8}As/Al_{0.4}Ga_{0.6}As$ in order to obtain emitting light peak wavelength of 720 nm.

The evaluation results of the characteristics of this light-emitting diode (light-emitting diode lamp) are shown in Table 11. An red light having peak wavelength 720 nm was emitted, the emitting light output ($P_o$), the forward voltage ($V_F$), the average of output survival rate, the variation of forward direction voltage were 14 mW, 2V, 100%, 100%, respectively.

Example 25

The light-emitting diode of Example 25 is an example of the 7th embodiment, and was produced under the same condition as that of Example 16, except that Al composition of the well layer is X1=0.2 and Al composition of a barrier layer having composition expressed by the composition formula of $(Al_{X4} Ga_{1-X4})_{Y2} In_{1-Y2} P$ $(0≤X4≤1, 0<Y2≤1)$ is X4=0.1, Y2=0.5; and that is, the light-emitting section was changed to a well layer/barrier layer made from a pair of $Al_{0.2}Ga_{0.8}As/(Al_{0.1}Ga_{0.9})_{0.5}In_{0.5}P$ in order to obtain emitting light peak wavelength of 720 nm.

The evaluation results of the characteristics of this light-emitting diode (light-emitting diode lamp) are shown in Table 10. An red light having peak wavelength 720 nm was emitted, the emitting light output ($P_o$), the forward voltage ($V_F$), the average of output survival rate, the variation of forward direction voltage were 12 mW, 2.2V, 99%, 100%, respectively.

Example 26

The light-emitting diode of Example 26 is an example of the 6th embodiment, and was produced under the same condition as that of Example 15, except that Al composition of the well layer is X1=0.33 and Al composition of a barrier layer having composition formula $(Al_{X2} Ga_{1-X2})As$ $(0<X2≤1)$ is X2=0.45; and that is, the light-emitting section was changed to a well layer/barrier layer made from a pair of $Al_{0.33}Ga_{0.67}As/Al_{0.45}Ga_{0.55}As$ in order to obtain emitting light peak wavelength of 660 nm.

The evaluation results of the characteristics of this light-emitting diode (light-emitting diode lamp) are shown in Table 11. An red light having peak wavelength 660 nm was emitted, the emitting light output ($P_o$), the forward voltage ($V_F$), the average of output survival rate, the variation of forward direction voltage were 8 mW, 2V, 98%, 100%, respectively.

Example 27

The light-emitting diode of Example 27 is an example of the 7th embodiment, and was produced under the same condition as that of Example 15, except that Al composition of the well layer is X1=0.33 and Al composition of a barrier layer having composition expressed by the composition formula of $(Al_{X4} Ga_{1-X4})_{Y2} In_{1-Y2} P$ $(0≤X4≤1, 0<Y2≤1)$ is X4=0.1, Y2=0.5; and that is, the light-emitting section was changed to a well layer/barrier layer made from a pair of $Al_{0.33}Ga_{0.67}As/(Al_{0.1}Ga_{0.9})_{0.5}In_{0.5}P$ in order to obtain emitting light peak wavelength of 660 nm.

The evaluation results of the characteristics of this light-emitting diode (light-emitting diode lamp) are shown in Table 11. An red light having peak wavelength 660 nm was emitted, the emitting light output ($P_o$), the forward voltage ($V_F$), the average of output survival rate, the variation of forward direction voltage were 7.6 mW, 2.3V, 100%, 100%, respectively.

Comparative Example 2

The light-emitting diode of Comparative example 2 is AlGaAs-based and high-brightness-typed light-emitting diode. The light-emitting diode is a substrate-removing-typed light-emitting diode having a light-emitting section of a double hetero structure.

At first, on GaAs substrate, AlGaAs layer was formed by liquid phase epitaxial growth method using a slider boat type growth device.

A p-type GaAs substrate was set in the groove for holding a substrate in the slider boat type growth device. Ga metal, GaAs poly-crystal, Al metal and dopant were put in the crucibles for each layer growth. A growth layer was a four-layers structure including a thick transparent layer (a first p-type layer), a lower clad layer (a p-type clad layer), an active layer, an upper clad layer (a n-type clad layer), and growth layer was formed in this order.

The slider boat type growth device in which the above-mentioned materials were set, was placed in a quartz reaction tube, and it was heated to 950° C. under hydrogen atmosphere. After the materials were melt, the atmosphere temperature was decreased to 910° C. After the slider was pushed right into contact with the material solutions (melt), the temperature was decreased at the rate of 0.5° C./min to a predeterminated temperature. After that, the slider was pushed again into contact with each material solutions and the step of decreasing temperature was repeated. Finally, after contact with the melt solution, the atmosphere temperature was decreased to 700° C. to form n-type clad layer. After that, the slider was pushed the material solutions and a wafer were separated, and the epitaxial growth was terminated.

The structure of the resulting epitaxial growth layer includes a first p-type layer having Al composition X1=0.36-0.45, a thickness of 55 µm and a carrier concentration of $9\times10^{17}$ cm$^{-3}$, a p-type clad layer having Al composition X2=0.4-0.5, a thickness of 70 µm and a carrier concentration of $5\times10^{17}$ cm$^{-3}$, a p-type active layer having emitting wavelength of 700 nm, X2=0.4-0.5, a thickness of 1 µm and a carrier concentration of $1\times10^{18}$ cm$^{-3}$ and a n-type clad layer having Al composition X4=0.4-0.5, a thickness of 28 µm and a carrier concentration of $5\times10^{17}$ cm$^{-3}$.

After the epitaxial growth termination, the epitaxial substrate was taken out. After the surface of thick transparent layer of the n-type AlGaAs was protected, the GaAs substrate was removed selectively by using an ammonia-hydrogen-peroxide-based etchant. As a result, the light-emitting diode was produced, in which the surface having exposed p-type AlGaAs layer was used as back surface of the diode and the surface having transparent n-type AlGaAs layer was used as front surface.

On front surface of the epitaxial wafer, Au alloy/Au electrode was formed. By using a electrode mask having an interval of 350 µm, a surface electrode including a pad for wire bonding having a diameter of 100 µm which was placed centrally, was provided. On the back surface of the epitaxial wafer, Au alloy/Au electrode was also formed. An ohmic electrode having a diameter of 20 µm was formed at intervals of 80 µm. After dicing separation and etching, a light-emitting diode having a size of 320 µm×320 µm and having n-type AlGaAs layer as a front surface was produced.

The evaluation results of the characteristics of the light-emitting diode lamp in which the light-emitting diode of Comparative Example 2 was mounted are shown in Table 11.

As shown in Table 11, when electric current flowed between the n-type and p-type ohmic electrodes, infrared light having a peak wavelength of 700 nm was emitted. A forward voltage ($V_F$) was about 1.9 V, when electric current of 20 mA flowed in a forward direction. A light-emitting output when a forward current was set to be 20 mA was 3.8 mW.

Moreover, under the condition of high temperature and high humidity of 60° C. and 90RH %, 20 mA power-on tests of twenty of the lamps were performed.

The average of output survival rate after 1000 hours later was 78%. There was variation of $V_F$, and it was 105%.

Comparative Example 3

The evaluation results of the light-emitting diode, in which the active layer was adjusted to obtain emitting wavelength of 680 nm, by using the same method as that of Comparative Example 2, are shown in Table 11.

The emitting light output ($P_o$), the forward voltage ($V_F$), the average of output survival rate, the variation of forward direction voltage were 2.8 mW, 1.9V, 74%, 107%, respectively.

The output of the light-emitting diode lamp of Comparative Example which was ½ of the Examples of the present invention was very low. In addition, the reliability of the Examples under the condition of high temperature and high humidity had no variation. However, as the Comparative Example, decrease of output and increase of $V_F$ were observed. In that case, a surface, having high concentration Al, of light-emitting diode was oxidized (corrosion), as a result, light transmission was inhibited, and resistance increased.

Example 28

The light-emitting diode of Example 28 is an example of the 11th embodiment.

At first, an epitaxial wafer having emitting wavelength of 830 nm was manufactured by sequentially laminating compound semiconductor layers on a GaAs substrate made of a Si-doped n-type GaAs single crystal. In the GaAs substrate, a plane inclined by 15° in a (0-1-1) direction from a (100) plane was set to be a growth plane and a carrier concentration was set to be $2\times10^{18}$ cm$^{-3}$. The thickness of GaAs substrate was 0.5 µm. The compound semiconductor layers are an n-type buffer layer made of Si-doped GaAs, an n-type contact layer made of Si-doped $(Al_{0.7}Ga_{0.3})_{0.5}In_{0.5}P$, an n-type upper clad layer made of Si-doped $(Al_{0.7}Ga_{0.3})_{0.5}In_{0.5}P$, an upper guide layer made of $Al_{0.3}Ga_{0.7}As$, well layer/barrier layer composed of $Al_{0.03}Ga_{0.97}As/Al_{0.2}Ga_{0.8}As$, a lower guide layer made of $Al_{0.3}Ga_{0.7}As$, a p-type lower clad layer made of Mg-doped $(Al_{0.7}Ga_{0.3})_{0.5}In_{0.5}P$, a thin-film intermediate layer made of $(Al_{0.5}Ga_{0.5})_{0.5}In_{0.5}P$, and a current diffusion layer made of Mg-doped p-type GaP.

In this example, the epitaxial wafer was formed by making the compound semiconductor layers epitaxially grow in the GaAs substrate having a diameter of 76 mm and a thickness of 350 µm with the use of a low-pressure metal-organic chemical vapor deposition apparatus (MOCVD apparatus). When making epitaxial growth layers grow, as a raw material of a group III constituent element, trimethylaluminum (($CH_3)_3Al$), trimethylgallium (($CH_3)_3Ga$), and trimethylindium (($CH_3)_3In$) were used. Further, as a doping material of Mg, bis-cyclopentadienyl magnesium (bis-$(C_5H_5)_2Mg$) was used. Further, as a doping material of Si, disilane ($Si_2H_6$) was used. Further, as a raw material of a group V constituent element, phosphine ($PH_3$) and arsine ($AsH_3$) were used. Further, as the growth temperature of each layer, the current diffusion layer made of p-type GaP was grown at 750° C. In each of the other layers, growth was performed at 700° C.

In the buffer layer made of GaAs, a carrier concentration was set to be about $2\times10^{18}$ cm$^{-3}$ and a layer thickness was set to be about 0.5 µm. In the contact layer, a carrier concentration was set to be about $2\times10^{18}$ cm$^{-3}$ and a layer thickness was set to be about 3.5 µm. In the upper clad layer, a carrier concentration was set to be about $1\times10^{18}$ cm$^{-3}$ and a layer thickness was set to be about 0.5 µm. The upper guide layer was set to be undoped and a layer thickness was set to be about 50 nm. The well layer was set to be undoped $Al_{0.03}Ga_{0.97}As$ having a layer thickness of about 17 nm, and the barrier layer was set to be undoped $Al_{0.2}Ga_{0.8}As$ having a layer thickness of about 19 nm. Further, a well layer and a barrier layer were alternately laminated in 20 pairs. The lower guide layer was set to be undoped and a layer thickness was set to be about 50 nm. In the lower clad layer, a carrier concentration was set to be about $8\times10^{17}$ cm$^{-3}$ and a layer thickness was set to be about 0.5 µm. In the intermediate layer, a carrier concentration was set to be about $8\times10^{17}$ cm$^{-3}$ and a layer thickness was set to be about 0.05 µm. In the current diffusion layer made of GaP, a carrier concentration was set to be about $3\times10^{18}$ cm$^{-3}$ and a layer thickness was set to be about 9 μm.

Next, the current diffusion layer was mirror-finished by polishing it up to a region which reached a depth of about 1 μm from the surface. As a result of mirror-finishing, the roughness of the surface was made to be 0.18 nm. On the other hand, a functional substrate made of n-type GaP which is attached to the mirror-polished surface was prepared. As the functional substrate for attachment, a single crystal in which Si was added thereto such that a carrier concentration became about $2\times10^{17}$ cm$^{-3}$, and a plane orientation was set to be (111), was used. Further, the diameter of the functional substrate was 76 mm and the thickness was 250 μm. The surface of the functional substrate was finished to have a root-mean-square value (rms) of 0.12 nm by polishing it into a mirror surface before it was bonded to the current diffusion layer.

Next, the functional substrate and the epitaxial wafer were loaded into a general semiconductor material attachment apparatus and the inside of the apparatus was evacuated until a vacuum of $3\times10^{-5}$ Pa was obtained.

Next, the surfaces of both the functional substrate and the current diffusion layer were irradiated with an Ar beam neutralized by collision of electrons over three minutes. Thereafter, in the attachment apparatus in which a vacuum was maintained, the surfaces of the functional substrate and the current diffusion layer were bonded to each other at room temperature by overlapping the surfaces over each other and then applying a load thereto such that pressure on each surface became 50 g/cm$^2$. In this way, a bonded wafer was formed.

Next, the GaAs substrate and the GaAs buffer layer were selectively removed from the bonded wafer by an ammonia-based etchant. Next, AuGe, Ni alloy having a thickness of 0.5 μm, Pt having a thickness of 0.2 μm and Au having a thickness of 1 μm were formed on the surface of the contact layer as the first electrode by a vacuum deposition method. Thereafter, an n-type ohmic electrode, as a first electrode, was formed by performing patterning with the use of general photolithography means. The main light extraction surface, which was obtained by removing GaAs substrate, was then rough treated.

Next, the epitaxial layer in an area to form a p-type ohmic electrode was selectively removed, thereby exposing the current diffusion layer. On the exposed surface, the p-type ohmic electrode was formed by a vacuum deposition method such that AuBe became 0.2 μm and Au became 1 μm. Thereafter, the low-resistance p-type and n-type ohmic electrodes were formed by carrying out alloying by performing a thermal treatment at 450° C. and for 10 minutes.

The third electrode having a thickness of 0.2 μm and a size of 230 μm×230 μm was formed on the functional substrate.

Next, from the backside of the functional substrate, the functional substrate is processed by performing a V-shaped groove in the surface in which the third electrode is not formed by using dice cutting saw, wherein the V-shaped groove has an inclined plane having an angle α of 70 degrees and a perpendicular plane having a thickness of 80 μm. Secondly, the substrate was cut from the side of compound semiconductor layer in an interval of 350 μm by using dice cutting saw, and chips were formed. And then, a crush layer and fouling, which were yielded during the dice cutting, were etched with a mixed solution of sulfuric acid and hydrogen peroxide. And then, the light-emitting diode of Example 15 was obtained.

One hundred pieces of the light-emitting diode lamps each having the light-emitting diode chip of Example 28 manufactured as described above mounted on a mount substrate were assembled. The light-emitting diode lamp was produced by keeping a mount substrate by a die-bonder (mount), wire-bonding a n-type ohmic electrode of the light-emitting diode and a n-electrode terminal of the mount substrate by a gold wire, wire-bonding the p-type ohmic electrode to a p-electrode terminal by a gold wire, and then performing sealing with a general epoxy resin.

The evaluation results of the characteristics of the light-emitting diode (the light-emitting diode lamp) are shown in Table 12.

As shown in Table 12, when electric current flowed between the n-type and p-type ohmic electrodes, infrared light having a peak wavelength of 830 nm was emitted. A forward voltage ($V_F$) was about 2.0 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 16 mW.

Moreover, under the condition of high temperature and high humidity of 60° C. and 90RH %, 20 mA power-on tests of twenty of the lamps were performed.

The average of output survival rate after 1000 hours later was 98%. There was no variation of $V_F$, and it was 100%.

TABLE 12

| | Device Structure | Substrate | Barrier Layer | $\lambda_P$ (nm) | Po (20 mA) | $V_F$ (20 mA) | Reliability Po: % | Reliability $V_F$: % |
|---|---|---|---|---|---|---|---|---|
| Example 28 | Transparent | GaP | AlGaAs | 830 | 16.0 | 2.0 | 98 | 100 |
| Example 29 | Transparent | GaP | AlGaInP | 830 | 13.1 | 2.2 | 99 | 100 |
| Example 30 | Reflection | Si | AlGaAs | 830 | 12.0 | 1.9 | 98 | 100 |
| Example 31 | Reflection | Cu/Mo/Cu | AlGaAs | 830 | 12.0 | 1.9 | 98 | 100 |
| Example 32 | Reflection | Si | AlGaInP | 830 | 10.7 | 2.1 | 100 | 100 |
| Example 33 | Transparent | GaP | AlGaAs | 760 | 15.0 | 2.0 | 98 | 100 |
| Example 34 | Transparent | GaP | AlGaInP | 760 | 12.7 | 2.2 | 99 | 100 |
| Example 35 | Reflection | Si | AlGaAs | 760 | 11.0 | 1.9 | 98 | 100 |
| Example 36 | Reflection | Si | AlGaInP | 760 | 9.8 | 2.1 | 100 | 100 |
| Example 37 | Transparent | GaP | AlGaAs | 800 | 17.0 | 2.0 | 98 | 100 |
| Example 38 | Transparent | GaP | AlGaInP | 800 | 13.5 | 2.2 | 99 | 100 |
| Example 39 | Reflection | Si | AlGaAs | 800 | 13.0 | 1.9 | 98 | 100 |
| Example 40 | Reflection | Si | AlGaInP | 800 | 10.8 | 2.1 | 100 | 100 |
| Example 41 | Transparent | GaP | AlGaAs | 850 | 14.0 | 2.0 | 98 | 100 |
| Example 42 | Transparent | GaP | AlGaInP | 850 | 12.2 | 2.2 | 99 | 100 |
| Example 43 | Reflection | Si | AlGaAs | 850 | 10.0 | 1.9 | 98 | 100 |
| Example 44 | Reflection | Si | AlGaInP | 850 | 9.8 | 2.1 | 100 | 100 |
| Comparative example 4 | Liquid phase epitaxial | AlGaAs | | 760 | 5.0 | 1.9 | 78 | 105 |

TABLE 12-continued

| | Device Structure | Substrate | Barrier Layer | $\lambda_P$ (nm) | Po (20 mA) | $V_F$ (20 mA) | Reliability Po: % | Reliability $V_F$: % |
|---|---|---|---|---|---|---|---|---|
| Comparative example 5 | Liquid phase epitaxial | AlGaAs | | 800 | 5.5 | 1.9 | 74 | 107 |
| Comparative example 6 | Liquid phase epitaxial | AlGaAs | | 830 | 6.0 | 1.9 | 74 | 107 |
| Comparative example 7 | Liquid phase epitaxial | AlGaAs | | 850 | 6.0 | 1.9 | 74 | 107 |

Example 29

The light-emitting diode of Example 29 is an example of the 12th embodiment.

The condition was the same as that of Example 28 except that the compound semiconductor layer was formed by the following condition.

In the GaAs substrate made of a Si-doped n-type GaAs single crystal, a plane inclined by 15° in a (0-1-1) direction from a (100) plane was set to be a growth plane and a carrier concentration was set to be $2\times10^{18}$ cm$^{-3}$. The thickness of GaAs substrate was 0.5 μm. The compound semiconductor layers are an n-type buffer layer made of Si-doped GaAs, an n-type contact layer made of Si-doped $(Al_{0.7}Ga_{0.3})_{0.5}In_{0.5}P$, an n-type upper clad layer made of Si-doped $(Al_{0.7}Ga_{0.3})_{0.5}In_{0.5}P$, an upper guide layer made of $(Al_{0.3}Ga_{0.7})_{0.5}In_{0.5}P$, well layer/barrier layer composed of 20 pairs of $Al_{0.03}Ga_{0.97}As/(Al_{0.1}Ga_{0.9})_{0.5}In_{0.5}P$, a lower guide layer made of $(Al_{0.3}Ga_{0.7})_{0.5}In_{0.5}P$, a p-type lower clad layer made of Mg-doped $(Al_{0.7}Ga_{0.3})_{0.5}In_{0.5}P$, a thin-film intermediate layer made of $(Al_{0.5}Ga_{0.5})_{0.5}In_{0.5}P$, and a current diffusion layer made of Mg-doped p-type GaP.

In the buffer layer made of GaAs, a carrier concentration was set to be about $2\times10^{18}$ cm$^{-3}$ and a layer thickness was set to be about 0.5 μm. In the contact layer, a carrier concentration was set to be about $2\times10^{18}$ cm$^{-3}$ and a layer thickness was set to be about 3.5 μm. In the upper clad layer, a carrier concentration was set to be about $1\times10^{18}$ cm$^{-3}$ and a layer thickness was set to be about 0.5 μm. The upper guide layer was set to be undoped and a layer thickness was set to be about 50 nm. The well layer was set to be undoped $Al_{0.03}Ga_{0.97}As$ having a layer thickness of about 17 nm, and the barrier layer was set to be undoped $(Al_{0.1}Ga_{0.9})_{0.5}In_{0.5}P$ having a layer thickness of about 19 nm. Further, a well layer and a barrier layer were alternately laminated in 20 pairs. The lower guide layer was set to be undoped and a layer thickness was set to be about 50 nm. In the lower clad layer, a carrier concentration was set to be about $8\times10^{17}$ cm$^{-3}$ and a layer thickness was set to be about 0.5 μm. In the intermediate layer, a carrier concentration was set to be about $8\times10^{17}$ cm$^{-3}$ and a layer thickness was set to be about 0.05 μm. In the current diffusion layer made of GaP, a carrier concentration was set to be about $3\times10^{18}$ cm$^{-3}$ and a layer thickness was set to be about 9 μm.

The evaluation results of the characteristics of the light-emitting diode (the light-emitting diode lamp) are shown in Table 12.

As shown in Table 12, when electric current flowed between the n-type and p-type ohmic electrodes, infrared light having a peak wavelength of 830 nm was emitted. A forward voltage ($V_F$) was about 2.2 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 13.1 mW.

Moreover, under the condition of high temperature and high humidity of 60° C. and 90RH %, 20 mA power-on tests of twenty of the lamps were performed.

The average of output survival rate after 1000 hours later was 99%. There was no variation of $V_F$, and it was 100%.

Example 30

Light-emitting diode of Example 30 is an example of the 13th embodiment, in which a functional substrate including a reflection layer was bonded with a current diffusion layer. As shown in FIGS. 8A and 8B, a method of forming the light-emitting diode of Example 30 was explained. In addition, in the FIGS. 8A and 8B, the lower guide layer and the upper guide layer were not shown.

The compound semiconductor layer was formed in the same condition as that of Example 28.

Next, on the surface of current diffusion layer 8, eight electrodes 21 made from AuBe/Au alloy at dot shape having a thickness of 0.2 μm and a diameter of 20 μm, were placed in the same interval and at a distance of 50 μm from the end of the light extraction surface.

Next, ITO layer 22 as a transparent conducting layer having a thickness of 0.4 μm was formed by a sputtering method. Layer 23 made from silver alloy/Ti/Au in thickness of 0.2 μm/0.1 μm/1 μm was formed as reflection layer 23.

On the other hand, layer 32 made from Ti/Au/In in thickness of 0.1 μm/0.5 μm/0.3 μm was formed on the surface of silicon substrate 31. Layer 33 made from Ti/Au in thickness of 0.1 μm/0.5 μm was formed on the backside of the silicon substrate 31. The Au surface of the light-emitting diode wafer and the In surface of the silicon substrate were overlapped, and pressurized under a temperature of 320° C. and pressure of 500 g/cm$^2$, as a result, the functional substrate was bonded to the light-emitting diode wafer.

After GaAs substrate was removed, on the surface of the contact layer 16, an ohmic electrode 25 made from AuGe/Au, having a diameter of 100 μm and thickness of 3 μm was formed. And then p, n ohmic electrodes were performed by an alloying-process of heat-treatment under 420° C. for five minutes.

Next, the surface of contact layer 16 was rough-processed.

After removing the semiconductor layer, reflection layer of segment, and eutectic metal on the section to be dice cut, a silicon substrate was cut in a 350μm pitch to obtain a regular square by using a dice cutting saw.

The evaluation results of the characteristics of the light-emitting diode (the light-emitting diode lamp) are shown in Table 12.

As shown in Table 12, when electric current flowed between the n-type and p-type ohmic electrodes, infrared light having a peak wavelength of 830 nm was emitted. A forward voltage ($V_F$) was about 1.9 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 12 mW.

Moreover, under the condition of high temperature and high humidity of 60° C. and 90RH %, 20 mA power-on tests of twenty of the lamps were performed.

The average of output survival rate after 1000 hours later was 98%. There was no variation of $V_F$, and it was 100%.

Example 31

The light-emitting diode of Example 31 is an example of the 14th embodiment, in which a current diffusion layer was bonded with a functional substrate including a reflection layer and a metal substrate. As shown in FIG. 9, light-emitting diode of Example 31 is described.

At first, a metal substrate was produced. It was produced by preparing two approximately flat Cu boards of thickness 10 μm and one approximately flat Mo board of thickness 75 μm, inserting the Mo board into the two pieces of Cu boards to overlap the three boards, placing them into a pressure-applying apparatus, and applying load to the metal boards at high temperature in the thickness direction. As a result, a metal substrate including three layers of Cu (10 μm)/Mo (75 μm)/Cu (10 μm) was produced.

The compound semiconductor layer was formed by the same method of Example 28, except that between the buffer layer and contact layer an etch stop layer made form Si-doped $(Al_{0.5}Ga_{0.5})_{0.5}In_{0.5}P$ with a thickness of 0.5 μm was formed.

On the surface 8b of the current diffusion layer 8, second electrodes 57 were formed in the same interval of 60 μm by laminating Au having a thickness of 0.2 μm on AuBe having a thickness of 0.4 μm, wherein the second electrodes 57 was a columnar shape having a diameter of 20 μm.

Next, an ITO layer 52 as a transparent conducting layer was formed by a sputtering method in thickness of 0.8 μm to cover second anode 57.

Next, on ITO layer 52, a reflection coating 53 was produced by forming a layer made from silver (Ag) alloy having a thickness of 0.7 μm by a vaporization method, and then, forming a layer made from nickel (Ni)/Titanium (Ti) having a thickness of 0.5 μm, and then a layer made from gold (Au) having a thickness of 1 μm.

A bonding structure was formed by placing the structure made of ITO layer 52 and reflection coating 53a on the current diffusion layer 8 of the compound semiconductor layer and the metal substrate so as to make them face each other; transferring them into vacuum chamber; bonding them at 400° C. by using a 500 kg load.

And then, from a bonding structure, the GaAs substrate and the buffer layer which is used as a growth substrate of the compound semiconductor layer were removed by ammonia type etchant selectively. The etching stop layer was removed by HCl type etchant selectively.

Next, on a contact layer, a conducting layer for a first electrode was formed using vacuum deposition method by forming an AuGe layer having a thickness of 0.15 μm, and then forming Ni layer having a thickness of 0.05 μm, and moreover forming an Au layer having a thickness of 1 μm more. By using photolithography method, a first electrode 55 having a thickness 3 μm and diameter of 100 μm was produced by patterning the conducting layer for electrode to the shape of circle in planar view.

Contact layer 56 was formed by etching a section of contact layer except for the section below the first electrode, by using ammonia type etchant and using the first electrode as mask.

After removing the semiconductor layer, reflection layer of segment, and eutectic metal on the section to be dice cut, a silicon substrate was cut in a 350 μm pitch to obtain a regular square by using a dice cutting saw.

The evaluation results of the characteristics of the light-emitting diode (the light-emitting diode lamp) are shown in Table 12.

As shown in Table 12, when electric current flowed between the n-type and p-type ohmic electrodes, infrared light having a peak wavelength of 830 nm was emitted. A forward voltage ($V_F$) was about 1.9 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 12 mW.

Moreover, under the condition of high temperature and high humidity of 60° C. and 90RH %, 20 mA power-on tests of twenty of the lamps were performed.

The average of output survival rate after 1000 hours later was 98%. There was no variation of $V_F$, and it was 100%.

Example 32

Light-emitting diode of Example 32 is an example of the 15th embodiment.

The compound semiconductor layer was formed in the same condition as that of Example 29, and the other conditions are the same as Example 30.

The evaluation results of the characteristics of the light-emitting diode (the light-emitting diode lamp) are shown in Table 12.

As shown in Table 12, when electric current flowed between the n-type and p-type ohmic electrodes, infrared light having a peak wavelength of 830 nm was emitted. A forward voltage ($V_F$) was about 2.1 V, because of a low resistance in the bonded interface between the current diffusion layer constituting the compound semiconductor layer and the functional substrate, and an excellent ohmic characteristic of each ohmic electrode when electric current of 20 mA flowed in a forward direction. A light-emitting output when a forward current was set to be 20 mA was 10.7 mW.

Moreover, under the condition of high temperature and high humidity of 60° C. and 90RH %, 20 mA power-on tests of twenty of the lamps were performed.

The average of output survival rate after 1000 hours later was 100%. There was no variation of $V_F$, and it was 100%.

Example 33

The light-emitting diode of Example 33 is an example of the 11th embodiment, and was produced under the same condition as that of Example 28, except that the composition of the light-emitting section was changed in order to obtain emitting light peak wavelength of 760 nm.

In detail, the upper guide layer was changed to undoped $Al_{0.4}Ga_{0.6}As$, the well layer was changed to undoped $Al_{0.13}Ga_{0.87}As$, the barrier layer was changed to undoped $Al_{0.3}Ga_{0.7}As$, and the lower guide layer was changed to undoped $Al_{0.4}Ga_{0.6}As$.

The evaluation results of the characteristics of this light-emitting diode (light-emitting diode lamp) are shown in Table 12. An infrared light having peak wavelength 760 nm was emitted, the emitting light output ($P_o$), the forward voltage ($V_F$), the average of output survival rate, the variation of forward direction voltage were 15 mW, 2V, 98%, 100%, respectively.

Example 34

The light-emitting diode of Example 34 is an example of the 12th embodiment, and was produced under the same condition as that of Example 28, except that Al composition of the well layer is X1=0.13 and Al composition of a barrier layer having composition expressed by the composition formula of $(Al_{X4} Ga_{1-X4})_{Y2} In_{1-Y2} P$ ($0 \leq X4 \leq 1$, $0 < Y2 \leq 1$) is X4=0.1, Y2=0.5; and that is, the light-emitting section was changed to a well layer/barrier layer made from a pair of $Al_{0.28}Ga_{0.72}As/(Al_{0.1}Ga_{0.9})_{0.5}In_{0.5}P$ in order to obtain emitting light peak wavelength of 760 nm.

The evaluation results of the characteristics of this light-emitting diode (light-emitting diode lamp) are shown in Table 12. An red light having peak wavelength 760 nm was emitted, the emitting light output ($P_o$), the forward voltage ($V_F$), the average of output survival rate, the variation of forward direction voltage were 12.7 mW, 2.2V, 99%, 100%, respectively.

Example 35

The light-emitting diode of Example 35 is an example of the 13th embodiment, and was produced under the same condition as that of Example 30, except that Al composition of the well layer is X1=0.13 and Al composition of a barrier layer having composition formula $(Al_{X2} Ga_{1-X2})As$ ($0 < X2 \leq 1$) is X2=0.3; and that is, the light-emitting section was changed to a well layer/barrier layer made from a pair of $Al_{0.13}Ga_{0.87}As/Al_{0.3}Ga_{0.7}As$ in order to obtain emitting light peak wavelength of 760 nm.

The evaluation results of the characteristics of this light-emitting diode (light-emitting diode lamp) are shown in Table 12. An red light having peak wavelength 680 nm was emitted, the emitting light output ($P_o$), the forward voltage ($V_F$), the average of output survival rate, the variation of forward direction voltage were 11 mW, 1.9V, 98%, 100%, respectively.

Example 36

The light-emitting diode of Example 36 is an example of the 15th embodiment, and was produced under the same condition as that of Example 30, except that Al composition of the well layer is X1=0.13 and Al composition of a barrier layer having composition expressed by the composition formula of $(Al_{X4} Ga_{1-X4})_{Y2} In_{1-Y2} P$ ($0 \leq X4 \leq 1$, $0 < Y2 \leq 1$) is X4=0.1, Y2=0.5; and that is, the light-emitting section was changed to a well layer/barrier layer made from a pair of $Al_{0.13}Ga_{0.87}As/(Al_{0.1}Ga_{0.9})_{0.5}In_{0.5}P$ in order to obtain emitting light peak wavelength of 760 nm.

The evaluation results of the characteristics of this light-emitting diode (light-emitting diode lamp) are shown in Table 10. An red light having peak wavelength 760 nm was emitted, the emitting light output ($P_o$), the forward voltage ($V_F$), the average of output survival rate, the variation of forward direction voltage were 9.8 mW, 2.1V, 100%, 100%, respectively.

Example 37

The light-emitting diode of Example 37 is an example of the 11th embodiment, and was produced under the same condition as that of Example 28, except that Al composition of the well layer is X1=0.07 and Al composition of a barrier layer having composition formula $(Al_{X2} Ga_{1-X2})As$ ($0 < X2 \leq 1$) is X2=0.2; and that is, the light-emitting section was changed to a well layer/barrier layer made from a pair of $Al_{0.07}Ga_{0.93}As/Al_{0.2}Ga_{0.8}As$ in order to obtain emitting light peak wavelength of 800 nm.

The evaluation results of the characteristics of this light-emitting diode (light-emitting diode lamp) are shown in Table 12. An red light having peak wavelength 800 nm was emitted, the emitting light output ($P_o$), the forward voltage ($V_F$), the average of output survival rate, the variation of forward direction voltage were 17 mW, 2.0V, 98%, 100%, respectively.

Example 38

The light-emitting diode of Example 38 is an example of the 12th embodiment, and was produced under the same condition as that of Example 29, except that Al composition of the well layer is X1=0.07 and Al composition of a barrier layer having composition expressed by the composition formula of $(Al_{X4} Ga_{1-X4})_{Y2} In_{1-Y2} P$ ($0 \leq X4 \leq 1$, $0 < Y2 \leq 1$) is X4=0, Y2=0.5; and that is, the light-emitting section was changed to a well layer/barrier layer made from a pair of $Al_{0.07}Ga_{0.93}As/Ga_{0.5}In_{0.5}P$ in order to obtain emitting light peak wavelength of 800 nm.

The evaluation results of the characteristics of this light-emitting diode (light-emitting diode lamp) are shown in Table 10. An red light having peak wavelength 800 nm was emitted, the emitting light output ($P_o$), the forward voltage ($V_F$), the average of output survival rate, the variation of forward direction voltage were 13.5 mW, 2.2V, 99%, 100%, respectively.

Example 39

The light-emitting diode of Example 39 is an example of the 13th embodiment, and was produced under the same condition as that of Example 30, except that Al composition of the well layer is X1=0.07 and Al composition of a barrier layer having composition formula $(Al_{X2} Ga_{1-X2})As$ ($0 < X2 \leq 1$) is X2=0.2; and that is, the light-emitting section was changed to a well layer/barrier layer made from a pair of $Al_{0.07}Ga_{0.93}As/Al_{0.2}Ga_{0.8}As$ in order to obtain emitting light peak wavelength of 800 nm.

The evaluation results of the characteristics of this light-emitting diode (light-emitting diode lamp) are shown in Table 12. An red light having peak wavelength 800 nm was emitted, the emitting light output ($P_o$), the forward voltage ($V_F$), the average of output survival rate, the variation of forward direction voltage were 13 mW, 1.9V, 98%, 100%, respectively.

Example 40

The light-emitting diode of Example 40 is an example of the 15th embodiment, and was produced under the same condition as that of Example 30, except that Al composition of the well layer is X1=0.07 and Al composition of a barrier layer having composition expressed by the composition formula of $(Al_{X4} Ga_{1-X4})_{Y2} In_{1-Y2} P$ ($0 \leq X4 \leq 1$, $0 < Y2 \leq 1$) is X4=0, Y2=0.5; and that is, the light-emitting section was changed to a well layer/barrier layer made from a pair of $Al_{0.07}Ga_{0.97}As/Ga_{0.5}In_{0.5}P$ in order to obtain emitting light peak wavelength of 800 nm.

The evaluation results of the characteristics of this light-emitting diode (light-emitting diode lamp) are shown in Table 12. An red light having peak wavelength 800 nm was emitted, the emitting light output ($P_o$), the forward voltage ($V_F$), the average of output survival rate, the variation of forward direction voltage were 10.8 mW, 2.1 V, 100%, 100%, respectively.

Example 41

The light-emitting diode of Example 41 is an example of the 11th embodiment, and was produced under the same condition as that of Example 28, except that Al composition of the well layer is X1=0 and Al composition of a barrier layer having composition formula $(Al_{X2} Ga_{1-X2})As$ ($0<X2\leq1$) is X2=0.2; and that is, the light-emitting section was changed to a well layer/barrier layer made from a pair of GaAs/$Al_{0.2}Ga_{0.8}As$ in order to obtain emitting light peak wavelength of 850 nm.

The evaluation results of the characteristics of this light-emitting diode (light-emitting diode lamp) are shown in Table 12. An red light having peak wavelength 850 nm was emitted, the emitting light output ($P_o$), the forward voltage ($V_F$), the average of output survival rate, the variation of forward direction voltage were 14 mW, 2.0V, 98%, 100%, respectively.

Example 42

The light-emitting diode of Example 42 is an example of the 12th embodiment, and was produced under the same condition as that of Example 29, except that Al composition of the well layer is X1=0 and Al composition of a barrier layer having composition expressed by the composition formula of $(Al_{X4}Ga_{1-X4})_{Y2}In_{1-Y2}P$ ($0\leq X4\leq1$, $0<Y2\leq1$) is X4=0, Y2=0.5; and that is, the light-emitting section was changed to a well layer/barrier layer made from a pair of GaAs/$Ga_{0.5}In_{0.5}P$ in order to obtain emitting light peak wavelength of 850 nm.

The evaluation results of the characteristics of this light-emitting diode (light-emitting diode lamp) are shown in Table 12. An red light having peak wavelength 850 nm was emitted, the emitting light output ($P_o$), the forward voltage ($V_F$), the average of output survival rate, the variation of forward direction voltage were 12.2 mW, 2.2V, 99%, 100%, respectively.

Example 43

The light-emitting diode of Example 43 is an example of the 13th embodiment, and was produced under the same condition as that of Example 30, except that Al composition of the well layer is X1=0 and Al composition of a barrier layer having composition formula $(Al_{X2} Ga_{1-X2})As$ ($0<X2\leq1$) is X2=0.2; and that is, the light-emitting section was changed to a well layer/barrier layer made from a pair of GaAs/$Al_{0.2}Ga_{0.8}As$ in order to obtain emitting light peak wavelength of 850 nm.

The evaluation results of the characteristics of this light-emitting diode (light-emitting diode lamp) are shown in Table 12. An red light having peak wavelength 850 nm was emitted, the emitting light output ($P_o$), the forward voltage ($V_F$), the average of output survival rate, the variation of forward direction voltage were 10 mW, 1.9V, 98%, 100%, respectively.

Example 44

The light-emitting diode of Example 44 is an example of the 15th embodiment, and was produced under the same condition as that of Example 30, except that Al composition of the well layer is X1=0 and Al composition of a barrier layer having composition expressed by the composition formula of $(Al_{X4}Ga_{1-X4})_{Y2}In_{1-Y2}P$ ($0\leq X4\leq1$, $0<Y2\leq1$) is X4=0, Y2=0.5; and that is, the light-emitting section was changed to a well layer/barrier layer made from a pair of GaAs/$Ga_{0.5}In_{0.5}P$ in order to obtain emitting light peak wavelength of 850 nm.

The evaluation results of the characteristics of this light-emitting diode (light-emitting diode lamp) are shown in Table 12. An red light having peak wavelength 850 nm was emitted, the emitting light output ($P_o$), the forward voltage ($V_F$), the average of output survival rate, the variation of forward direction voltage were 9.8 mW, 2.1V, 100%, 100%, respectively.

Comparative Example 4

The light-emitting diode of Comparative example 4 is a light-emitting diode having emitting wavelength of 760 nm and having a structure which was formed by growing a thick layer on a substrate by liquid phase epitaxial growth method and removing the substrate.

On GaAs substrate, AlGaAs layer was formed by using a slider boat type growth device.

A p-type GaAs substrate was set in the groove for holding a substrate in the slider boat type growth device. Ga metal, GaAs poly-crystal, Al metal and dopant were put in the crucibles for each layer growth. A growth layer was a four-layers structure including a thick transparent layer (a first p-type layer), a lower clad layer (a p-type clad layer), an active layer, an upper clad layer (a n-type clad layer), and growth layer was formed in this order.

The slider boat type growth device in which the above-mentioned materials were set, was placed in a quartz reaction tube, and it was heated to 950° C. under hydrogen atmosphere. After the materials were melt, the atmosphere temperature was decreased to 910° C. After the slider was pushed right into contact with the material solutions (melt), the temperature was decreased at the rate of 0.5° C./min to a predeterminated temperature. After that, the slider was pushed again into contact with each material solutions and the step of increasing temperature was repeated. Finally, after contact with the melt solution, the atmosphere temperature was decreased to 703° C. to form n-type clad layer. After that, the slider was pushed the material solutions and a wafer were separated, and the epitaxial growth was terminated.

The structure of the resulting epitaxial growth layer includes a first p-type layer having Al composition X1=0.3-0.4, a thickness of 64 μm and a carrier concentration of $3\times10^{17}$ $cm^{-3}$, a p-type clad layer having Al composition X2=0.4-0.5, a thickness of 79 μm and a carrier concentration of $5\times10^{17}$ $cm^{-3}$, a p-type active layer having emitting wavelength of 760 nm, X2=0.4-0.5, a thickness of 1 μm and a carrier concentration of $1\times10^{18}$ $cm^{-3}$ and a n-type clad layer having Al composition X4=0.4-0.5, a thickness of 25 μm and a carrier concentration of $5\times10^{17}$ $cm^{-3}$.

After the epitaxial growth termination, the epitaxial substrate was taken out. After the surface of thick transparent layer of the n-type AlGaAs was protected, the GaAs substrate was removed selectively by using an ammonia-hydrogen-peroxide-based etchant. After, on both surfaces of the epitaxial wafer, Au alloy/Au electrode was formed. By using an electrode mask having an interval of 350 μm, a front surface electrode including a pad for wire bonding having a diameter of 100 μm which was placed centrally, was provided. On the back surface of the epitaxial wafer, Au alloy/Au electrode was also formed. An ohmic electrode having a diameter of 20 μm was formed at intervals of 80 μm. After dicing separation and etching, a light-emitting diode having a size of 350 μm×350 μm and having n-type AlGaAs layer as a front surface was produced.

The evaluation results of the characteristics of the light-emitting diode lamp in which the light-emitting diode of Comparative Example 4 was mounted are shown in Table 12.

As shown in Table 12, when electric current flowed between the n-type and p-type ohmic electrodes, infrared light having a peak wavelength of 760 nm was emitted. A forward voltage ($V_F$) was about 1.9 V, when electric current of 20 mA flowed in a forward direction. A light-emitting output when a forward current was set to be 20 mA was 5 mW, which is ½ less that that of Examples of the present invention. In addition, any one of the samples of Comparative Example 4 has a lower output than that of Examples of the present invention.

Moreover, under the condition of high temperature and high humidity of 60° C. and 90RH %, 20 mA power-on tests of twenty of the lamps were performed.

The average of output survival rate after 1000 hours later was 78%. There was variation of $V_F$, which little increased, and it was 105%.

Comparative Example 5

The evaluation results of the light-emitting diode, in which the active layer was adjusted to obtain emitting wavelength of 800 nm, by using the same method as that of Comparative Example 4, are shown in Table 12.

As a result, the emitting light output ($P_o$), the forward voltage ($V_F$), the average of output survival rate, the variation of forward direction voltage were 5.5 mW, 1.9V, 74%, 107%, respectively.

Comparative Example 6

The evaluation results of the light-emitting diode, in which the active layer was adjusted to obtain emitting wavelength of 830 nm, by using the same method as that of Comparative Example 4, are shown in Table 12.

As a result, the emitting light output ($P_o$), the forward voltage ($V_F$), the average of output survival rate, the variation of forward direction voltage were 6 mW, 1.9V, 74%, 107%, respectively.

Comparative Example 7

The evaluation results of the light-emitting diode, in which the active layer was adjusted to obtain emitting wavelength of 850 nm, by using the same method as that of Comparative Example 4, are shown in Table 12.

As a result, the emitting light output ($P_o$), the forward voltage ($V_F$), the average of output survival rate, the variation of forward direction voltage were 6 mW, 1.9V, 74%, 107%, respectively.

The output of the light-emitting diode lamp of Comparative Examples was very low and was ½ of the Examples of the present invention. In addition, the reliability of the Examples under the condition of high temperature and high humidity had no variation. However, as the Comparative Example, decrease of output and increase of $V_F$ were observed. In that case, a surface, having high concentration Al, of light-emitting diode was oxidized (corrosion), as a result, light transmission was inhibited, and resistance increased.

INDUSTRIAL APPLICABILITY

The light-emitting diode of the present invention can emit infrared light in high efficiency, and can be used as higher output light-emitting diode products, such as a light source of a plant upbringing application, in comparison with the LED of AlGaAs produced by a liquid phase epitaxial growth method. In addition, it may be used as a LED product with high output instead of a conventional LED made of an AlGaAs light-emitting layer.

DENOTATION OF REFERENCE NUMERALS

1 . . . light-emitting diode
2 . . . compound semiconductor layer
3 . . . functional substrate
3a . . . perpendicular plane
3b . . . inclined plane
4 . . . n type ohmic electrode (first electrode)
5 . . . p type ohmic electrode (second electrode)
6 . . . third electrode
7 . . . light-emitting section
8 . . . current diffusion layer
9 . . . lower clad layer
10 . . . lower guide layer
11 . . . light-emitting (active) layer
12 . . . upper guide layer
13 . . . upper clad layer
14 . . . GaAs substrate
15 . . . buffer layer
16 . . . contact layer
17 . . . well layer
18 . . . barrier layer
20 . . . light-emitting diode
21 . . . electrode
22 . . . transparent conducting layer
23 . . . reflection layer
25 . . . bonding electrode
30 . . . silicon substrate
31 . . . functional substrate
41 . . . light-emitting diode lamp
42 . . . mount substrate
43 . . . n-electrode terminal
44 . . . p-electrode terminal
45,46 . . . gold wires
47 . . . epoxy resin
α . . . angle between the inclined plane and the plane parallel to light-emitting surface
50 . . . metal substrate
51 . . . functional substrate
52 . . . transparent conducting layers
53 . . . reflection layer
55 . . . the first electrode
56 . . . contact layer
57 . . . the second electrode

The invention claimed is:
1. A light-emitting diode comprising:
a light-emitting section, which comprises
an active layer, having a quantum well structure and formed by laminating alternately
a well layer which comprises a composition expressed by the composition formula of $(Al_{X1}Ga_{1-X1})As$ ($0 \leq X1 \leq 1$) and
a barrier layer which comprises a composition expressed by the composition formula of $(Al_{X4}Ga_{1-X4})_{Y2}In_{1-Y2}P$ ($0 \leq X4 \leq 1$, $0 < Y2 \leq 1$), and
a first clad layer and a second clad layer, between both of which the active layer is sandwiched, wherein the first clad layer and the second clad layer comprise a composition expressed by the composition formula of $(Al_{X3}Ga_{1-X3})_{Y1}In_{1-Y1}$ ($0 \leq X3 \leq 1$, $0 < Y1 \leq 1$);

a current diffusion layer formed on the light-emitting section; and a functional substrate bonded to the current diffusion layer, said light-emitting diode having a main light extraction surface on a side of the light-emitting section opposite a bonding surface of the functional substrate with the current diffusion layer.

2. The light-emitting diode according to claim 1, wherein the functional substrate is transparent at emitting wavelength.

3. The light-emitting diode according to claim 1, wherein the functional substrate comprises GaP, sapphire or SiC.

4. The light-emitting diode according to claim 1, wherein the current diffusion layer comprises GaP.

5. The light-emitting diode according to claim 1, wherein a thickness of the current diffusion layer is in the range of 0.5 to 20μm.

6. The light-emitting diode according to claim 1, wherein the side face of the functional substrate comprises a side face; wherein the side face comprises a perpendicular plane portion, wherein the perpendicular plane portion is perpendicular to the main light-extraction surface, and an inclined plane portion, wherein an angle between the inclined plate portion and a surface parallel to the main light-extraction surface form an acute angle, and wherein the perpendicular plane portion is nearer to the light-emitting section than the inclined plane portion.

7. The light-emitting diode according to claim 6, wherein the inclined plane comprises a rough surface.

8. The light-emitting diode according to claim 1, wherein a first electrode and a second electrode are installed in the side of the main light extraction surface of the light-emitting diode.

9. The light-emitting diode according to claim 8, wherein the first electrode and the second electrode are ohmic electrodes.

10. The light-emitting diode according to claim 8, wherein a third electrode is further installed in the back side of the main light extraction surface of the light- emitting diode.

11. A light-emitting diode comprising:
a light-emitting section, which comprises
an active layer, having a quantum well structure and formed by laminating alternately
a well layer which comprises a composition expressed by the composition formula of $(Al_{X1} Ga_{1-X1})As$ $(0 \leq X1 \leq 1)$ and
a barrier layer which comprises a composition expressed by the composition formula of $(Al_{X4} Ga_{1-X4})_{Y2} In_{1-Y2} P (0 \leq X4 \leq 1, 0 < Y2 \leq 1)$, and a first clad layer and a second clad layer, between both of which the active layer is sandwiched, wherein the first clad layer and the second clad layer comprise a composition expressed by the composition formula of $(Al_{X3} Ga_{1-X3})_{Y1} In_{1-Y1}$ $(0 \leq X3 \leq 1, 0 < Y1 \leq 1)$;
a current diffusion layer formed on the light-emitting section; and
a functional substrate which comprises a reflection layer having a reflection index of 90% or more at the emitting wavelength, wherein the reflection layer is formed to face the light-emitting section and the functional substrate is bonded to the current diffusion layer.

12. The light-emitting diode according to claim 11, wherein the functional substrate comprises a silicon or germanium layer.

13. The light-emitting diode according to claim 11, wherein the functional substrate comprises a metal substrate.

14. The light-emitting diode according to claim 13, wherein the metal substrate comprises plural metal layers.

15. The light-emitting diode according to claim 11, wherein the current diffusion layer comprises GaP.

16. The light-emitting diode according to claim 11, wherein a thickness of the current diffusion layer is in the range of 0.5 to 20μm.

17. A light-emitting diode lamp comprising the light-emitting diode according to claim 1.

18. A light-emitting diode lamp comprising the light-emitting diode according to claim 10, wherein the first electrode or the second electrode is shorted to the third electrode.

19. A illuminating apparatus comprising plural light-emitting according to claim 1.

20. A light-emitting diode comprising the light-emitting diode according to claim 11.

21. An illuminating apparatus comprising plural light-emitting diode lamps according to claim 11.

* * * * *